US012740067B2

(12) United States Patent
Matsuzaki et al.

(10) Patent No.: US 12,740,067 B2
(45) Date of Patent: Sep. 15, 2026

(54) SEMICONDUCTOR DEVICE

(71) Applicant: Semiconductor Energy Laboratory Co., Ltd., Atsugi (JP)

(72) Inventors: Takanori Matsuzaki, Atsugi (JP); Tatsuya Onuki, Atsugi (JP); Hitoshi Kunitake, Machida (JP); Ryota Hodo, Atsugi (JP); Yasuhiro Jinbo, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 354 days.

(21) Appl. No.: 18/691,160

(22) PCT Filed: Sep. 7, 2022

(86) PCT No.: PCT/IB2022/058385
§ 371 (c)(1),
(2) Date: Mar. 12, 2024

(87) PCT Pub. No.: WO2023/047224
PCT Pub. Date: Mar. 30, 2023

(65) Prior Publication Data

US 2025/0008741 A1 Jan. 2, 2025

(30) Foreign Application Priority Data

Sep. 21, 2021 (JP) ................................ 2021-153506

(51) Int. Cl.
*H10B 53/30* (2023.01)
*H10B 12/00* (2023.01)

(52) U.S. Cl.
CPC .................................... *H10B 53/30* (2023.02)

(58) Field of Classification Search
CPC ........ H10B 53/30; H10B 12/00; H10B 51/20; H10B 51/30; H10B 53/20; G11C 11/22;
(Continued)

(56) References Cited

U.S. PATENT DOCUMENTS 6,285,577 B1 9/2001 Nakamura
7,842,989 B2 11/2010 Kato
(Continued)

FOREIGN PATENT DOCUMENTS

CN 101084580 A 12/2007
CN 109643572 A 4/2019
(Continued)

OTHER PUBLICATIONS

International Search Report (Application No. PCT/IB2022/058385) Dated Nov. 29, 2022.

(Continued)

*Primary Examiner* — David Vu
(74) *Attorney, Agent, or Firm* — Eric J. Robinson; Robinson Intellectual Property Law Office, P.C.

(57) ABSTRACT

A semiconductor device with a novel structure is provided. The semiconductor device includes a first electrode, a transistor including a back gate, a capacitor including a pair of electrodes, and a first insulator that can have ferroelectricity between the back gate of the transistor and a semiconductor. The first insulator overlaps with the semiconductor with a second insulator therebetween. One of a source electrode and a drain of the transistor is electrically connected to the first electrode. The other of the source and the drain of the transistor is electrically connected to one electrode of the pair of electrodes. The pair of electrodes are each in contact with the first insulator and include a region where the pair of electrodes overlap with each other with the first insulator therebetween. As the first insulator, a ferroelectric is used.

16 Claims, 20 Drawing Sheets

(58) Field of Classification Search
CPC .... G11C 11/223; H10D 30/67; H10D 30/701; H10D 64/689
See application file for complete search history.

(56) References Cited

U.S. PATENT DOCUMENTS

| | | | | |
|---|---|---|---|---|
| 8,455,868 | B2 | 6/2013 | Yamazaki et al. | |
| 8,547,771 | B2 | 10/2013 | Koyama | |
| 9,818,750 | B2 * | 11/2017 | Ohshima | G11C 5/14 |
| 10,388,364 | B2 | 8/2019 | Ishizu et al. | |
| 10,943,646 | B2 | 3/2021 | Ishizu et al. | |
| 2009/0039341 | A1 | 2/2009 | Marsman et al. | |
| 2012/0063208 | A1 | 3/2012 | Koyama et al. | |
| 2017/0373195 | A1 | 12/2017 | Yamazaki | |
| 2018/0075900 | A1 | 3/2018 | Ishizu et al. | |
| 2020/0043548 | A1 | 2/2020 | Ishizu et al. | |
| 2021/0375891 | A1 | 12/2021 | Young et al. | |
| 2022/0246763 | A1 | 8/2022 | Yamazaki et al. | |
| 2022/0352384 | A1 | 11/2022 | Oota et al. | |
| 2023/0044659 | A1 | 2/2023 | Godo et al. | |
| 2023/0317125 | A1 | 10/2023 | Matsuzaki et al. | |

FOREIGN PATENT DOCUMENTS

| | | | |
|---|---|---|---|
| EP | 1089341 | A | 4/2001 |
| JP | 2001-102465 | A | 4/2001 |
| JP | 2003-092533 | A | 3/2003 |
| JP | 2003-178577 | A | 6/2003 |
| JP | 2007-525829 | | 9/2007 |
| JP | 2010-204338 | A | 9/2010 |
| JP | 2018-152152 | A | 9/2018 |
| KR | 2001-0030545 | A | 4/2001 |
| KR | 2006-0120220 | A | 11/2006 |
| KR | 2019-0049785 | A | 5/2019 |
| WO | WO-2005/064681 | | 7/2005 |
| WO | WO-2018/047035 | | 3/2018 |
| WO | WO-2021/144661 | | 7/2021 |

OTHER PUBLICATIONS

Written Opinion (Application No. PCT/IB2022/058385) Dated Nov. 29, 2022.

Oota.M et al., "3D-Stacked CAAC-In—Ga—Zn Oxide FETs with Gate Length of 72nm", IEDM 19: Technical Digest of International Electron Devices Meeting, Dec. 7, 2019, pp. 50-53.

Boscke. T et al., "Ferroelectricity in hafnium oxide thin films", Appl. Phys. Lett. (Applied Physics Letters) , Sep. 8, 2011, vol. 99, No. 10, pp. 102903-1-102903-3.

Fan.Z et al., "Ferroelectric HfO2-based materials for next-generation ferroelectric memories", Journal of Advanced Dielectrics, May 3, 2016, vol. 6, No. 2, pp. 1630003-1-1630003-11.

Okuno.J et al., "SoC compatible 1T1C FeRAM memory array based on ferroelectric Hf0.5Zr0.5O2", 2020 Symposium on VLSI Technology : Digest of Technical Papers, Jun. 16, 2020, pp. 1-2.

Toriumi.A, "Ferroelectric properties of thin HfO2 films", Oyobuturi , Sep. 10, 2019, vol. 88, No. 9, pp. 586-596, JSAP(The Japan Society of Applied Physics).

Francois.T et al., "Demonstration of BEOL-compatible ferroelectric Hf0.5Zr0.5O2 scaled FeRAM co-integrated with 130nm CMOS for embedded NVM applications", IEDM 19: Technical Digest of International Electron Devices Meeting, Dec. 7, 2019, pp. 362-365.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10, The Japan Society of Applied Physics.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7, The Japan Society of Applied Physics.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner 10C
252
250
254
A4
260
A6
100
110
280
246
A1
A2
240
247a,
271a
247b,
271b
205
A3
A5

10C
260
254
260b
250
260a
252
285
283
282
246
240
274
241
280
271a
271b
275
247a
247b
100
216
212
214
A1
222
205c
205b
205a
205
230b
230a
230
206a
206b
206c
206
110
A2

260
246
260
10Aa[3]
110
100
100
110
10Ab[3]
206
206
10Aa[2]
110
100
100
110
10Ab[2]
206
206
10Aa[1]
110
100
100
110
10Ab[1]
206
205
207
205
206

BL
WLa[3]
WLb[3]
10Aa[3]
10Ab[3]
110
100
100
110
PLa[3]
PLb[3]
CLa[3]
CLb[3]
WLa[2]
WLb[2]
10Aa[2]
10Ab[2]
110
100
100
110
PLa[2]
PLb[2]
CLa[2]
CLb[2]
WLa[1]
WLb[1]
10Aa[1]
10Ab[1]
110
100
100
110
PLa[1]
PLb[1]
CLa[1]
CLb[1]

300
PON1 VDD PON2 VHM
21
22
23
31
41
42 Row Decoder
43 Row Driver
ADDR
BW
CE
GW
CLK
WAKE
32 Control Circuit
33
Column Decoder
44
46 Sense Amplifier
45 Column Driver
Din
Dout
47 Input Cir.
48 Output Cir.
WDA RDA GND
WL[1] PL[1] BL[1] BL[ j] BL[n] 20
10 [1,1]
10 [1,n]
10 [i, j]
10 [m,1]
10 [m,n]
10
WL[i] PL[i] WL[m] PL[m]

300
20
21
Z
Y
X

FIG. 15A
Intermediate state
New crystalline phase
| Amorphous | Crystalline | Crystal |
| --- | --- | --- |
| ・completely amorphous | ・CAAC<br>・nc<br>・CAC<br>excluding single crystal and poly crystal | ・single crystal<br>・poly crystal |
FIG. 15B
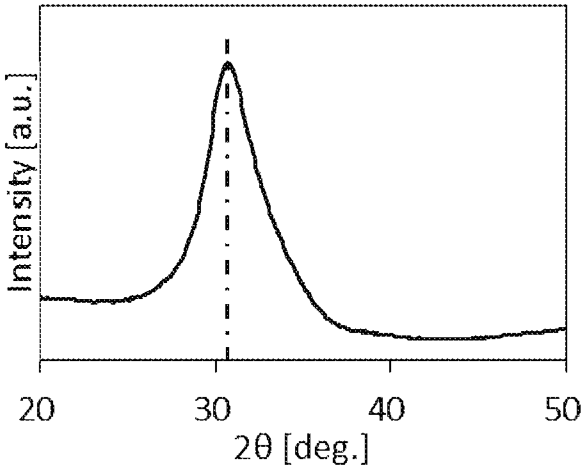
FIG. 15C
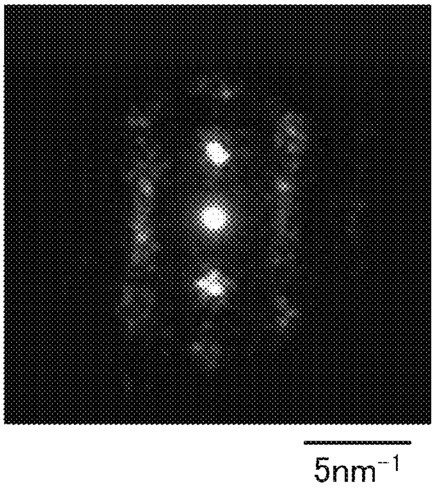

SEMICONDUCTOR DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Thus, examples of the technical field of one embodiment of the present invention include a semiconductor device, a display device, a liquid crystal display device, a light-emitting device, a power storage device, an imaging device, a storage device, a signal processing device, a processor, an electronic device, a system, a driving method thereof, a manufacturing method thereof, a testing method thereof, and a usage method thereof.

BACKGROUND ART

In recent years, semiconductor devices such as LSI, CPUs, and memories (storage devices) have been developed. These semiconductor devices have been used in various electronic devices such as computers and portable information terminals. In addition, memories under development employ various memory systems for intended uses such as temporary storage at the time of executing arithmetic processing and long-term storage of data. Examples of memories with typical memory systems include a DRAM, an SRAM, and a flash memory.

Memories using ferroelectrics have been actively researched and developed as disclosed in Non-Patent Document 1. For the next-generation ferroelectric memories, researches on hafnium oxide, such as research on ferroelectric $HfO_2$-based materials (Non-Patent Document 2); research on ferroelectricity of a hafnium oxide thin film (Non-Patent Document 3); research on ferroelectricity of a $HfO_2$ thin film (Non-Patent Document 4); and demonstration of integration of an FeRAM using a ferroelectric $Hf_{0.5}Zr_{0.5}O_2$ and a CMOS (Non-Patent Document 5) have been actively carried out.

REFERENCES

Non-Patent Documents

[Non-Patent Document 1] T. S. Boescke, et al, "Ferroelectricity in hafnium oxide thin films", APL99, 2011

[Non-Patent Document 2] Zhen Fan, et al, "Ferroelectric $HfO_2$-based materials for next-generation ferroelectric memories", JOURNAL OF ADVANCED DIELECTRICS, Vol. 6, No. 2, 2016

[Non-Patent Document 3] Jun Okuno, et al, "SoC compatible 1T1C FeRAM memory array based on ferroelectric $Hf_{0.5}Zr_{0.5}O_2$", VLSI 2020

[Non-Patent Document 4] Akira Toriumi, "Ferroelectric properties of thin $HfO_2$ films", the Japan Society of Applied Physics, Vol. 88, No. 9, 2019

[Non-Patent Document 5] T. Francois, et al, "Demonstration of BEOL-compatible ferroelectric $Hf_{0.5}Zr_{0.5}O_2$ scaled FeRAM co-integrated with 130 nm CMOS for embedded NVM applications", IEDM 2019

SUMMARY OF THE INVENTION

Problems to be Solved by the Invention

An object of one embodiment of the present invention is to provide a novel semiconductor device. Another object of one embodiment of the present invention is to provide a semiconductor device that occupies a small area. Another object of one embodiment of the present invention is to provide a highly reliable semiconductor device. Another object of one embodiment of the present invention is to provide a semiconductor device with low power consumption. Another object of one embodiment of the present invention is to provide a semiconductor device with high storage capacity.

Note that the objects of one embodiment of the present invention are not limited to the objects listed above. The objects listed above do not preclude the existence of other objects. The other objects are objects that are not described in this section and will be described below. The objects that are not described in this section will be derived from the description of the specification, the drawings, and the like and can be extracted as appropriate from the description by those skilled in the art. One embodiment of the present invention does not have to achieve all of the objects listed above and the other objects. One embodiment of the present invention achieves at least one of the objects listed above and the other objects.

Means for Solving the Problems

One embodiment of the present invention is a semiconductor device including a first electrode; a first insulator; a second insulator; a transistor including a gate, a back gate, and a semiconductor; and a capacitor including a pair of electrodes. The back gate includes a region overlapping with the semiconductor with the first insulator and the second insulator therebetween. One of a source and a drain of the transistor is electrically connected to the first electrode. The other of the source and the drain of the transistor is electrically connected to one of the pair of electrodes. The pair of electrodes are each in contact with the first insulator and comprise a region where the pair of electrodes overlap with each other with the first insulator therebetween. The first insulator is a ferroelectric.

Another embodiment of the present invention is a semiconductor device including a plurality of layers stacked and a first electrode penetrating the plurality of layers. Each of the plurality of layers includes a first insulator, a second insulator, a transistor including a gate, a back gate, and a semiconductor, and a capacitor including a pair of electrodes. The back gate includes a region overlapping with the semiconductor with the first insulator and the second insulator therebetween. One of a source and a drain of the transistor is electrically connected to the first electrode. The other of the source and the drain of the transistor is electrically connected to one of the pair of electrodes. The pair of electrodes are each in contact with the first insulator and include a region where the pair of electrodes overlap with each other with the first insulator therebetween. The first insulator is a ferroelectric.

The other of the pair of electrodes and the back gate may be provided over the same insulator. The first insulator preferably contains hafnium, zirconium, and oxygen. Alternatively, the first insulator preferably contains aluminum, scandium, and nitrogen. The second insulator may contain silicon and oxygen.

Each of the pair of electrodes preferably contains titanium and nitrogen. The above semiconductor is preferably an oxide semiconductor. The above semiconductor preferably contains oxygen and at least one of indium and zinc.

Effect of the Invention

One embodiment of the present invention can provide a novel semiconductor device. Another embodiment of the present invention can provide a semiconductor device that occupies a small area. Another embodiment of the present invention can provide a highly reliable semiconductor device. Another embodiment of the present invention can provide a semiconductor device with low power consumption. Another embodiment of the present invention can provide a semiconductor device with high storage capacity.

Note that the effects of one embodiment of the present invention are not limited to the effects listed above. The effects listed above do not preclude the existence of other effects. Accordingly, one embodiment of the present invention does not have the effects listed above in some cases. Note that the other effects are effects that are not described in this section and will be described below. The other effects are derived from the description of the specification, the drawings, and the like and can be extracted as appropriate from the description by those skilled in the art. One embodiment of the present invention has at least one of the effects listed above and the other effects.

BRIEF DESCRIPTION OF THE DRAWINGS

FIG. 15A is a diagram showing the classification of crystal structures. FIG. 15B is a graph showing an XRD spectrum of a CAAC-IGZO film. FIG. 15C is a diagram showing nanobeam electron diffraction patterns of a CAAC-IGZO film.

MODE FOR CARRYING OUT THE INVENTION

Figure 1A:
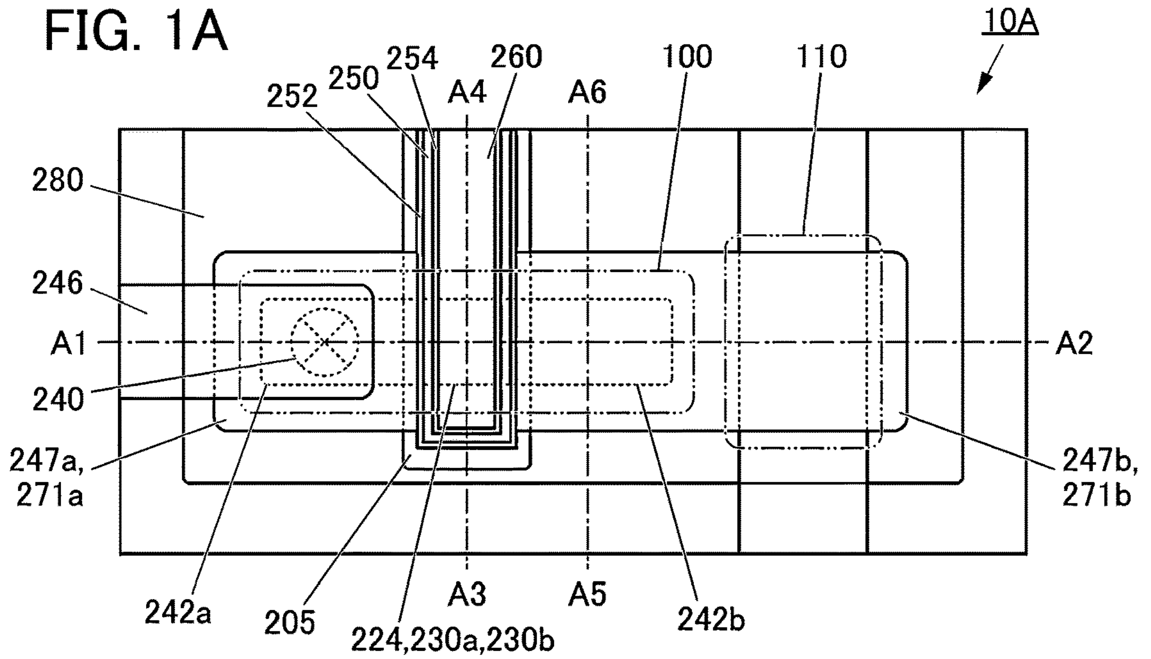
FIG. 1A and FIG. 1B are diagrams illustrating a structure example of a semiconductor device.

Embodiments will be described below with reference to the drawings. Note that the embodiments can be implemented in many different modes, and it is readily understood by those skilled in the art that modes and details can be changed in various ways without departing from the spirit and scope. Thus, the present invention should not be interpreted as being limited to the following description of the embodiments.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a storage device, a display device, a light-emitting device, a lighting device, an electronic device, and the like themselves might be semiconductor devices, or might include semiconductor devices.

In the drawings and the like in this specification, the size, the layer thickness, or the region is exaggerated for clarity in some cases. Therefore, embodiments of the present invention are not limited to the size, aspect ratio, and the like illustrated in the drawings. Note that the drawings schematically illustrate ideal examples, and embodiments of the present invention are not limited to shapes, values, and the like illustrated in the drawings.

Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view, and the like for easy understanding of the drawings in some cases.

Note that arrows indicating the X direction (direction along the X-axis), the Y direction (direction along the Y-axis), and the Z direction (direction along the Z-axis) are sometimes illustrated in the drawings and the like. Note that in this specification and the like, "X direction" is a direction along the X axis, and the forward direction and the reverse direction are not distinguished from each other unless otherwise specified. The same applies to the "Y direction" and the "Z direction". The X direction, the Y direction, and the Z direction are directions intersecting with one another. More specifically, the X direction, the Y direction, and the Z direction are directions orthogonal to one another. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over", "under" "above", and "below", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

The term "overlap", for example, in this specification and the like does not limit a state such as the stacking order of components. For example, the expression "the electrode B overlapping with the insulating layer A" does not necessarily mean the state where "the electrode B is formed over the insulating layer A", and does not exclude the state where "the electrode B is formed under the insulating layer A" and the state where "the electrode B is formed on the right side (or the left side) of the insulating layer A".

Each of the terms "adjacent" and "proximity" in this specification and the like does not necessarily mean that a component is directly in contact with another component. For example, the expression "the electrode B adjacent to the insulating layer A" does not necessarily mean that the electrode B is formed in direct contact with the insulating layer A and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Alternatively, the term "conductor" can be changed into the term "conductive layer" or "conductive film" in some cases. As another example, the term "insulating layer" or "insulating film" can be changed into the term "insulator" in some cases. Alternatively, the term "insulator" can be changed into the term "insulating layer" or "insulating film" in some cases.

Note that voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used as synonyms in many cases. Therefore, in this specification and the like, potential is interchangeable with voltage and voltage is interchangeable with potential unless explicitly stated.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" and "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, the terms "identical", "the same", "equal", "uniform", and the like (including synonyms thereof) used in describing calculation values and measurement values contain an error of ±20% unless otherwise specified.

In this specification and the like, when a plurality of components are denoted by the same reference numerals, and in particular need to be distinguished from each other, an identification sign such as "A", "b", "_1", "[n]", or "[m, n]" is sometimes added to the reference numerals. For example, the conductor 242 is divided and shown as a conductor 242*a* and a conductor 242*b* in some cases.

Embodiment 1

Figure 1B:
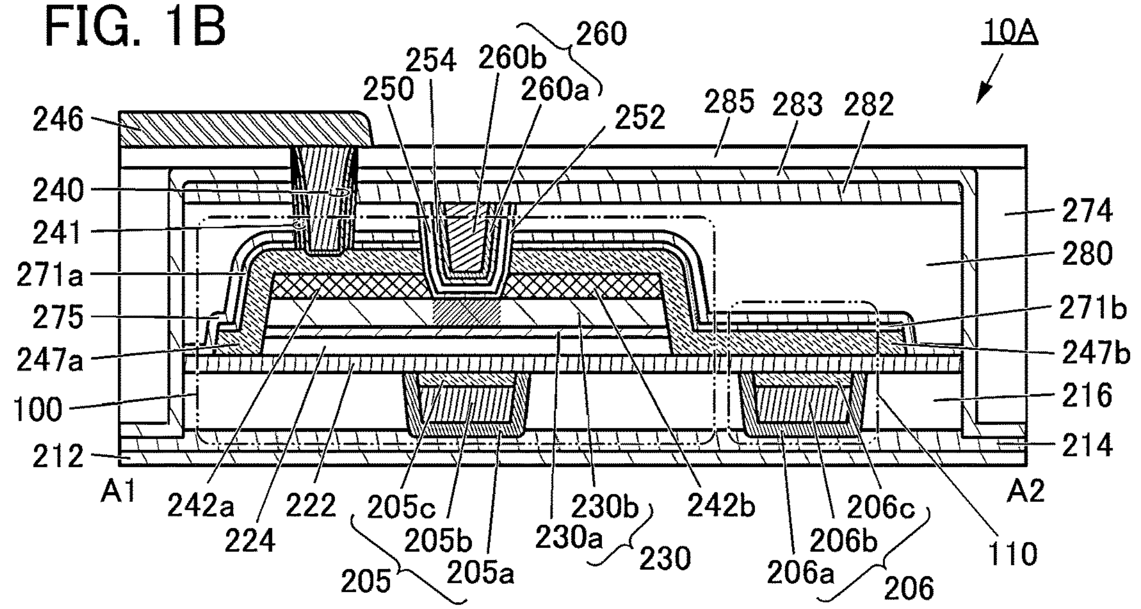

A semiconductor device 10A of one embodiment of the present invention will be described. The semiconductor device 10A includes a transistor 100 and a capacitor 110 including a ferroelectric. FIG. 1A is a top view of the semiconductor device 10A. FIG. 1B is a cross-sectional view of a portion indicated by the dashed-dotted line A1-A2 in FIG. 1A, and is also a cross-sectional view of the transistor 100 in the channel length direction.

Figure 1C:
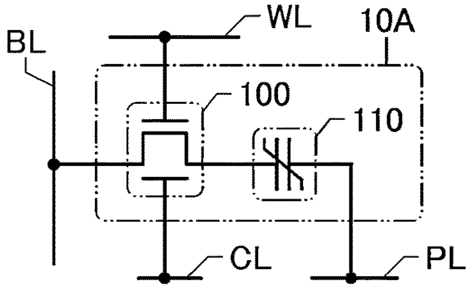
FIG. 1C and FIG. 1D are equivalent circuit diagrams of the semiconductor device.
Figure 1D:
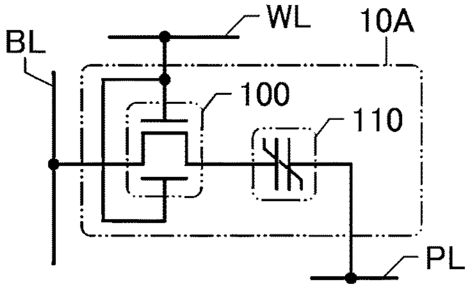

FIG. 1C and FIG. 1D are equivalent circuit diagrams of the semiconductor device 10A. In FIG. 1C, one of a source and a drain of the transistor 100 is electrically connected to a wiring BL, and the other is electrically connected to one electrode of the capacitor 110. A gate of the transistor 100 is electrically connected to a wiring WL, and a back gate thereof is electrically connected to a wiring CL. The other electrode of the capacitor 110 is electrically connected to a wiring PL.

As illustrated in FIG. 1D, the back gate of the transistor 100 may be electrically connected to the wiring WL. That is, the gate and the back gate of the transistor 100 may be electrically connected to each other.

The transistor 100 can be considered as a type of top-gate transistor including aback gate. The potential of the back gate may be the same as the potential of the gate or may be a ground potential (GND) or a given potential. By controlling the potential of the back gate independently of that of the gate, the threshold voltage of the transistor can be controlled.

A gate and a back gate are placed so as to overlap with each other with a channel formation region of a semiconductor sandwiched therebetween. The gate and the back gate are formed using conductors and thus each have a function of preventing an electric field generated outside the transistor from affecting the semiconductor in which the channel is formed (in particular, an electric field blocking function against static electricity and the like). When the back gate is formed larger than the channel formation region of the semiconductor, the electric field blocking function can be enhanced. Note that when the back gate is formed larger than the semiconductor to cover the whole semiconductor, the electric field blocking function can be further enhanced.

Figure 2A:
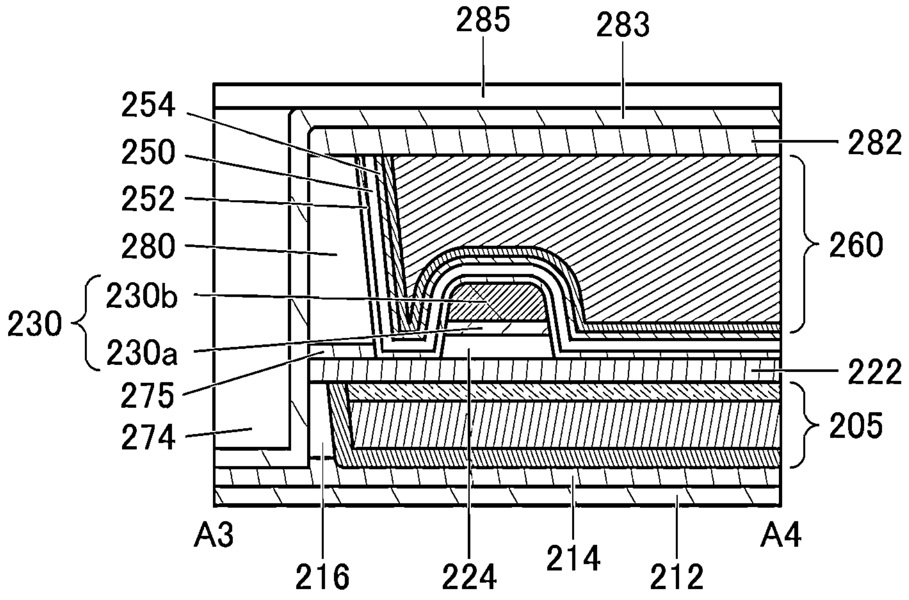
FIG. 2A and FIG. 2B are diagrams illustrating a structure example of a semiconductor device.
Figure 2B:
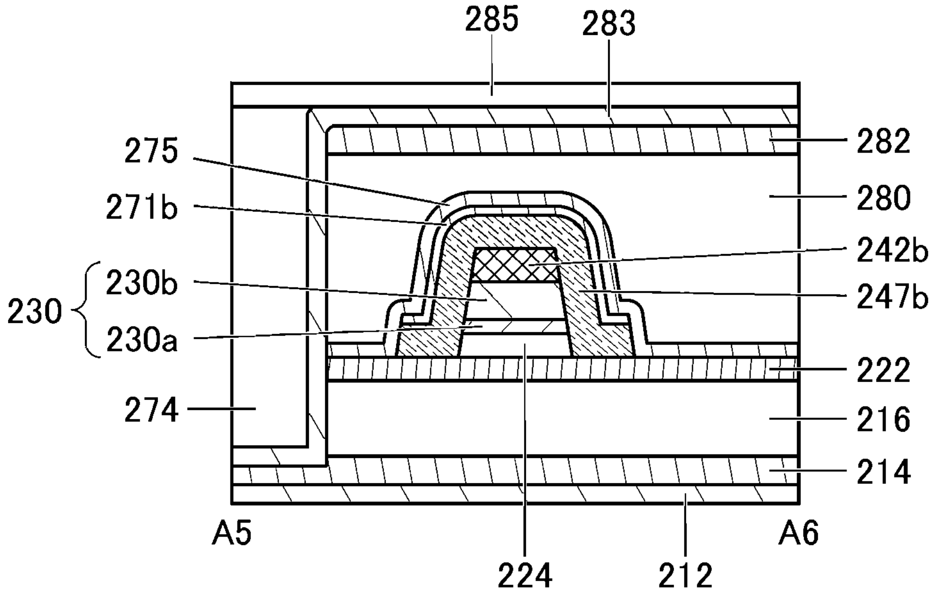

FIG. 2A is a cross-sectional view of a portion indicated by the dashed-dotted line A3-A4 in FIG. 1A, and is a cross-sectional view of the transistor 100 in the channel width direction. FIG. 2B is a cross-sectional view of a portion indicated by the dashed-dotted line A5-A6 in FIG. 1A. Note that for clarity of the drawing, some components are omitted in the top view of FIG. 1A.

The semiconductor device 10A of one embodiment of the present invention includes an insulator 212 over a substrate (not illustrated), an insulator 214 over the insulator 212, the transistor 100 and the capacitor 110 over the insulator 214, an insulator 280 over the transistor 100 and the capacitor 110, an insulator 282 over the insulator 280, an insulator 283 over the insulator 282, an insulator 274 over the insulator 283, and an insulator 285 over the insulator 283 and the insulator 274.

The insulator 212, the insulator 214, an insulator 216, the insulator 280, the insulator 282, the insulator 283, the insulator 285, and the insulator 274 each function as an interlayer film.

The semiconductor device 10A also includes a conductor 240 that is electrically connected to the transistor 100 and functions as a plug. Note that an insulator 241 is provided in contact with the side surface of the conductor 240 functioning as a plug. A conductor 246 electrically connected to the conductor 240 and functioning as a wiring is provided over the insulator 285 and the conductor 240. The insulator 283 is in contact with part of the top surface of the insulator 214, the side surface of the insulator 216, the side surface of an insulator 222, the side surface of an insulator 275, the side surface of the insulator 280, and the side surface and the top surface of the insulator 282.

The insulator 241 is provided in contact with an inner wall of an opening formed in the insulator 280, the insulator 282, the insulator 283, and the insulator 285, and the conductor 240 is provided in contact with the side surface of the insulator 241. The insulator 241 has a structure in which a first insulator is provided in contact with the inner wall of the opening and a second insulator is provided on the inner side of the first insulator. The conductor 240 has a structure in which a first conductor is provided in contact with the side surface of the insulator 241 and a second conductor is provided on the inner side of the first conductor. The top surface of the conductor 240 can be substantially level with the top surface of the insulator 285 in a region overlapping with the conductor 246.

Although the first insulator of the insulator 241 and the second insulator of the insulator 241 are stacked in the transistor 100, the present invention is not limited thereto. For example, the insulator 241 may have a single-layer structure or a stacked-layer structure of three or more layers. Although the first conductor of the conductor 240 and the second conductor of the conductor 240 are stacked in the transistor 100, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

As illustrated in FIG. 1A, FIG. 1B, FIG. 2A, and FIG. 2B, the semiconductor device 10A includes the insulator 216 over the insulator 214, a conductor 205 (a conductor 205*a*, a conductor 205*b*, and a conductor 205*c*) placed to be embedded in the insulator 216, a conductor 206 (a conductor 206*a*, a conductor 206*b*, and a conductor 206*c*) placed to be embedded in the insulator 216, an insulator 222 over the insulator 216, the conductor 205, and the conductor 206, an insulator 224 over the insulator 222, an oxide 230*a* over the insulator 224, an oxide 230*b* over the oxide 230*a*, a conductor 242*a* over the oxide 230*b*, a conductor 247*a* over the conductor 242*a*, an insulator 271*a* over the conductor 247*a*, a conductor 242*b* over the oxide 230*b*, a conductor 247*b* over the conductor 242*b*, an insulator 271*b* over the conductor 247*b*, an insulator 252 over the oxide 230*b*, an insulator 250 over the insulator 252, an insulator 254 over the insulator 250, a conductor 260 (a conductor 260*a* and a conductor 260*b*) over the insulator 254 and overlapping with part of the oxide 230*b*, and the insulator 275 placed over the insulator 222, the insulator 224, the oxide 230*a*, the oxide 230*b*, the conductor 242*a*, the conductor 242*b*, the conductor 247*a*, the conductor 247*b*, the insulator 271*a*, and the insulator 271*b*.

Note that the conductor 205 functions as the wiring CL, and the conductor 206 functions as the wiring PL. The conductor 260 functions as the wiring WL, and the conductor 246 functions as the wiring BL.

Here, as illustrated in FIG. 1B and FIG. 2A, the insulator 252 is in contact with the top surface of the insulator 222, the side surface of the insulator 224, the side surface of the oxide 230*a*, the side surface and the top surface of the oxide 230*b*, the side surface of the conductor 242 (the conductor 242*a* and the conductor 242*b*), the side surface of a conductor 247 (the conductor 247*a* and the conductor 247*b*), the side surface of an insulator 271 (the insulator 271*a* and the insulator 271*b*), the side surface of the insulator 275, the side surface of the insulator 280, and the bottom surface of the insulator 250.

The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230*a* and the oxide 230*b* are collectively referred to as the oxide 230 in some cases.

An opening reaching the oxide 230*b* is provided in the insulator 280 and the insulator 275. The insulator 252, the insulator 250, the insulator 254, and the conductor 260 are placed in the opening. The conductor 260, the insulator 252, the insulator 250, and the insulator 254 are provided between the insulator 271*a* and the insulator 271*b*, between the conductor 247*a* and the conductor 247*b*, and between the conductor 242*a* and the conductor 242*b* in the channel length direction of the transistor 100. The insulator 254 includes a region in contact with the side surfaces of the conductor 260 and a region in contact with the bottom surface of the conductor 260.

The oxide 230 preferably includes the oxide 230*a* placed over the insulator 224 and the oxide 230*b* placed over the oxide 230*a*. Including the oxide 230*a* under the oxide 230*b* makes it possible to inhibit diffusion of impurities into the oxide 230*b* from components formed below the oxide 230*a*.

Although a structure in which two layers, the oxide 230*a* and the oxide 230*b*, are stacked as the oxide 230 in the transistor 100 is described, the present invention is not limited thereto. For example, the oxide 230 may be provided as a single layer of the oxide 230*b* or to have a stacked-layer structure of three or more layers, or the oxide 230*a* and the oxide 230*b* may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242*a* functions as one of a source and a drain, and the conductor 242*b* functions as the other of the source and the drain.

At least part of a region of the oxide 230 overlapping with the conductor 260 functions as a channel formation region. The transistor 100 includes a region where the conductor 260 and the conductor 205 overlap with each other with the insulator 222, the insulator 224, the oxide 230, the insulator 252, the insulator 250, and the insulator 254 therebetween.

Figure 3A:
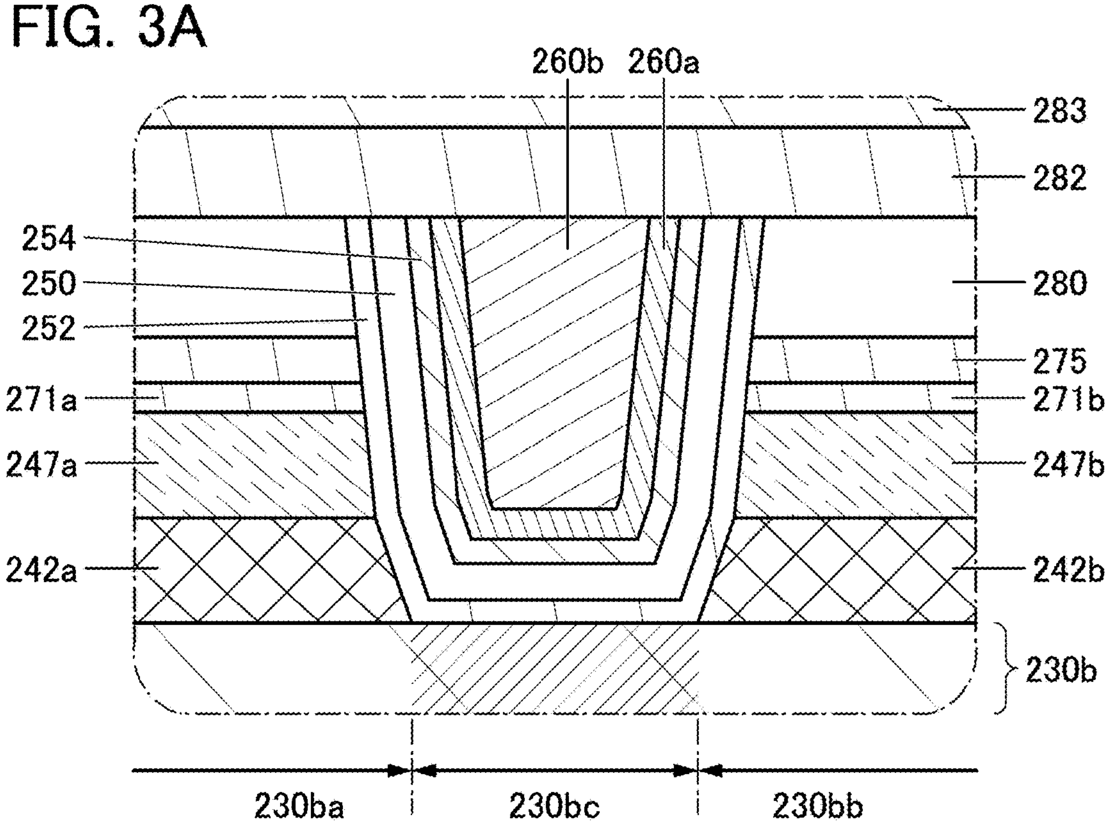
FIG. 3A and FIG. 3B are diagrams illustrating structure examples of a semiconductor device.

FIG. 3A is an enlarged view of the vicinity of the channel formation region in FIG. 1B. Supply of oxygen to the oxide 230*b* reduces oxygen vacancies in the oxide 230*b* and lowers the carrier concentration. Meanwhile, a region where the oxide 230*b* is in contact with the conductor has high carrier concentration and functions as a source region or a drain region. Thus, a region of the oxide 230*b* between the conductor 242*a* and the conductor 242*b* functions as a channel formation region.

Thus, the oxide 230*b* includes a region 230*bc* functioning as the channel formation region of the transistor 100 and a region 230*ba* and a region 230*bb* that function as a source region and a drain region. In other words, the region 230*bc* is provided in a region between the conductor 242*a* and the conductor 242*b*. The region 230*ba* is provided to overlap with the conductor 242*a*, and the region 230*bb* is provided to overlap with the conductor 242*b*. At least part of the region 230*bc* overlaps with the conductor 260.

The region 230*bc* functioning as the channel formation region has a smaller amount of oxygen vacancies or a lower impurity concentration than the region 230*ba* and the region 230*bb*, and thus is a high-resistance region with a low carrier concentration. Thus, the region 230*bc* can be regarded as being i-type (intrinsic) or substantially i-type.

The region 230*ba* and the region 230*bb* functioning as the source region and the drain region include a large amount of oxygen vacancies or have a high concentration of an impurity such as hydrogen, nitrogen, or a metal element, and thus are each a low-resistance region with an increased carrier concentration. In other words, the region 230*ba* and the region 230*bb* are each an n-type region having a higher carrier concentration and a lower resistance than the region 230*bc*.

The carrier concentration in the region 230*bc* functioning as the channel formation region is preferably lower than or equal to $1\times10^{18}$ cm$^{-3}$ further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration in the region 230*bc* functioning as the channel formation region is not particularly limited and can be, for example, $1\times10^{-9}$ cm$^{-3}$.

Between the region 230*bc* and the region 230*ba* or the region 230*bb*, a region having a carrier concentration that is lower than or substantially equal to the carrier concentrations in the region 230*ba* and the region 230*bb* and higher than or substantially equal to the carrier concentration in the region 230*bc* may be formed. That is, the region functions as a junction region between the region 230*bc* and the region 230*ba* or the region 230*bb*. The hydrogen concentration in the junction region is lower than or substantially equal to the hydrogen concentrations in the region 230*ba* and the region 230*bb* and higher than or substantially equal to the hydrogen concentration in the region 230*bc* in some cases. The amount of oxygen vacancies in the junction region is smaller than or substantially equal to the amounts of oxygen vacancies in the region 230*ba* and the region 230*bb* and larger than or substantially equal to the amount of oxygen vacancies in the region 230*bc* in some cases.

Although FIG. 3A illustrates an example where the region 230*ba*, the region 230*bb*, and the region 230*bc* are formed in the oxide 230*b*, the present invention is not limited thereto. For example, the above regions may be formed not only in the oxide 230*b* but also in the oxide 230*a*.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 100, a metal oxide functioning as a semiconductor (such a metal oxide is hereinafter also referred to as an oxide semiconductor) is preferably used for the oxide 230 (the oxide 230*a* and the oxide 230*b*) including the channel formation region.

The metal oxide functioning as a semiconductor preferably has a band gap of 2 eV or more, further preferably 2.5 eV or more. With the use of such a metal oxide having a large band gap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The oxide 230 preferably has a stacked-layer structure of a plurality of oxide layers with different chemical compositions. For example, the atomic ratio of the element M to a metal element that is a main component of the metal oxide used as the oxide 230*a* is preferably greater than the atomic ratio of the element M to a metal element that is a main component of the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. With this structure, impurities and oxygen can be inhibited from diffusing into the oxide 230*b* from the components formed below the oxide 230*a*.

The atomic ratio of In to the element M in the metal oxide used as the oxide 230*b* is preferably greater than the atomic ratio of In to the element M in the metal oxide used as the oxide 230*a*. With this structure, the transistor 100 can have a high on-state current and high frequency characteristics.

When the oxide 230*a* and the oxide 230*b* contain a common element as the main component besides oxygen, the density of defect states at an interface between the oxide 230*a* and the oxide 230*b* can be made low. Since the density of defect states at the interface between the oxide 230*a* and the oxide 230*b* can be made low, the influence of interface scattering on carrier conduction is small, and a high on-state current can be obtained.

Specifically, as the oxide 230*a*, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230*b*, a metal oxide with a composition of In:M:Zn=1:1:1 [atomic ratio] or in the neighborhood thereof, a metal oxide with a composition of In:M:Zn=1:1:1.2 [atomic ratio] or in the neighborhood thereof, a composition of In:M:Zn=1:1:2 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M. In the case where a single layer of the oxide 230*b* is provided as the oxide 230, a metal oxide that can be used as the oxide 230*a* may be used as the oxide 230*b*.

When the metal oxide is deposited by a sputtering method, the above atomic ratio is not limited to the atomic ratio of the deposited metal oxide and may be the atomic ratio of a sputtering target used for depositing the metal oxide.

The oxide 230*b* preferably has crystallinity. It is particularly preferable to use a CAAC-OS (c-axis aligned crystalline oxide semiconductor) as the oxide 230*b*.

The CAAC-OS is a metal oxide having a dense structure with high crystallinity and a small amount of impurities and defects (e.g., oxygen vacancies (Vo)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

A clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

When an oxide having crystallinity, such as CAAC-OS, is used as the oxide 230*b*, oxygen extraction from the oxide 230*b* by the source electrode or the drain electrode can be inhibited. This can reduce oxygen extraction from the oxide 230*b* even when heat treatment is performed; thus, the transistor 100 is stable with respect to high temperatures in a manufacturing process (what is called thermal budget).

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter also referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 100. Furthermore, a variation of the amount of oxygen supplied to the source region or the drain region in the substrate plane leads to a variation in characteristics of the semiconductor device including the transistor.

Therefore, the region 230*bc* functioning as the channel formation region in the oxide semiconductor is preferably an i-type or substantially i-type region with reduced carrier concentration, whereas the region 230*ba* and the region 230*bb* functioning as the source region and the drain region are preferably n-type regions with high carrier concentrations. That is, it is preferable that oxygen vacancies and VoH in the region 230*bc* of the oxide semiconductor be reduced and the region 230*ba* and the region 230*bb* not be supplied with an excess amount of oxygen.

Thus, in this embodiment, microwave treatment is performed in an oxygen-containing atmosphere in a state where the conductor 242*a* and the conductor 242*b* are provided over the oxide 230*b* so that oxygen vacancies and VoH in the region 230*bc* are reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 230*bc* can be irradiated with the high-frequency wave such as a microwave or RF. By the effect of the plasma, the microwave, or the like, VoH in the region 230*bc* can be divided into an oxygen vacancy (Vo) and hydrogen (H); the hydrogen can be removed from the region 230*bc* and the oxygen vacancy can be filled with oxygen. As a result, the hydrogen concentration, oxygen vacancies and VoH in the region 230*bc* can be reduced to lower the carrier concentration.

In the microwave treatment in an oxygen-containing atmosphere, the high-frequency wave such as the microwave or RF, the oxygen plasma, or the like is blocked by the conductor 242*a* and the conductor 242*b* and does not affect the region 230*ba* nor the region 230*bb*. In addition, the effect of the oxygen plasma can be reduced by the insulator 271 and the insulator 280 that are provided to cover the oxide 230*b* and the conductor 242. Hence, a reduction in VoH and supply of an excess amount of oxygen do not occur in the region 230*ba* nor the region 230*bb* in the microwave treatment, preventing a decrease in carrier concentration.

Microwave treatment is preferably performed in an oxygen-containing atmosphere after formation of an insulating film to be the insulator 252 or after formation of an insulating film to be the insulator 250. By performing the microwave treatment in an oxygen-containing atmosphere through the insulator 252 or the insulator 250 in such a manner, oxygen can be efficiently supplied into the region 230*bc*. In addition, the insulator 252 is placed to be in contact with the side surfaces of the conductor 242 and the surface of the region 230*bc*, thereby inhibiting oxygen more than necessary from being supplied to the region 230*bc* and inhibiting the side surfaces of the conductor 242 from being oxidized. Furthermore, the side surfaces of the conductor 242 can be inhibited from being oxidized when the insulating film to be the insulator 250 is formed.

The oxygen supplied into the region 230*bc* has any of a variety of forms such as an oxygen atom, an oxygen molecule, an oxygen radical (an O radical, an atom or a molecule having an unpaired electron, or an ion). Note that the oxygen supplied into the region 230*bc* has any one or more of the above forms, particularly preferably an oxygen radical. Furthermore, the film quality of the insulator 252 and the insulator 250 can be improved, leading to higher reliability of the transistor 100.

In the above manner, oxygen vacancies and VoH can be selectively removed from the region 230*bc* of the oxide semiconductor, whereby the region 230*bc* can be an i-type or substantially i-type region. Furthermore, supply of an excess amount of oxygen to the region 230*ba* and the region 230*bb* functioning as the source region and the drain region can be inhibited and the conductivity can be maintained. As a result, a change in the electrical characteristics of the transistor 100 can be inhibited, and thus a variation in the electrical characteristics of the transistors 100 in the substrate plane can be inhibited.

With the above structure, a semiconductor device with a small variation in transistor characteristics can be provided. A semiconductor device with favorable reliability can be provided. A semiconductor device having favorable electrical characteristics can be provided.

As illustrated in FIG. 2A, a curved surface may be provided between the side surface of the oxide 230*b* and the top surface of the oxide 230*b* in a cross-sectional view of the transistor 100 in the channel width direction. In other words, an end portion of the side surface and an end portion of the top surface may be curved (hereinafter referred to as "rounded").

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230*b* with the insulator 252, the insulator 250, the insulator 254, and the conductor 260.

As illustrated in FIG. 2A or the like, the insulator 252 formed using aluminum oxide or the like is provided in contact with the top surface and the side surfaces of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In—Zn oxide. Such an increase in the atomic ratio of indium in the vicinity of the surface of the oxide 230, especially the vicinity of a surface of the oxide 230*b*, can increase the field-effect mobility of the transistor 100.

When the oxide 230*a* and the oxide 230*b* have the above structure, the density of defect states at the interface between the oxide 230*a* and the oxide 230*b* can be made low. Thus, the influence of interface scattering on carrier conduction is small, and the transistor 100 can have a high on-state current and high frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or above the transistor 100 into the transistor 100. Thus, at least one of the insulator 212, the insulator 214, the insulator 271, the insulator 275, the insulator 282, the insulator 283, and the insulator 285 is preferably formed using an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing or fixing hydrogen well, is preferably used for the insulator 214, the insulator 271, the insulator 282, and the insulator 285. In this case, impurities such as water and hydrogen can be inhibited from diffusing to the transistor 100 side from the substrate side through the insulator 212 and the insulator 214. Impurities such as water and hydrogen can be inhibited from diffusing to the transistor 100 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 100 through the insulator 282 and the like. In this manner, it is preferable that the transistor 100 be surrounded by the insulator 212, the insulator 214, the insulator 271, the insulator 275, the insulator 282, the insulator 283, and the insulator 285, which have a function of inhibiting diffusion of oxygen and a function of inhibiting diffusion of impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 100 or provided around the transistor 100, hydrogen contained in the transistor 100 or hydrogen present around the transistor 100 can be captured or fixed. In particular, hydrogen contained in the channel formation region of the transistor 100 is preferably captured or fixed. The metal oxide having an amorphous structure is used as the component of the transistor 100 or provided around the transistor 100, whereby the transistor 100 and a semiconductor device which have favorable characteristics and high reliability can be manufactured.

Although each of the insulator 212, the insulator 214, the insulator 271, the insulator 275, the insulator 282, the insulator 283, and the insulator 285 preferably has an amorphous structure, a region having a polycrystalline structure may be partly formed. Each of the insulator 212, the insulator 214, the insulator 271, the insulator 275, the insulator 282, the insulator 283, and the insulator 285 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, the insulator 283, and the insulator 285 can be formed by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 212, the insulator 275, and the insulator 283 are preferably made low in some cases. For example, by setting the resistivities of the insulator 212, the insulator 275, and the insulator 283 to approximately $1\times10^{13}$ Ωcm, the insulator 212, the insulator 275, and the insulator 283 can sometimes reduce charge up of the conductor 205, the conductor 242, the conductor 260, or the conductor 246 in treatment using plasma or the like in the manufacturing process of a semiconductor device. The resistivities of the insulator 212, the insulator 275, and the insulator 283 are preferably higher than or equal to $1\times10^{10}$ Ωcm and lower than or equal to $1\times10^{15}$ Ωcm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor *205a* and the conductor *205b*. The conductor *205a* is provided in contact with the bottom surface and the sidewall of the opening. The conductor *205b* is provided to be embedded in a depressed portion formed in the conductor *205a*. Here, the top surface of the conductor *205b* is substantially level with top surfaces of the conductor *205a* and the insulator 216.

Here, the conductor *205a* is preferably formed using a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205*a* is formed using a conductive material having a function of inhibiting diffusion of hydrogen, impurities such as hydrogen contained in the conductor 205*b* can be prevented from diffusing into the oxide 230 through the insulator 224 and the like. When the conductor 205*a* is formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205*a* may be a single layer or a stacked layer of the above conductive materials. For example, titanium nitride is used for the conductor 205*a*.

Moreover, the conductor 205*b* is preferably formed using a conductive material containing tungsten, copper, or aluminum as its main component. For example, tungsten is used for the conductor 205*b*. A conductive material similar to that of the conductor 205*a* is preferably used for the conductor 205*c*. For example, titanium nitride is used for the conductor 205*c*.

The conductor 205 sometimes functions as a second gate electrode. In that case, by changing a potential applied to the conductor 205 not in conjunction with but independently of a potential applied to the conductor 260, the threshold voltage (Vth) of the transistor 100 can be controlled. In particular, Vth of the transistor 100 can be made higher when a negative potential is applied to the conductor 205, and the off-state current can be reduced. Thus, a drain current at the time when a potential applied to the conductor 260 is 0 V can be made lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. The small thickness of the insulator 216 reduces the absolute amount of impurities such as hydrogen contained in the insulator 216. Thus, diffusion of the impurities into the oxide 230 can also be inhibited.

As illustrated in FIG. 1A, the conductor 205 is preferably provided to be larger than a region of the oxide 230 that overlaps with neither the conductor 242*a* nor the conductor 242*b*. That is, the conductor 205 is preferably provided to be larger than the region 230*bc*. Specifically, the conductor 205 preferably extends to a region outside end portions of the oxide 230*a* and the oxide 230*b* in the channel width direction as illustrated in FIG. 2A. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by the electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 100 becomes normally-off and has the above-described S-channel structure, the channel formation region can be electrically surrounded. Accordingly, the transistor 100 can be regarded as having a GAA (Gate All Around) structure or an LGAA (Lateral Gate All Around) structure. When the transistor 100 has the S-channel structure, the GAA structure, or the LGAA structure, the channel formation region that is formed at the interface between the oxide 230 and the gate insulator or in the vicinity of the interface can be formed in the entire bulk of the oxide 230. Accordingly, the density of current flowing in the transistor can be improved, and it can be expected to improve the on-state current of the transistor or increase the field-effect mobility of the transistor.

Furthermore, as illustrated in FIG. 2A, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 100 having a structure in which the conductor 205 is a stack of the conductor 205*a*, the conductor 205*b*, and the conductor 205*c* is illustrated, the present invention is not limited thereto. For example, the conductor 205 may be provided to have a single-layer structure or a stacked-layer structure of two or more layers.

The insulator 222 and the insulator 224 function as a gate insulator on the back gate side.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 100 into the oxide 230. Thus, providing the insulator 222 can inhibit diffusion of impurities such as hydrogen into the transistor 100 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, zirconium oxide, or hafnium-zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Since the capacitor 110 functions as a ferroelectric capacitor, a material that can have ferroelectricity is preferably used for the insulator 222.

As the material that can have ferroelectricity, for example, hafnium oxide is preferably used. Alternatively, as the material that can have ferroelectricity, metal oxide such as zirconium oxide or $HfZrO_X$ (hereinafter simply referred to as $HfZrO_X$, and X is a real number greater than 0) can be used. Alternatively, as the material that can have ferroelectricity, a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide can be used.

Here, the atomic ratio of a hafnium atom to the element J1 can be set as appropriate. For example, the atomic ratio of a hafnium atom to a zirconium atom may be 1:1 or in the neighborhood thereof. Alternatively, as the material that can have ferroelectricity, a material in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide, or the like can be used. The atomic ratio of a zirconium atom to the element J2 can be set as appropriate; the atomic ratio of a zirconium atom to the element J2 is, for example, 1:1 or in the neighborhood thereof. As the material that can have ferroelectricity, a piezoelectric ceramic having a perovskite structure, such as lead titanate ($PbTiO_X$), barium strontium titanate (BST), strontium titanate, lead zirconate titanate (PZT), strontium bismuth tantalate (SBT), bismuth ferrite (BFO), or barium titanate, may be used.

As the material that can have ferroelectricity, scandium aluminum nitride ($Al_{1-a}Sc_aN_b$ (a is a real number greater than 0 and less than 0.5, and b is 1 or an approximate value thereof), hereinafter simply referred to as AlScN), an Al—Ga—Sc nitride, a Ga—Sc nitride, or the like can be used. As the material that can have ferroelectricity, a metal nitride containing an element M1, an element M2, and nitrogen can also be used. Here, the element M1 is one or more selected from aluminum (Al), gallium (Ga), indium (In), and the like. The element M2 is one or more selected from boron (B), scandium (Sc), yttrium (Y), lanthanoids (lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu)), actinoids (15 elements from actinium (Ac) to lawrencium (Lr)), titanium (Ti), zirconium (Zr), hafnium (Hf), vanadium (V), niobium (Nb), tantalum (Ta), chromium (Cr), and the like. Note that the atomic ratio of the element M1 to the element M2 can be set as appropriate. A metal oxide containing the element M1 and nitrogen has ferroelectricity in some cases even though the metal oxide does not contain the element M2. As the material that can have ferroelectricity, a material in which an element M3 is added to the above metal nitride can be used. Note that the element M3 is one or more selected from magnesium (Mg), calcium (Ca), strontium (Sr), zinc (Zn), cadmium (Cd), and the like. Here, the atomic ratio of the element M1 to the element M2 and the element M3 can be set as appropriate. Since the above metal nitride contains at least a Group 13 element and nitrogen, which is a Group 15 element, the metal nitride is referred to as a ferroelectric of Group 13 to 15, a ferroelectric of a Group 13 nitride, or the like in some cases.

As the material that can have ferroelectricity, a perovskite-type oxynitride such as $SrTaO_2N$ or $BaTaO_2N$, $GaFeO_3$ with a κ-alumina-type structure, or the like can be used.

The material that can have ferroelectricity can be, for example, a mixture or a compound formed of a plurality of materials selected from the above-listed materials. Alternatively, the material that can have ferroelectricity can have a stacked-layer structure of a plurality of materials selected from the above-listed materials. Since the above-listed materials may change their crystal structures or characteristics according to a variety of processes and the like as well as deposition conditions, a material that exhibits ferroelectricity is referred to not only as a ferroelectric but also as a material that can have ferroelectricity or a material that has ferroelectricity in this specification and the like.

Among the materials that can have ferroelectricity, a material containing hafnium oxide or hafnium oxide and zirconium oxide (typically, $HfZrO_X$) is preferable because the material can have ferroelectricity even when being processed into a thin film of several nanometers.

Alternatively, scandium aluminum nitride (AlScN), which can be formed by a sputtering method, is preferable as the material that can have ferroelectricity because the impurity concentration in the film can be reduced or a dense film can be formed. In the case where scandium aluminum nitride (AlScN) is used as the material that can have ferroelectricity, a film can be expected to have high reliability.

The thickness of the material that can have ferroelectricity can be less than or equal to 100 nm, preferably less than or equal to 50 nm, further preferably less than or equal to 20 nm, still further preferably less than or equal to 10 nm (typically, greater than or equal to 2 nm and less than or equal to 9 nm). The thickness is preferably greater than or equal to 8 nm and less than or equal to 12 nm, for example. When the material that can have ferroelectricity has a thickness in the above range, ferroelectricity can be exhibited with a thin film. When thinned, the ferroelectric layer can be interposed between a pair of electrodes of a capacitor, and the capacitor can be combined with a semiconductor element such as a miniaturized transistor to fabricate a semiconductor device. That is, a semiconductor device that occupies a small area can be easily obtained.

Note that in this specification and the like, the material that can have ferroelectricity is referred to as a ferroelectric material in some cases. Note that in this specification and the like, the material that can have ferroelectricity processed into a layered shape is referred to as a ferroelectric layer, a metal oxide film, or a metal nitride film in some cases. Furthermore, a device including such a ferroelectric layer, metal oxide film, or metal nitride film is sometimes referred to as a ferroelectric device in this specification and the like.

In the case where $HfZrO_X$ is used as the material that can have ferroelectricity, an ALD method, specifically, a thermal ALD method is preferably used for deposition. In the case where deposition of the material that can have ferroelectricity is performed by a thermal ALD method, it is suitable to use a material that does not contain a hydrocarbon (also referred to as Hydro Carbon or HC) for a precursor. When the material that can have ferroelectricity contains one or both of hydrogen and carbon, crystallization of the material that can have ferroelectricity might be hindered. Thus, the precursor that does not contain a hydrocarbon is preferably used as described above to reduce the concentration(s) of one or both of hydrogen and carbon in the material that can have ferroelectricity. Examples of the precursor that does not contain a hydrocarbon include a chlorine-based material. In the case where a material containing hafnium oxide and zirconium oxide ($HfZrO_X$) is used as the material that can have ferroelectricity, $HfCl_4$ and/or $ZrCl_4$ are/is used as the precursor. On the other hand, a dopant (typically, silicon, carbon, or the like) for controlling the polarization state may be added to the material that can have ferroelectricity. In that case, a formation method using a material containing hydrocarbon as a precursor may be used as a way of adding carbon as a dopant.

In the case of depositing a film of the material that can have ferroelectricity, impurities in the film, at least one or more of hydrogen, a hydrocarbon, and carbon here, are thoroughly removed, whereby a highly purified intrinsic film having ferroelectricity can be formed. Note that the highly purified intrinsic film having ferroelectricity and a highly purified intrinsic oxide semiconductor described in a later embodiment are highly compatible with each other in the manufacturing process. Thus, a method for manufacturing a semiconductor device with high productivity can be provided.

The material that can have ferroelectricity preferably has a low impurity concentration. In particular, the concentrations of hydrogen (H) and carbon (C) are preferably as low as possible. Specifically, the hydrogen concentration of the material that can have ferroelectricity is preferably lower than or equal to $5\times10^{20}$ atoms/$cm^3$, further preferably lower than or equal to $1\times10^{20}$ atoms/$cm^3$. The carbon concentration of the material that can have ferroelectricity is preferably lower than or equal to $5\times10^{19}$ atoms/$cm^3$, further preferably lower than or equal to $1\times10^{19}$ atoms/$cm^3$.

In the case where $HfZrO_X$ is used as the material that can have ferroelectricity, hafnium oxide and zirconium oxide are preferably deposited alternately by an ALD method to have a composition of 1:1.

In the case where deposition of the material that can have ferroelectricity is performed by an ALD method, $H_2O$ or $O_3$ can be used as an oxidizer. However, the oxidizer in the ALD method is not limited thereto. For example, the oxidizer in the ALD method may contain any one or more selected from $O_2$, $O_3$, $N_2O$, $NO_2$, $H_2O$, and $H_2O_2$.

In particular, the material that can have ferroelectricity preferably has an orthorhombic crystal structure because the material exhibits ferroelectricity. Note that another crystal structure may be included in addition to the orthorhombic crystal structure. For example, in addition to the orthorhombic crystal structure, any one or more crystal structures selected from a cubic crystal structure, a tetragonal crystal structure, an orthorhombic crystal structure, and a monoclinic crystal structure may be included. Note that a layer for improving the crystallinity may be formed before forming the material that can have ferroelectricity. For example, in the case where $HfZrO_X$ is used as the material that can have ferroelectricity, a metal oxide such as hafnium oxide or zirconium oxide, hafnium, or zirconium can be used for the layer for improving the crystallinity.

In the case where AlScN is used as the material that can have ferroelectricity, the material preferably has a hexagonal crystal structure. Note that another crystal structure may be included in addition to the hexagonal crystal structure. For the layer for improving the crystallinity, a metal nitride such as aluminum nitride or scandium nitride, aluminum, or scandium is preferably used.

Note that the layer for improving the crystallinity may be formed after formation of the material that can have ferroelectricity. Alternatively, the material that can have ferroelectricity may have a composite structure of an amorphous structure and a crystal structure.

Silicon oxide or silicon oxynitride, for example, can be used as appropriate for the insulator 224 that is in contact with the oxide 230.

In a manufacturing process of the transistor 100, heat treatment is preferably performed with a surface of the oxide 230 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, after heat treatment is performed in a nitrogen gas or inert gas atmosphere, another heat treatment may be performed in an atmosphere containing an oxidizing gas at 10 ppm or more, 1% or more, or 10% or more in order to compensate for released oxygen. Alternatively, after heat treatment is performed in an atmosphere containing an oxidizing gas at 10 ppm or more, 1% or more, or 10% or more, another heat treatment may be successively performed in a nitrogen gas or inert gas atmosphere.

Note that by oxygen adding treatment performed on the oxide 230, oxygen vacancies in the oxide 230 can be repaired with supplied oxygen. Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230*a*. In this case, the insulator 275 is in contact with the side surfaces of the insulator 224 and the top surface of the insulator 222.

The conductor 242*a* and the conductor 242*b* are provided in contact with the top surface of the oxide 230*b*. Each of the conductor 242*a* and the conductor 242*b* functions as a source electrode or a drain electrode of the transistor 100.

For the conductor 242 (the conductor 242*a* and the conductor 242*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230*b* or the like diffuses into the conductor 242*a* or the conductor 242*b* in some cases. In particular, when a nitride containing tantalum is used for the conductor 242*a* and the conductor 242*b*, hydrogen contained in the oxide 230*b* or the like is likely to diffuse into the conductor 242*a* or the conductor 242*b*, and the diffused hydrogen is bonded to nitrogen contained in the conductor 242*a* or the conductor 242*b* in some cases. That is, hydrogen contained in the oxide 230*b* or the like is absorbed by the conductor 242*a* or the conductor 242*b* in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 2B. Accordingly, the conductivity of the conductor 242 is increased, so that the on-state current of the transistor 100 can be increased.

When heat treatment is performed in the state where the conductor 242*a* (conductor 242*b*) and the oxide 230*b* are in contact with each other, the sheet resistance of the oxide 230*b* in a region overlapping with the conductor 242*a* (conductor 242*b*) is decreased in some cases. Furthermore, the carrier concentration is sometimes increased. Thus, the resistance of the oxide 230*b* in the region overlapping with the conductor 242*a* (conductor 242*b*) can be lowered in a self-aligned manner.

The conductor 242 is preferably formed using a conductive film having compressive stress. This can form distortion extended in the tensile direction (hereinafter, such distortion is sometimes referred to as tensile distortion) in the region 230*ba* and the region 230*bb*. When VoH is stably formed in the tensile distortion, the region 230*ba* and the region 230*bb* can be stable n-type regions. The compressive stress of the conductor 242 refers to stress for relaxing the compressive shape of the conductor 242 that has a vector in a direction from a center portion to an end portion of the conductor 242.

The level of the compressive stress of the conductor 242 is, for example, preferably higher than or equal to 500 MPa, further preferably higher than or equal to 1000 MPa, still further preferably higher than or equal to 1500 MPa, yet still further preferably higher than or equal to 2000 MPa. The level of the stress of the conductor 242 may be determined from the measured stress of a sample formed by depositing a conductive film to be used for the conductor 242 on a substrate.

Due to the action of the compressive stress in the conductor 242, distortion is generated in each of the region 230*ba* and the region 230*bb*. The distortion is distortion (tensile distortion) extended in the tensile direction by the action of the compressive stress in the conductor 242. In the case where the region 230*ba* and the region 230*bb* each have a CAAC structure, the distortion corresponds to extension in the direction perpendicular to the c-axis of the CAAC structure. As described later, since the CAAC structure is extended in the direction perpendicular to the c-axis of the CAAC structure, oxygen vacancies and VoH are easily formed in the distortion and easily have stable structure. Thus, the region 230*ba* and the region 230*bb* can be stable n-type regions with high carrier concentrations.

Note that although the distortion formed in the oxide 230*b* is described above, the present invention is not limited thereto. In some cases, a similar distortion is formed in the oxide 230*a*.

Although this embodiment describes a single-layer structure of the conductor 242, the present invention is not limited to this structure, and a stacked-layer structure of two or more layers may be employed.

The conductor 247 includes a region overlapping with the conductor 242 and a region extending beyond an end portion of the oxide 230. As illustrated in FIG. 1A, FIG. 1B, and FIG. 2B, when the top surface and the side surface of the conductor 242 and the side surface of the oxide 230 are covered with the conductor 247, the resistance of the source region and the drain region of the transistor can be reduced.

For the conductor 247, for example, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; or an alloy containing a combination of the above metal elements can be used. A conductive material containing nitrogen, such as titanium nitride or tantalum nitride, may be used. A conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added, may be used.

Note that a region where the conductor 247 and the conductor 206 overlap with each other with the insulator 222 therebetween functions as the capacitor 110. In the region, it is preferable that the insulator 224 be not provided over the insulator 222. When the conductor 247 and the conductor 206 are in contact with the insulator 222 that is a ferroelectric material, polarization is likely to occur in the insulator 222. Thus, a material that easily causes polarization in the insulator 222 is preferably used for the conductor 247. For example, titanium nitride is preferably used for the conductor 247. Similarly, a material that easily causes polarization in the insulator 222 is preferably used for the conductor 206*c*. For example, titanium nitride is preferably used for the conductor 206*c*.

The conductor 206 can be formed in the same step as the conductor 205 at the same time. Thus, the capacitor 110 can be formed without an increase in the number of stacked layers and the number of steps of the semiconductor device 10A.

The insulator 271*a* is provided in contact with the top surface of the conductor 247*a*, and the insulator 271*b* is provided in contact with the top surface of the conductor 247*b*. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230*a*, the oxide 230*b*, the conductor 242, the conductor 247, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the insulator 271 and the insulator 275 are provided as described above, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above may be used. An insulator containing an oxide of one or both of aluminum and hafnium may be used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 2A, the insulator 252 is provided in contact with the top surface and the side surfaces of the oxide 230*b*, the side surfaces of the oxide 230*a*, the side surfaces of the insulator 224, and the top surface of the insulator 222. That is, the regions of the oxide 230*a*, the oxide 230*b*, and the insulator 224 that overlap with the conductor 260 are covered with the insulator 252 in the cross section in the channel width direction. With this structure, the insulator 252 having a barrier property against oxygen can prevent release of oxygen from the oxide 230*a* and the oxide 230*b* at the time of heat treatment or the like. This can inhibit formation of oxygen vacancies in the oxide 230*a* and the oxide 230*b*. Therefore, oxygen vacancies and VoH formed in the region 230*bc* can be reduced. Thus, the transistor 100 can have favorable electrical characteristics and higher reliability.

Even when an excess amount of oxygen is contained in the insulator 280, the insulator 250, and the like, in contrast, oxygen can be inhibited from being excessively supplied to the oxide 230*a* and the oxide 230*b*. Thus, a reduction in on-state current or field-effect mobility of the transistor 100, which is caused by excessive oxidation of the region 230*ba* and the region 230*bb* through the region 230*bc*, can be inhibited.

As illustrated in FIG. 1B, the insulator 252 is provided in contact with the side surfaces of the conductor 242, the conductor 247, the insulator 271, the insulator 275, and the insulator 280. This can inhibit formation of an oxide film on the side surfaces of the conductor 242 by oxidization of the side surfaces. Accordingly, a reduction in on-state current or field-effect mobility of the transistor 100 can be inhibited.

The insulator 252 needs to be provided in an opening formed in the insulator 280 and the like, together with the insulator 254, the insulator 250, and the conductor 260. The thickness of the insulator 252 is preferably thin for miniaturization of the transistor 100. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than 3.0 nm. In this case, at least part of the insulator 252 preferably includes a region having the above-described thickness. The thickness of the insulator 252 is preferably smaller than that of the insulator 250. In this case, at least part of the insulator 252 preferably includes a region having a thickness smaller than that of the insulator 250.

To form the insulator 252 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be formed on the side surface of the opening formed in the insulator 280 and the like to have a small thickness like the above-described thickness and to have favorable coverage.

The insulator 250 functions as part of the gate insulator. The insulator 250 is preferably in contact with the top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with the above-described thickness.

Although a single-layer structure of the insulator 250 is described in this embodiment, the present invention is not limited to this structure, and a stacked-layer structure of two or more layers may be employed. For example, as illustrated in FIG. 3B, the insulator 250 may have a stacked-layer structure including two layers of an insulator 250*a* and an insulator 250*b* over the insulator 250*a*.

Figure 3B:
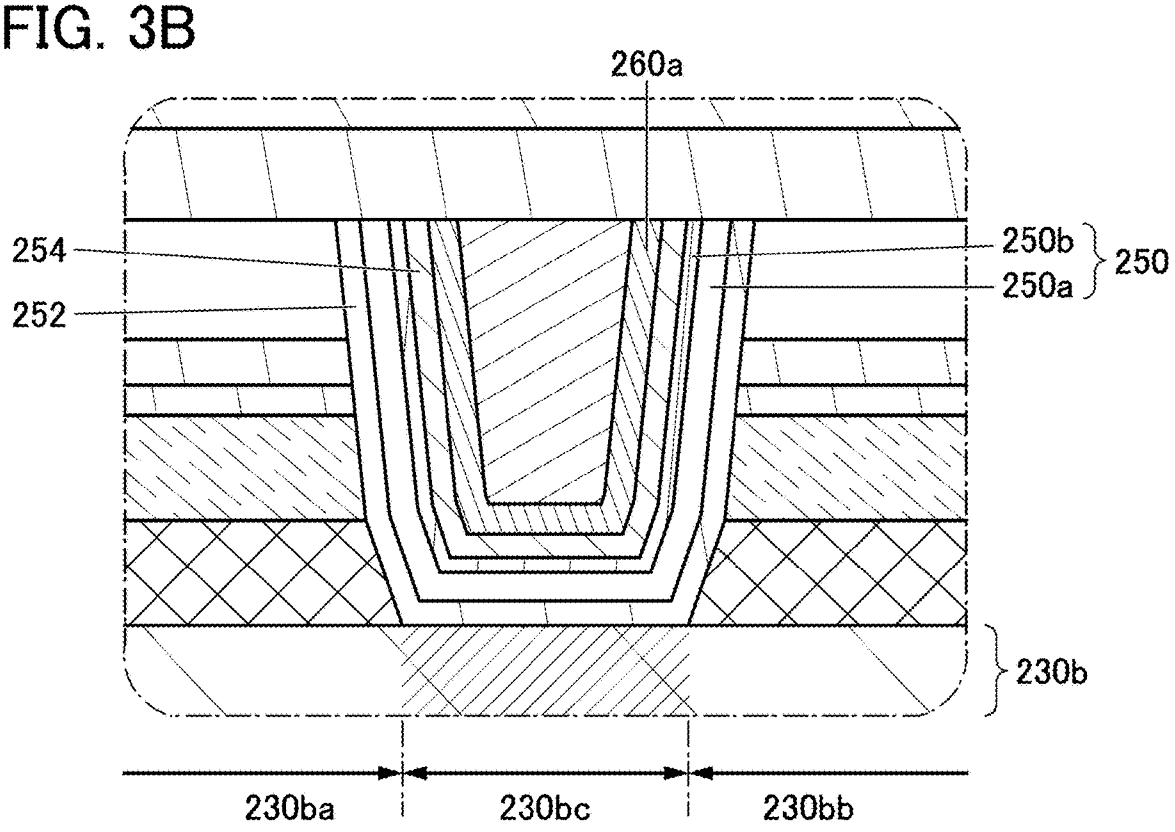

In the case where the insulator 250 has a stacked-layer structure of two layers as illustrated in FIG. 3B, it is preferable that the insulator 250*a* in a lower layer be formed using an insulator that is likely to transmit oxygen and the insulator 250*b* in an upper layer be formed using an insulator having a function of inhibiting oxygen diffusion. With such a structure, oxygen contained in the insulator 250*a* can be inhibited from diffusing into the conductor 260. That is, a reduction in the amount of oxygen supplied to the oxide 230 can be inhibited. In addition, oxidation of the conductor 260 due to oxygen contained in the insulator 250*a* can be inhibited. For example, it is preferable that the insulator

250*a* be provided using any of the above-described materials that can be used for the insulator 250 and the insulator 250*b* be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250*b*. In this case, the insulator 250*b* is an insulator containing at least oxygen and hafnium. The thickness of the insulator 250*b* is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250*b* may include a region with the above-described thickness.

In the case where silicon oxide, silicon oxynitride, or the like is used for the insulator 250*a*, the insulator 250*b* may be formed using an insulating material that is a high-k material having a high relative dielectric constant. The gate insulator having a stacked-layer structure of the insulator 250*a* and the insulator 250*b* can be thermally stable and can have a high relative dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide 230*b*. As the insulator 254, an insulator that can be used as the insulator 283 described above may be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

The insulator 254 needs to be provided in an opening formed in the insulator 280 and the like, together with the insulator 252, the insulator 250, and the conductor 260. The thickness of the insulator 254 is preferably thin for miniaturization of the transistor 100. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 preferably includes a region with the above-described thickness. The thickness of the insulator 254 is preferably smaller than that of the insulator 250. In this case, at least part of the insulator 254 may include a region having a thickness that is smaller than that of the insulator 250.

Note that in the case where the insulator 250 has a stacked-layer structure of two layers as illustrated in FIG. 3B, an insulator having a function of inhibiting the passage of oxygen and impurities such as hydrogen, e.g., hafnium oxide, is used as the insulator 250*b*, whereby the insulator 250*b* can also have the function of the insulator 254. In such a case, the structure without the insulator 254 enables simplification of the manufacturing process and the improvement in productivity of the semiconductor device.

The conductor 260 functions as the first gate electrode of the transistor 100. The conductor 260 preferably includes the conductor 260*a* and the conductor 260*b* placed over the conductor 260*a*. For example, the conductor 260*a* is preferably placed to cover the bottom surface and the side surfaces of the conductor 260*b*. Moreover, as illustrated in FIG. 1B and FIG. 2A, the top surface of the conductor 260 is substantially level with the top surface of the insulator 250. Although the conductor 260 is illustrated to have a two-layer structure of the conductor 260*a* and the conductor 260*b* in FIG. 1B and FIG. 2A, the conductor 260 may have a single-layer structure or a stacked-layer structure of three or more layers.

For the conductor 260*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260*a* has a function of inhibiting diffusion of oxygen, the conductivity of the conductor 260*b* can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260*b*. The conductor 260*b* may have a stacked-layer structure; for example, a stacked-layer structure of the conductive material and titanium or titanium nitride may be employed.

In the transistor 100, the conductor 260 is formed in a self-aligned manner to fill the opening formed in the insulator 280 and the like. The formation of the conductor 260 in this manner allows the conductor 260 to be placed properly in a region between the conductor 242*a* and the conductor 242*b* without alignment.

As illustrated in FIG. 2A, in the channel width direction of the transistor 100, with reference to the bottom surface of the insulator 222, the level of the bottom surface of the conductor 260 in a region where the conductor 260 and the oxide 230*b* do not overlap is preferably lower than the level of the bottom surface of the oxide 230*b*. When the conductor 260 functioning as the gate electrode covers the side surfaces and the top surface of the channel formation region of the oxide 230*b* with the insulator 250 and the like therebetween, the electric field of the conductor 260 can easily act on the entire channel formation region of the oxide 230*b*. Thus, the on-state current of the transistor 100 can be increased and the frequency characteristics of the transistor 100 can be improved. With reference to the bottom surface of the insulator 222, the difference between the level of the bottom surface of the conductor 260 in a region where the conductor 260 does not overlap with the oxide 230*a* or the oxide 230*b* and the level of the bottom surface of the oxide 230*b* is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 280 is preferably reduced. Oxide containing silicon such as silicon oxide, silicon oxynitride, or the like is used as appropriate for the insulator 280, for example.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, because hydrogen can be captured or fixed more effectively in some cases. Accordingly, the transistor 100 and the semiconductor device 10A which have favorable characteristics and high reliability can be manufactured.

As the insulator 282, aluminum oxide is preferably deposited by a sputtering method, further preferably, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF (Radio Frequency) power may be applied to the substrate. The amount of oxygen implanted to a layer below the insulator 282 can be controlled depending on the amount of the RF power applied to the substrate. For example, the amount of oxygen implanted into the layer below the insulator 282 is smaller as the RF power is lower, and the amount of oxygen is easily saturated even when the insulator 282 has a small thickness. Moreover, the amount of oxygen implanted into the layer below the insulator 282 is larger as the RF power is higher.

The RF power is higher than or equal to 0 $W/cm^2$ and lower than or equal to 1.86 $W/cm^2$, for example. In other words, an appropriate amount of oxygen for the transistor characteristics can be changed and implanted by RF power used for the formation of the insulator 282. Accordingly, an appropriate amount of oxygen for improving the reliability of the transistor can be supplied.

The RF frequency is preferably 10 MHz or higher. The typical frequency is 13.56 MHz. The higher the RF frequency is, the less damage the substrate gets.

Although this embodiment describes a single-layer structure of the insulator 282, the present invention is not limited to this structure, and a stacked-layer structure of two or more layers may be employed.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, a high-density silicon nitride film can be formed. To obtain the insulator 283, silicon nitride deposited by a PEALD method or a CVD method may be stacked over silicon nitride deposited by a sputtering method.

For the conductor 240, a conductive material containing tungsten, copper, or aluminum as its main component is preferably used. In addition, the conductor 240 may have a stacked-layer structure.

In the case where the conductor 240 has a stacked-layer structure, a conductive material having a function of inhibiting passage of impurities such as water and hydrogen is preferably used for a first conductor placed in the vicinity of the insulator 285, the insulator 283, the insulator 282, the insulator 280, the insulator 275, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240.

For the insulator 241, a barrier insulating film that can be used for the insulator 275 or the like may be used. For the insulator 241, for example, an insulator such as silicon nitride, aluminum oxide, or silicon nitride oxide may be used. Since the insulator 241 is provided in contact with the insulator 283, the insulator 282, and the insulator 271, impurities such as water and hydrogen contained in the insulator 280 or the like can be inhibited from entering the oxide 230 through the conductor 240. In particular, silicon nitride is suitable because of its high blocking property against hydrogen. Furthermore, oxygen contained in the insulator 280 can be prevented from being absorbed by the conductor 240.

When the insulator 241 has a stacked-layer structure illustrated in FIG. 1B, a first insulator in contact with an inner wall of the opening formed in the insulator 280 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be prevented from entering the conductor 240.

The conductor 246 functioning as a wiring may be placed in contact with the top surface of the conductor 240. The conductor 246 is preferably formed using a conductive material containing tungsten, copper, or aluminum as its main component. Furthermore, the conductor may have a stacked-layer structure and may be a stacked layer of titanium or titanium nitride and the conductive material, for example. Note that the conductor may be formed so as to be embedded in an opening provided in an insulator.

Modification Example 1

Figure 4A:
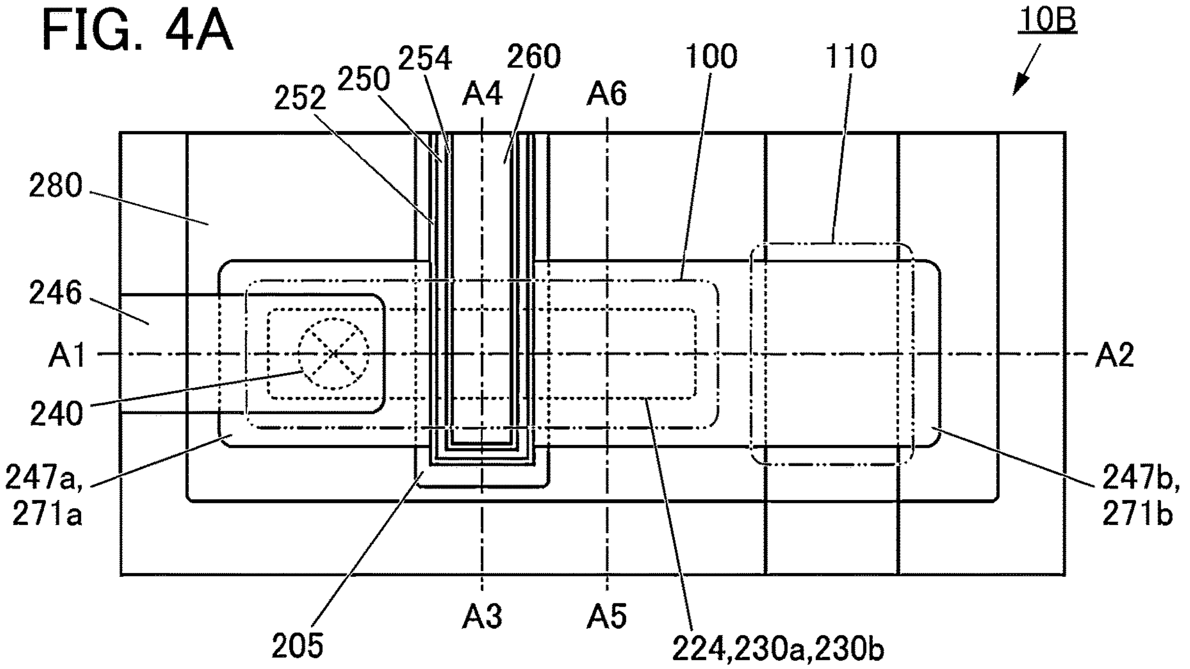
FIG. 4A and FIG. 4B are diagrams illustrating a structure example of a semiconductor device.
Figure 4B:
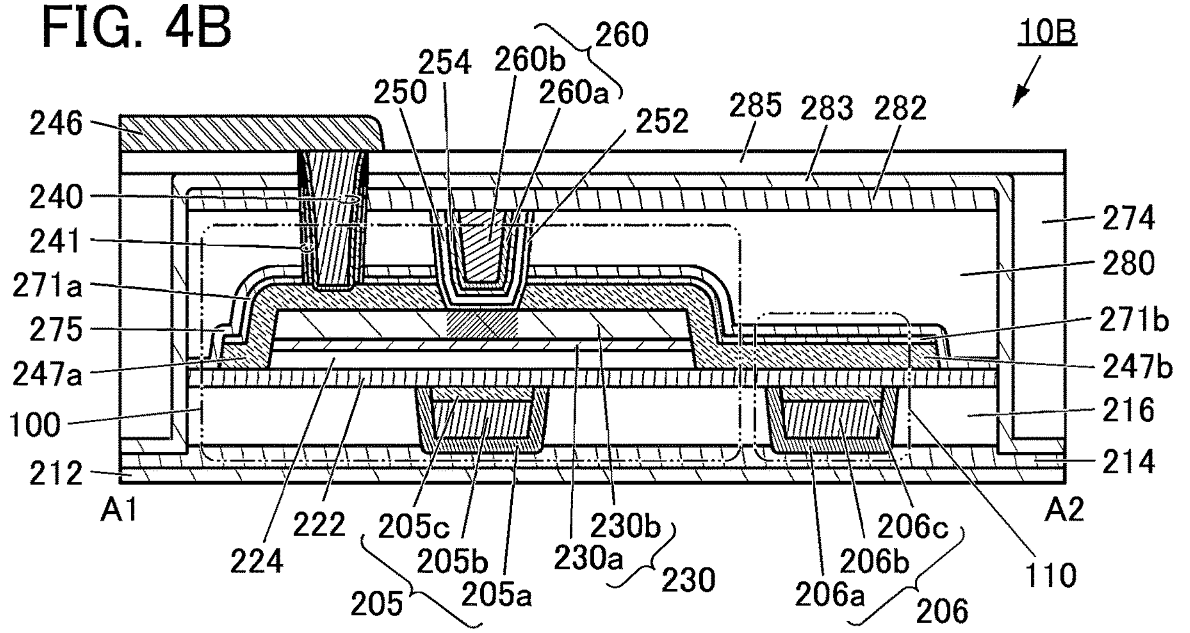

FIG. 4A and FIG. 4B illustrate a semiconductor device 10B, which is a modification example of the semiconductor device 10A. FIG. 4A is a top view of the semiconductor device 10B. FIG. 4B is a cross-sectional view of a portion indicated by the dashed-dotted line A1-A2 in FIG. 4A.

The semiconductor device 10B has a structure in which the conductor 242 is removed from the semiconductor device 10A. Omitting the conductor 242 can reduce the steps of manufacturing the semiconductor device 10B and thus can increase the productivity.

Modification Example 2

Figure 5A:
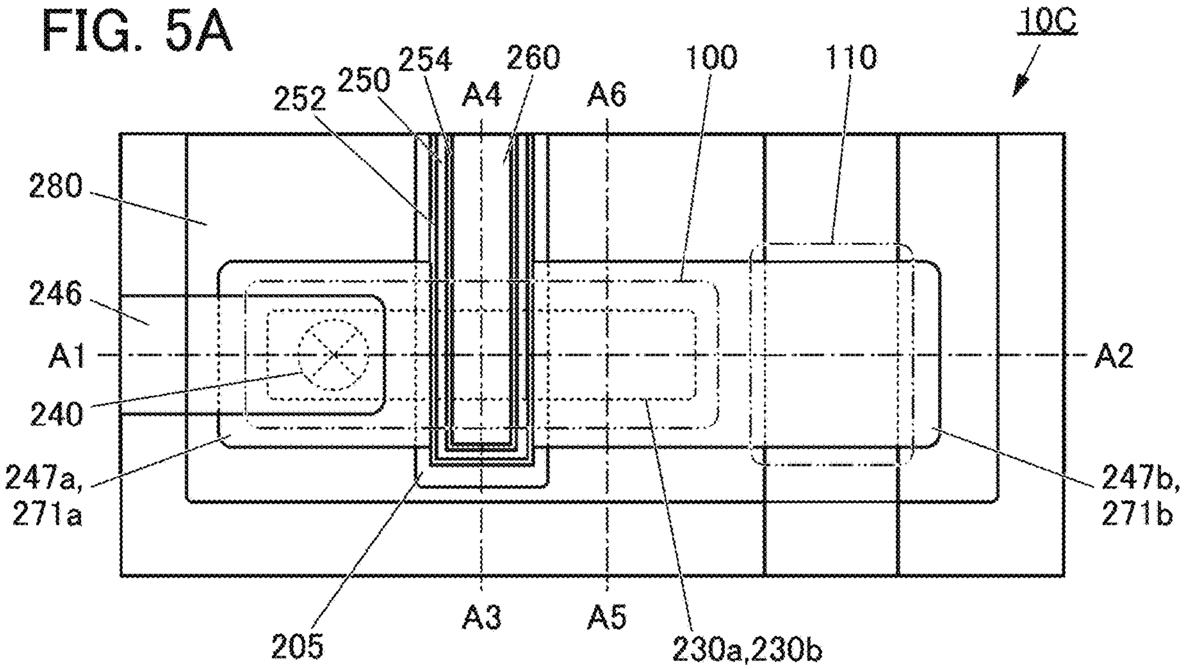
FIG. 5A and FIG. 5B are diagrams illustrating a structure example of a semiconductor device.
Figure 5B:
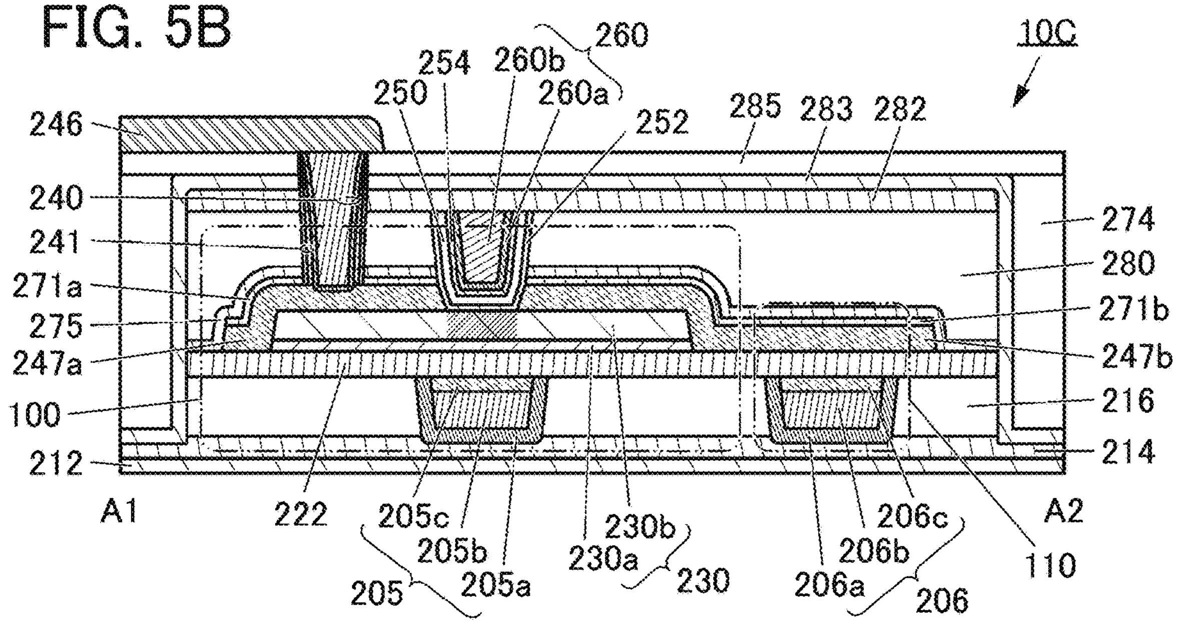

FIG. 5A and FIG. 5B illustrate a semiconductor device 10C, which is a modification example of the semiconductor device 10B. FIG. 5A is a top view of the semiconductor device 10C. FIG. 5B is a cross-sectional view of a portion indicated by the dashed-dotted line A1-A2 in FIG. 5A.

The semiconductor device 10C illustrated in FIG. 5 has a structure in which the insulator 224 is removed from the semiconductor device 10B. Omitting the insulator 224 can shorten the process of manufacturing the semiconductor device 10C and thus can increase the productivity of the semiconductor device 10C. Note that in the case where the insulator 224 is not provided, an insulator containing excess oxygen is preferably formed as the insulator 222.

Modification Example 3

Figure 6A:
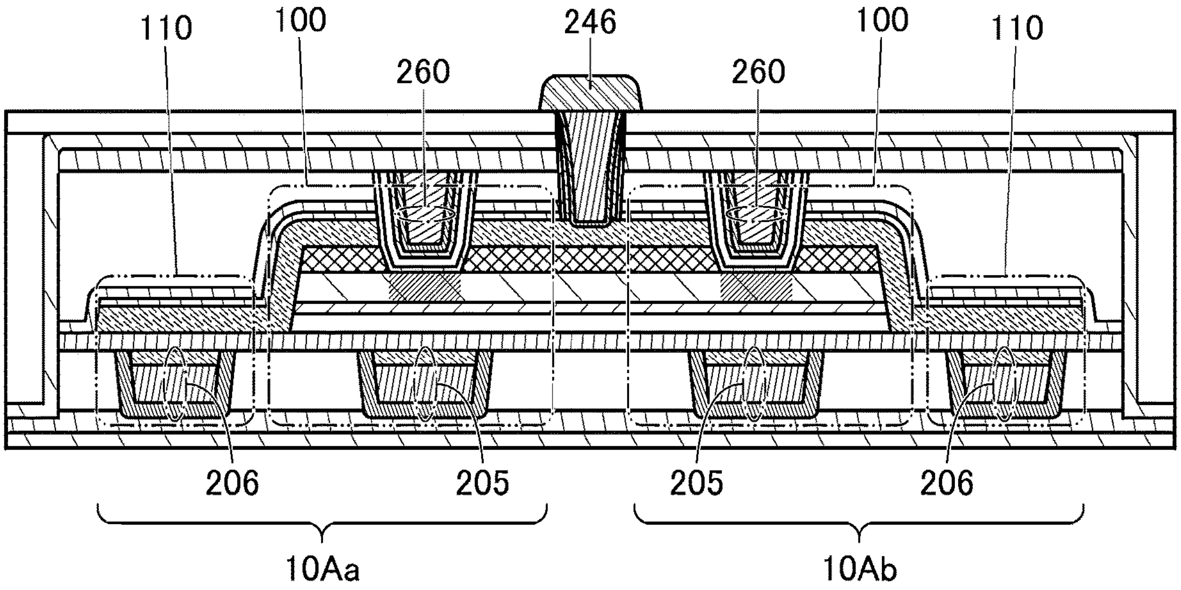
FIG. 6A is a diagram illustrating a structure example of a semiconductor device.
Figure 6B:
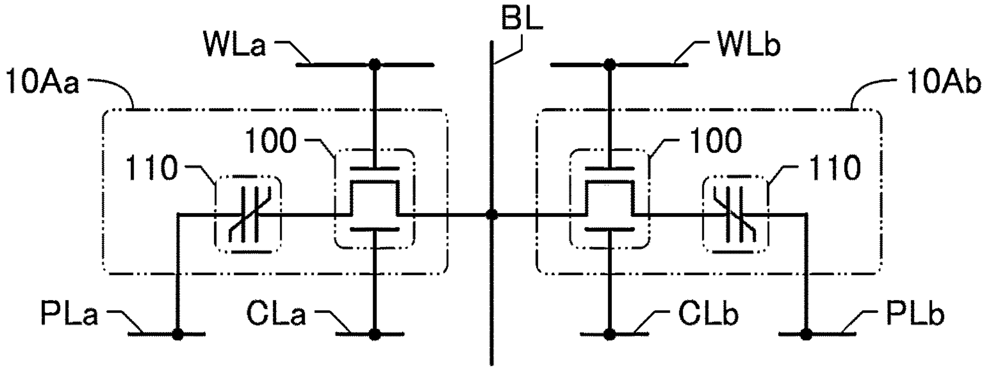
FIG. 6B and FIG. 6C are equivalent circuit diagrams of the semiconductor device.
Figure 6C:
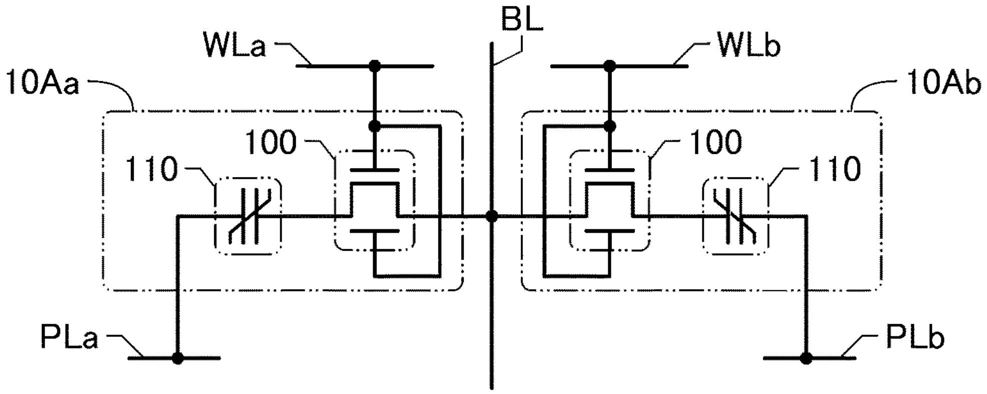

One wiring BL may be shared by two semiconductor devices 10A. FIG. 6A is a cross-sectional view illustrating a structure example in which two semiconductor devices 10A (a semiconductor device 10Aa and a semiconductor device 10Ab) are connected to one wiring BL. FIG. 6B and FIG. 6C are equivalent circuit diagrams of the cross-sectional structure example illustrated in FIG. 6A.

The semiconductor device 10Aa is electrically connected to a wiring WLa, a wiring PLa, a wiring CLa, and the wiring BL. The semiconductor device 10Ab is electrically connected to a wiring WLb, a wiring PLb, a wiring CLb, and the wiring BL. With the structure in which two semiconductor devices 10A are electrically connected to one wiring BL, the area occupied by a semiconductor device including the semiconductor devices 10A can be reduced.

The conductor 260 included in the semiconductor device 10Aa is electrically connected to the wiring WLa. The conductor 260 included in the semiconductor device 10Aa functions as part of the wiring WLa in some cases. The conductor 206 included in the semiconductor device 10Aa is electrically connected to the wiring PLa. The conductor 206 included in the semiconductor device 10Aa functions as part of the wiring PLa in some cases. The conductor 205 included in the semiconductor device 10Aa is electrically connected to the wiring CLa. The conductor 205 included in the semiconductor device 10Aa functions as part of the wiring CLa in some cases.

The conductor 260 included in the semiconductor device 10Ab is electrically connected to the wiring WLb. The conductor 260 included in the semiconductor device 10Ab functions as part of the wiring WLb in some cases. The conductor 206 included in the semiconductor device 10Ab is electrically connected to the wiring PLb. The conductor 206 included in the semiconductor device 10Ab functions as part of the wiring PLb in some cases. The conductor 205 included in the semiconductor device 10Ab is electrically connected to the wiring CLb. The conductor 205 included in the semiconductor device 10Ab functions as part of the wiring CLb in some cases.

In the case where the same potential is supplied to the wiring PLa and the wiring PLb, these wirings may be electrically connected to each other. Similarly, in the case where the same potential is supplied to the wiring CLa and the wiring CLb, these wirings may be electrically connected to each other.

As illustrated in FIG. 6C, the gate and the back gate of the transistor 100 may be electrically connected to each other. In that case, formation of the wiring CL (the wiring CLa and the wiring CLb) is unnecessary, which is effective in improving the productivity of the semiconductor device and reducing the area occupied by the semiconductor device.

Modification Example 4

When the plurality of semiconductor devices 10A are provided to overlap with one another, the area occupied by the semiconductor devices 10A can be reduced. For example, when two semiconductor devices 10A are provided to overlap with each other, the area occupied by one semiconductor device 10A becomes half.

Figure 7B:
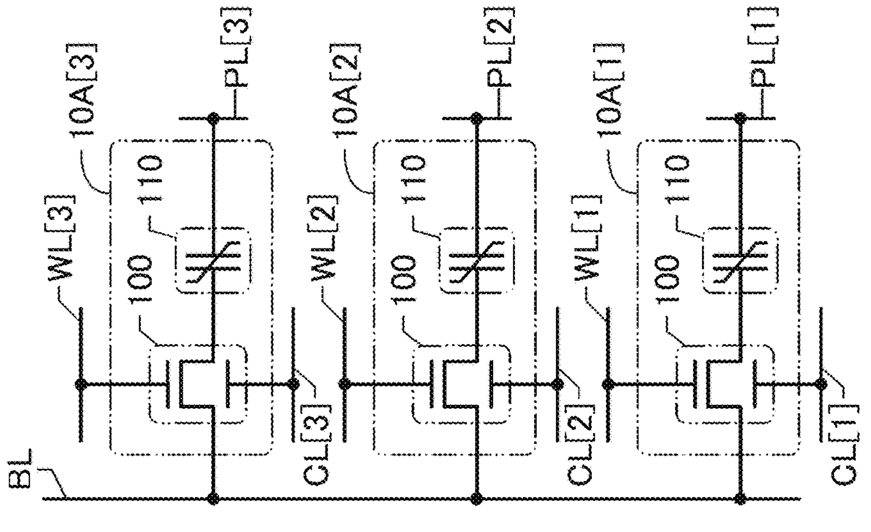
FIG. 7B is an equivalent circuit diagram of the semiconductor device.
Figure 7A:
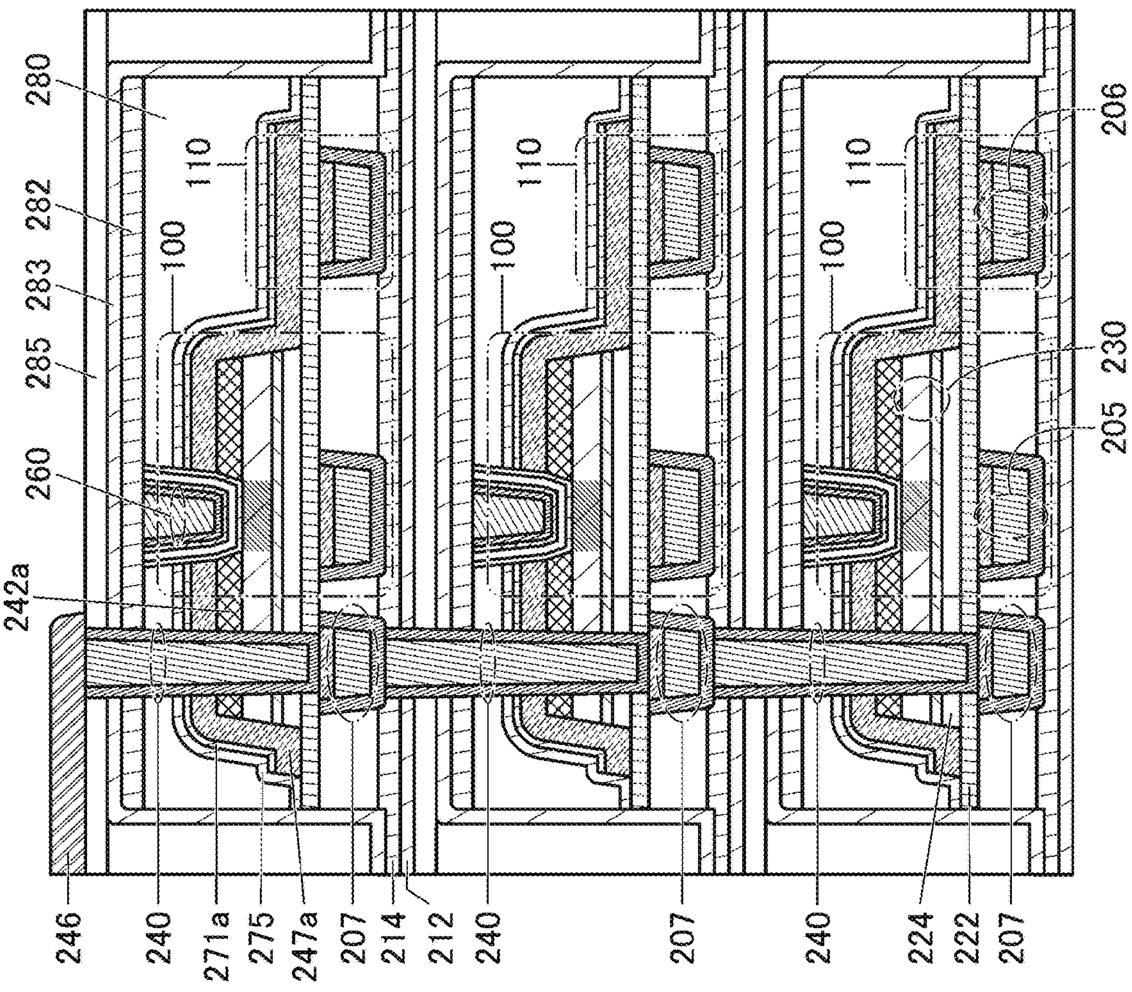
FIG. 7A is a diagram illustrating a structure example of a semiconductor device.

FIG. 7A is a cross-sectional view illustrating a structure example in which three semiconductor devices 10A (a semiconductor device 10A[1], a semiconductor device 10A[2], and a semiconductor device 10A[3]) are stacked. FIG. 7B is an equivalent circuit diagram of the cross-sectional structure example illustrated in FIG. 7A. In FIG. 7A and FIG. 7B, the semiconductor device 10A in the first layer is denoted as the semiconductor device 10A[1], the semiconductor device 10A in the second layer is denoted as the semiconductor device 10A[2], and the semiconductor device 10A in the third layer is denoted as the semiconductor device 10A[3]. Note that in this embodiment and the like, the first layer is referred to as a "first layer", the second layer is referred to as a "second layer", and the third layer is referred to as a "third layer" in some cases.

The semiconductor device 10A[1] is electrically connected to a wiring WL[1], a wiring PL[1], a wiring CL[1], and the wiring BL. The semiconductor device 10A[2] is electrically connected to a wiring WL[2], a wiring PL[2], a wiring CL[2], and the wiring BL. The semiconductor device 10A[3] is electrically connected to a wiring WL[3], a wiring PL[3], a wiring CL[3], and the wiring BL.

The conductor 260 included in the semiconductor device 10A[1] is electrically connected to the wiring WL[1]. The conductor 260 included in the semiconductor device 10A[1] functions as part of the wiring WL[1] in some cases. The conductor 206 included in the semiconductor device 10A[1] is electrically connected to the wiring PL[1]. The conductor 206 included in the semiconductor device 10A[1] functions as part of the wiring PL[1] in some cases. The conductor 205 included in the semiconductor device 10A[1] is electrically connected to the wiring CL[1]. The conductor 205 included in the semiconductor device 10A[1] functions as part of the wiring CL[1] in some cases.

The conductor 260 included in the semiconductor device 10A[2] is electrically connected to the wiring WL[2]. The conductor 260 included in the semiconductor device 10A[2] functions as part of the wiring WL[2] in some cases. The conductor 206 included in the semiconductor device 10A[2] is electrically connected to the wiring PL[2]. The conductor

206 included in the semiconductor device 10A[2] functions as part of the wiring PL[2] in some cases. The conductor 205 included in the semiconductor device 10A[2] is electrically connected to the wiring CL[2]. The conductor 205 included in the semiconductor device 10A[2] functions as part of the wiring CL[2] in some cases.

The conductor 260 included in the semiconductor device 10A[3] is electrically connected to the wiring WL[3]. The conductor 260 included in the semiconductor device 10A[3] functions as part of the wiring WL[3] in some cases. The conductor 206 included in the semiconductor device 10A[3] is electrically connected to the wiring PL[3]. The conductor 206 included in the semiconductor device 10A[3] functions as part of the wiring PL[3] in some cases. The conductor 205 included in the semiconductor device 10A[3] is electrically connected to the wiring CL[3]. The conductor 205 included in the semiconductor device 10A[3] functions as part of the wiring CL[3] in some cases.

In FIG. 7A, the semiconductor device 10A[2] is provided over the semiconductor device 10A[1] and the semiconductor device 10A[3] is provided over the semiconductor device 10A[2]. Each of the semiconductor device 10A[1] to the semiconductor device 10A[3] illustrated in FIG. 7A includes a conductor 207 in the same layer where the conductor 205 and the conductor 206 are included. The conductor 207 can be formed in the same manufacturing step as the conductor 205 and the conductor 206 at the same time.

Each of the semiconductor device 10A[1] to the semiconductor device 10A[3] illustrated in FIG. 7A includes the conductor 240 functioning as a plug. Note that the side surface of the conductor 240 functioning as a plug is not provided with the insulator 241.

The conductor 240 included in each of the semiconductor device 10A[1] to the semiconductor device 10A[3] illustrated in FIG. 7A is provided to penetrate the insulator 285, the insulator 283, the insulator 282, the insulator 280, the insulator 275, the insulator 271*a*, the conductor 247*a*, the conductor 242*a*, the oxide 230, the insulator 224, the insulator 222, the insulator 214, and the insulator 212. Thus, the conductor 240 is in contact with the insulator 285, the insulator 283, the insulator 282, the insulator 280, the insulator 275, the insulator 271*a*, the conductor 247*a*, the conductor 242*a*, the oxide 230, the insulator 224, and the insulator 222. The semiconductor device 10A[1] and the semiconductor device 10A[2] are in contact with the insulator 214 and the insulator 212.

Since the insulator 241 is not provided, the conductor 240 is electrically connected to the conductor 247*a* and the conductor 242*a*.

The conductors 207 included in the semiconductor device 10A[1] to the semiconductor device 10A[3] illustrated in FIG. 7A are electrically connected to one another through the conductors 240 included in the semiconductor device 10A[1] to the semiconductor device 10A[3]. Specifically, in FIG. 7A, the conductor 207 included in the semiconductor device 10A[1] is electrically connected to the conductor 207 included in the semiconductor device 10A[2] through the conductor 240 included in the semiconductor device 10A[1]. The conductor 207 included in the semiconductor device 10A[2] is electrically connected to the conductor 207 included in the semiconductor device 10A[3] through the conductor 240 included in the semiconductor device 10A[2]. The conductor 207 included in the semiconductor device 10A[3] is electrically connected to the conductor 246 functioning as the wiring BL through the conductor 240 included in the semiconductor device 10A[3].

In this manner, each of the transistors included in the semiconductor device 10A[1] to the semiconductor device 10A[3] illustrated in FIG. 7A is electrically connected to the conductor 246 functioning as the wiring BL through the conductor 240 functioning as a through electrode. Accordingly, the conductor 240 also functions as the wiring BL or as part of the wiring BL.

One of a source and a drain of the transistor 100 included in the semiconductor device 10A[1], one of a source and a drain of the transistor 100 included in the semiconductor device 10A[2], and one of a source and a drain of the transistor 100 included in the semiconductor device 10A[3] are electrically connected to the wiring BL (see FIG. 7B).

When the plurality of semiconductor devices 10A are electrically connected to one wiring BL, in other words, when the plurality of semiconductor devices 10A share one wiring BL, the area occupied by a semiconductor device including the semiconductor devices 10A can be reduced. Furthermore, when the plurality of semiconductor devices 10A are provided to overlap with one another, the area occupied by the semiconductor devices 10A can be reduced. Accordingly, the area occupied by a semiconductor device including the semiconductor devices 10A can be further reduced.

Modification Example 5

A combination of Modification example 3 and Modification example 4 can further reduce the area occupied by one semiconductor device 10A.

Figure 8A:
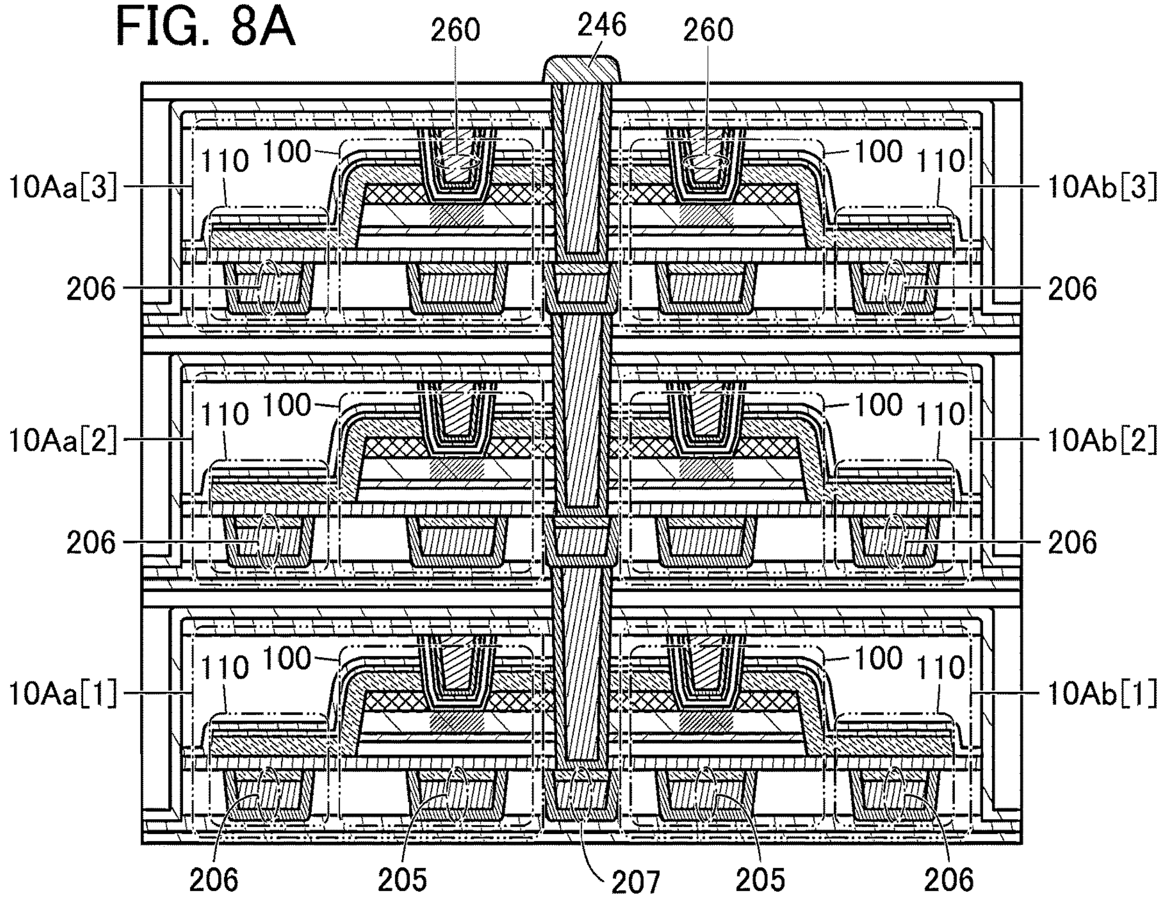
FIG. 8A is a diagram illustrating a structure example of a semiconductor device.
Figure 8B:
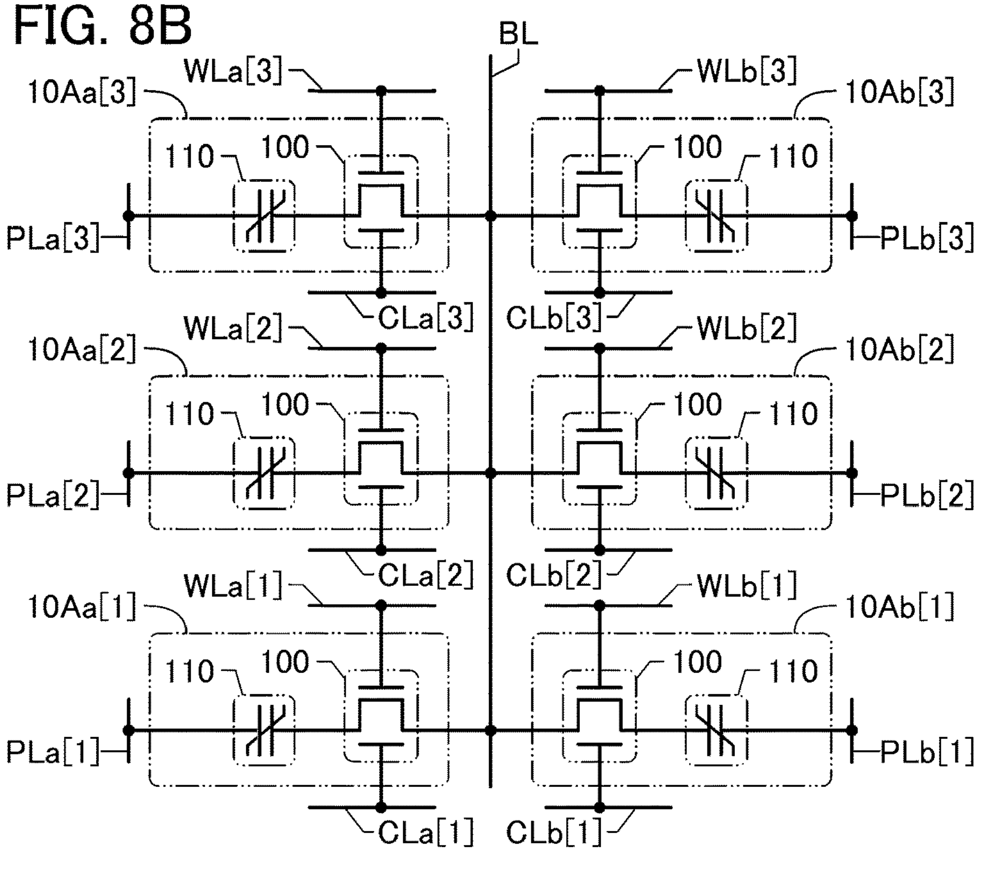
FIG. 8B is an equivalent circuit diagram of the semiconductor device.

FIG. 8A is a cross-sectional view illustrating a structure example in which the plurality of semiconductor devices 10A are stacked. FIG. 8B is an equivalent circuit diagram of the structure example illustrated in FIG. 8A. Note that FIG. 8A and FIG. 8B illustrate an example in which two semiconductor devices 10A (the semiconductor device 10Aa and the semiconductor device 10Ab) formed on the same plane are regarded as a pair and three layers (also referred to as "stages") each including the pair of semiconductor devices 10A are stacked.

In FIG. 8A and FIG. 8B, the semiconductor device 10Aa included in the first layer is denoted as a semiconductor device 10Aa[1] and the semiconductor device 10Ab therein is denoted as a semiconductor device 10Ab[1]. The semiconductor device 10Aa included in the second layer is denoted as a semiconductor device 10Aa[2] and the semiconductor device 10Ab therein is denoted as a semiconductor device 10Ab[2]. The semiconductor device 10Aa included in the third layer is denoted as a semiconductor device 10Aa[3] and the semiconductor device 10Ab therein is denoted as a semiconductor device 10Ab[3].

The semiconductor device 10Aa[1] is electrically connected to a wiring WLa[1], a wiring PLa[1], a wiring CLa[1], and the wiring BL. The semiconductor device 10Ab[1] is electrically connected to a wiring WLb[1], a wiring PLb[1], a wiring CLb[1], and the wiring BL. The semiconductor device 10Aa[2] is electrically connected to a wiring WLa[2], a wiring PLa[2], a wiring CLa[2], and the wiring BL. The semiconductor device 10Ab[2] is electrically connected to a wiring WLb[2], a wiring PLb[2], a wiring CLb[2], and the wiring BL. The semiconductor device 10Aa[3] is electrically connected to a wiring WLa[3], a wiring PLa[3], a wiring CLa[3], and the wiring BL. The semiconductor device 10Ab[3] is electrically connected to a wiring WLb[3], a wiring PLb[3], a wiring CLb[3], and the wiring BL.

With the structure illustrated in FIG. 8A and FIG. 8B, the area occupied by the semiconductor device including the semiconductor devices 10A can be further reduced.

Modification Example 6

In the structure of Modification example 5 described with reference to FIG. 8, each of the transistors 100 formed in the second and subsequent layers is not provided with the conductor 205 functioning as a back gate and uses a gate (the conductor 260) of the transistor 100 in one layer below as a back gate, whereby the steps of manufacturing the semiconductor device can be reduced. Therefore, the manufacturing cost of the semiconductor device can be reduced.

Figure 9A:
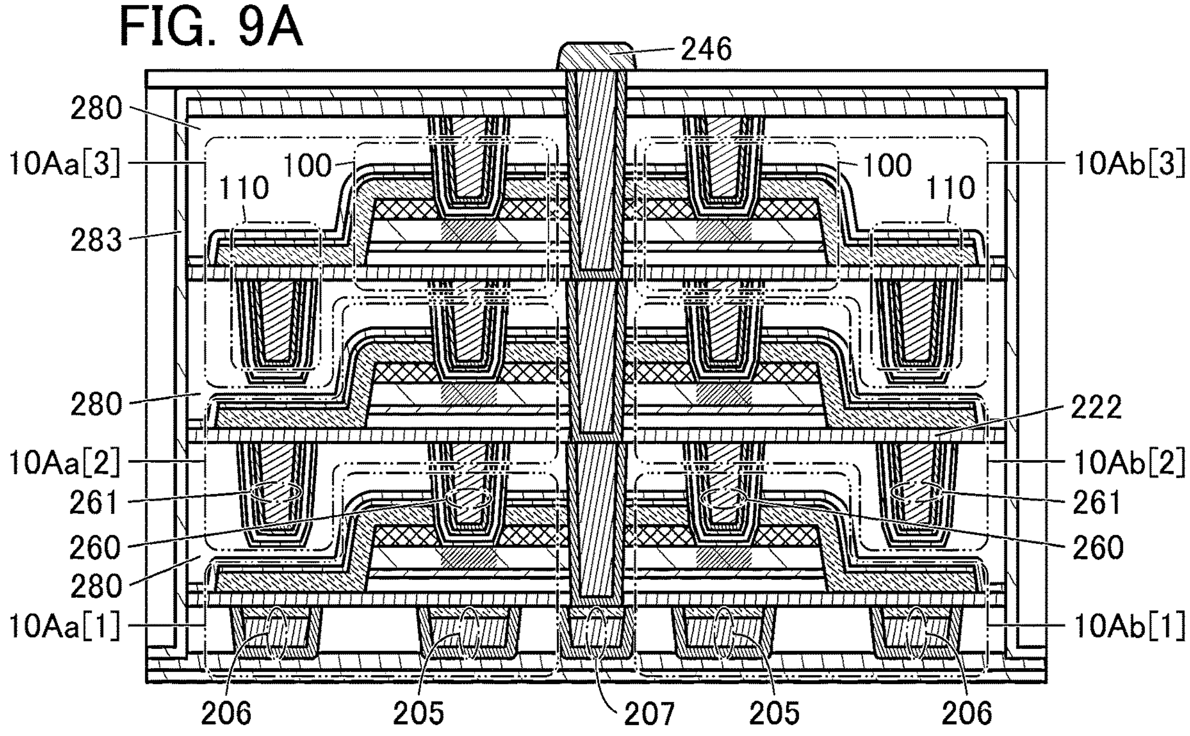
FIG. 9A is a diagram illustrating a structure example of a semiconductor device.
Figure 9B:
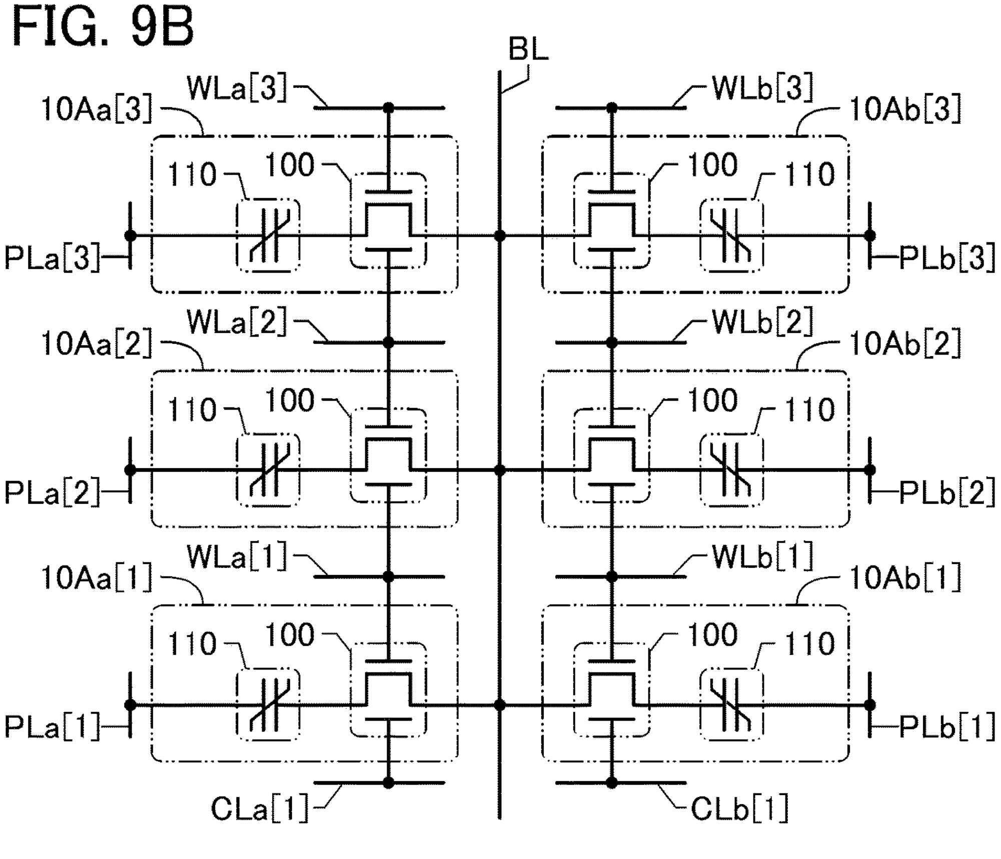
FIG. 9B is an equivalent circuit diagram of the semiconductor device.

FIG. 9A is a cross-sectional view illustrating a structure example in which the plurality of semiconductor devices 10A are stacked. FIG. 9B is an equivalent circuit diagram of the structure example illustrated in FIG. 9A.

In FIG. 9A, the conductor 205, the conductor 206, the insulator 216, the insulator 214, and the insulator 212 are not formed in the transistor 100 in the second layer, and the insulator 222 in the second layer is formed over the conductor 260 and the insulator 280 formed in the first layer.

Furthermore, a conductor 261 is formed in the insulator 280 in the first layer. The conductor 261 formed in the first layer functions as the other electrode of the capacitor 110 formed in the second layer. The conductor 261 in the first layer can be formed in the same step as the conductor 260 in the first layer at the same time.

In FIG. 9A, the conductor 205, the conductor 206, the insulator 216, the insulator 214, and the insulator 212 are not formed in the transistor 100 in the third layer, and the insulator 222 in the third layer is formed over the conductor 260 and the insulator 280 formed in the second layer.

Furthermore, the conductor 261 is formed in the insulator 280 in the second layer. The conductor 261 formed in the second layer functions as the other electrode of the capacitor 110 formed in the third layer. The conductor 261 in the second layer can be formed in the same step as the conductor 260 in the second layer at the same time.

Note that the conductor 261 is not necessarily formed in the uppermost layer. Alternatively, in the case where the capacitor 110 is not formed in the uppermost layer, the conductor 261 is not necessarily formed. In FIG. 9A, the conductor 261 is not formed in the third layer.

<Component Materials of Semiconductor Device>

Component materials that can be used for the semiconductor device are described below.

<<Substrate>>

As a substrate over which the semiconductor device 10 (the semiconductor device 10A, the semiconductor device 10B, and the semiconductor device 10C) is formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate.

Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate.

Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator.

Alternatively, these substrates provided with elements may be used. Examples of the element provided for the substrate include a capacitor, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative dielectric constant is used for the insulator functioning as an interlayer film, parasitic capacitance generated between wirings can be reduced. Thus, a material is preferably selected depending on the function of an insulator.

Examples of the insulator with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

In particular, the conductor functioning as the gate electrode is preferably formed using a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (hereinafter also referred to as an oxide semiconductor). A metal oxide that can be used as the oxide 230 of the present invention is described below.

Here, the case where the metal oxide is an In-M-Zn oxide containing indium, the element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M. In particular, the element M is preferably one or more kinds selected from gallium, aluminum, and tin.

It is particularly preferable to use an oxide containing indium (In), gallium (Ga), and zinc (Zn) (also referred to as "IGZO") for the semiconductor layer of the transistor. Alternatively, an oxide containing indium (In), aluminum (Al), and zinc (Zn) (also referred to as "IAZO") may be used for the semiconductor layer of the transistor. Alternatively, an oxide containing indium (In), aluminum (Al), gallium (Ga), and zinc (Zn) (also referred to as "IAGZO" or "IGAZO") may be used for the semiconductor layer. Note that an oxide containing indium (In), gallium (Ga), and zinc (Zn) may be referred to as an In—Ga—Zn oxide.

Note that in this specification and the like, a metal oxide containing nitrogen is also collectively referred to as a metal oxide in some cases. A metal oxide containing nitrogen may be referred to as a metal oxynitride.

Note that a metal oxide that can be used as the oxide 230 of the present invention will be described in detail in the other embodiments.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material refers to any group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Operation Example of Semiconductor Device 10>

Figure 10A:
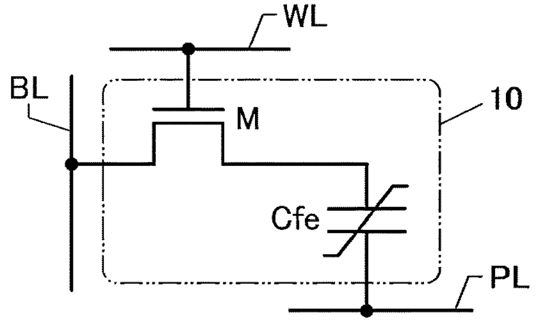
FIG. 10A is a diagram illustrating an example of a circuit configuration of a memory cell.

Next, an operation example of the semiconductor devices 10 (the semiconductor device 10A, the semiconductor device 10B, and the semiconductor device 10C) is described. FIG. 10A is an equivalent circuit diagram of the semiconductor device 10. The semiconductor device 10 illustrated in FIG. 10A is a DRAM (1Tr1C-type) memory element (memory cell) including one transistor M and one capacitor Cfe.

The capacitor Cfe includes a material that can have ferroelectricity as a ferroelectric layer between two electrodes. Thus, the semiconductor device 10 functions as an FeRAM (Ferroelectric Random Access Memory). The transistor M illustrated in FIG. 10A corresponds to the transistor 100, and the capacitor Cfe corresponds to the capacitor 110.

A variety of semiconductor materials can be used for a semiconductor layer in which the channel of the transistor M is formed. For example, as the semiconductor layer in which the channel of the transistor M is formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, oxide semiconductor, or nitride semiconductor may be used.

In particular, an OS transistor is preferably used as the transistor M. The OS transistor has a characteristic of a high withstand voltage between its source and drain. Thus, with use of an OS transistor as the transistor M, a high voltage can be applied to the transistor M even when the transistor M is miniaturized. The miniaturization of the transistor M can reduce the area occupied by the semiconductor device 10. For example, the area occupied by one semiconductor device 10 illustrated in FIG. 10A can be ⅓ to ⅙ of the area occupied by one cell of an SRAM (Static Random Access Memory). Accordingly, the semiconductor devices 10 can be arranged at high density. Thus, a storage device having high storage capacity can be achieved.

In the case where an OS transistor is used as a transistor included in the memory cell, the memory cell can be referred to as an "OS memory". In particular, the DRAM OS memory is referred to as a DOSRAM (registered trademark) in some cases. In addition, an FeRAM using an OS transistor as a transistor included in a memory cell is referred to as an FeDOSRAM in some cases.

The wiring WL has a function of a word line, and the potential of the wiring WL is controlled so that ON/OFF states of the transistor M can be controlled. For example, in the case where the transistor M is an n-channel transistor, the potential of the wiring WL is set to a high potential so that the transistor M can be turned on, while the potential of the wiring WL is set to a low potential so that the transistor M can be turned off.

The wiring BL has a function of a bit line, and the potential of the wiring BL is supplied to one electrode of the capacitor Cfe when the transistor M is in an on state.

The wiring PL functions as a plate line. A potential is supplied to the other electrode of the capacitor Cfe through the wiring PL.

<Hysteresis Characteristics>

Figure 10B:
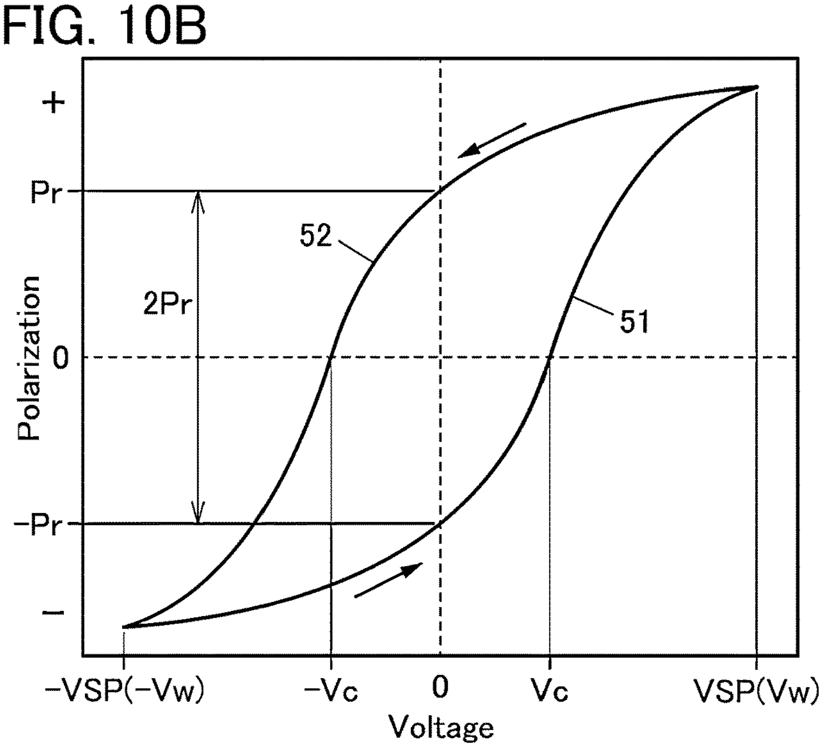
FIG. 10B is a graph showing an example of hysteresis characteristics.

A ferroelectric layer included in the capacitor Cfe has hysteresis characteristics. FIG. 10B is a graph showing an example of the hysteresis characteristics. The horizontal axis in FIG. 10B represents the voltage applied to the ferroelectric layer. The voltage can be a difference between the potential of one electrode of the capacitor Cfe and the potential of the other electrode of the capacitor Cfe, for example.

In addition, in FIG. 10B, the vertical axis represents polarization of the ferroelectric layer; a positive value indicates that positive charges are concentrated on one electrode side of the capacitor Cfe and negative charges are concentrated on the other electrode side of the capacitor Cfe. On the other hand, a negative value of the polarization indicates that positive charges are concentrated on the other electrode side of the capacitor Cfe and negative charges are concentrated on the one electrode side of the capacitor Cfe.

Note that the voltage represented by the horizontal axis of the graph in FIG. 10B may be a difference between the potential of the other electrode of the capacitor Cfe and the potential of the one electrode of the capacitor Cfe. Furthermore, the polarization represented by the vertical axis of the graph in FIG. 10B may be a positive value in the case where positive charges are concentrated on the other electrode side of the capacitor Cfe and negative charges are concentrated on the one electrode side of the capacitor Cfe, and may be a negative value in the case where positive charges are concentrated on the one electrode side of the capacitor Cfe and negative charges are concentrated on the other electrode side of the capacitor Cfe.

As shown in FIG. 10B, the hysteresis characteristics of the ferroelectric layer can be represented by a curve 51 and a curve 52. The voltages at the intersecting points between the curve 51 and the curve 52 are VSP and −VSP. The polarities of VSP and —VSP can be said to be different.

A voltage lower than or equal to −VSP is applied to the ferroelectric layer, and the voltage applied to the ferroelectric layer is increased, in which case the polarization of the ferroelectric layer is increased along the curve 51. On the other hand, a voltage higher than or equal to VSP is applied to the ferroelectric layer, and then the voltage applied to the ferroelectric layer is decreased, in which case the polarization of the ferroelectric layer is decreased along the curve 52. Thus, VSP and −VSP can each be referred to as a saturation polarization voltage. Incidentally, VSP is referred to as a first saturation polarization voltage and —VSP is referred to as a second saturation polarization voltage in some cases. In addition, the absolute values of the first saturation polarization voltage and the second saturation polarization voltage are equal to each other in FIG. 10B, but may be different from each other.

Here, Vc represents a voltage applied to the ferroelectric layer in the case where the polarization of the ferroelectric layer is 0 in the change of the polarization of the ferroelectric layer along the curve 51. In addition, −Vc represents a voltage applied to the ferroelectric layer in the case where the polarization of the ferroelectric layer is 0 in the change of the polarization of the ferroelectric layer along the curve 52. Vc and −Vc can be referred to as coercive voltages. The value of Vc and the value of −Vc can be said to be values between −VSP and VSP. For example, Vc is referred to as a first coercive voltage and −Vc is referred to as a second coercive voltage in some cases. Note that the absolute values of the first coercive voltage and the second coercive voltage are equal to each other in FIG. 10B, but may be different from each other.

The maximum value and the minimum value of polarization when a voltage is not applied to the ferroelectric layer are referred to as "remanent polarization Pr" and "remanent polarization—Pr", respectively. A difference between the remanent polarization Pr and the remanent polarization—Pr is referred to as "remanent polarization 2Pr".

As described above, a voltage applied to the ferroelectric layer included in the capacitor Cfe can be expressed by a difference between the potential of one electrode of the capacitor Cfe and the potential of the other electrode of the capacitor Cfe. As described above, the other electrode of the capacitor Cfe is electrically connected to the wiring PL. Thus, by controlling the potential of the wiring PL, the voltage applied to the ferroelectric layer included in the capacitor Cfe can be controlled.

An example of a method of driving the semiconductor device 10 functioning as a memory cell is described. In the following description, the voltage applied to the ferroelectric layer of the capacitor Cfe indicates a potential difference between the potential of one electrode of the capacitor Cfe and the potential of the other electrode of the capacitor Cfe (the wiring PL). In addition, the transistor M is an n-channel transistor.

Figure 10C:
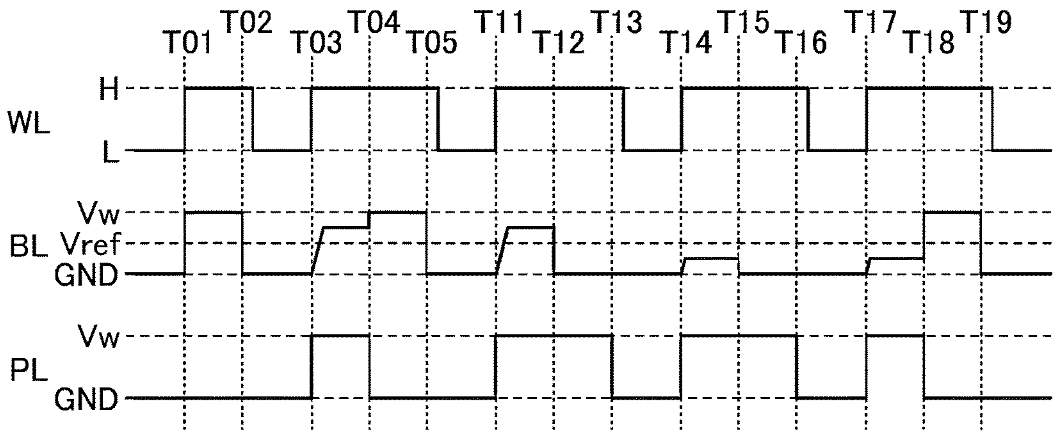
FIG. 10C is a timing chart showing an example of a driving method of the memory cell.

FIG. 10C is a timing chart showing an example of a driving method of the semiconductor device 10. FIG. 10C illustrates an example of writing and reading 2-bit digital data in and out of the semiconductor device 10. Specifically, in FIG. 10C, data "1" is written in the semiconductor device 10 from Time T01 to Time T02; the data "1" is read out and rewritten from Time T03 to Time T05; the data "1" is read out, and data "0" is written in the semiconductor device 10 from Time T11 to Time T13; the data "0" is read out and rewritten from Time T14 to Time T16; and the data "0" is read out and data "1" is written in the semiconductor device 10 from Time T17 to Time T19.

A sense amplifier electrically connected to the wiring BL is supplied with Vref as a reference potential. In the readout operation illustrated in FIG. 10C or the like, when the potential of the wiring BL is higher than Vref, data "1" is read out by a bit line driver circuit. In contrast, when the potential of the wiring BL is lower than Vref, data "0" is read out by the bit line driver circuit.

From Time T01 to Time T02, the potential of the wiring WL is set to a high potential. Thus, the transistor M is turned on. In addition, the potential of the wiring BL is set to Vw. Since the transistor M is in an on state, the potential of one electrode of the capacitor Cfe becomes Vw. In addition, the potential of the wiring PL is set to GND. Accordingly, the voltage applied to the ferroelectric layer of the capacitor Cfe becomes "Vw-GND". As a result, (the) data "1" can be written in the semiconductor device 10. Consequently, the period from Time T01 to Time T02 can be referred to as a write operation period.

Here, Vw is preferably higher than or equal to VSP, and is preferably equal to VSP, for example. In this specification and the like, GND can be set to a ground potential, but is not necessarily a ground potential as long as the semiconductor device 10 can be driven so as to achieve an object of one embodiment of the present invention. For example, when the absolute value of the first saturation polarization voltage is different from the absolute value of the second saturation polarization voltage, and the absolute value of the first coercive voltage is different from the absolute value of the second coercive voltage, GND can be a potential other than a ground.

From Time T02 to Time T03, the potential of the wiring BL and the potential of the wiring PL are set to GND. Accordingly, the voltage applied to the ferroelectric layer of the capacitor Cfe becomes 0 V. The voltage "Vw-GND" applied to the ferroelectric layer of the capacitor Cfe from Time T01 to Time T02 can be higher than or equal to VSP, and thus the polarization quantity of the ferroelectric layer of the capacitor Cfe is changed along the curve 52 in FIG. 10B from Time T02 to Time T03. From the above, from Time T02 to Time T03, polarization inversion does not occur in the ferroelectric layer of the capacitor Cfe.

After the potential of the wiring BL and the potential of the wiring PL are set to GND, the potential of the wiring WL is set to a low potential. Thus, the transistor M is turned off. Through the above steps, the write operation is completed and data "1" is held in the semiconductor device 10. Note that the potentials of the wiring BL and the wiring PL can be any potentials as long as polarization inversion does not occur in the ferroelectric layer of the capacitor Cfe, i.e., the voltage applied to the ferroelectric layer of the capacitor Cfe is higher than or equal to −Vc as the second coercive voltage.

From Time T03 to Time T04, the potential of the wiring WL is set to a high potential. Thus, the transistor M is turned on. The potential of the wiring PL is set to Vw. By setting the potential of the wiring PL to Vw, the voltage applied to the ferroelectric layer of the capacitor Cfe becomes "GND-Vw". As described above, from Time T01 to Time T02, the voltage applied to the ferroelectric layer of the capacitor Cfe is "Vw-GND". Thus, polarization inversion occurs in the ferroelectric layer of the capacitor Cfe. At the time of the polarization inversion, a current flows through the wiring BL, and the potential of the wiring BL becomes higher than Vref. Thus, the bit line driver circuit can read out the data "1" held in the semiconductor device 10. Accordingly, the period from Time T03 to Time T04 can be referred to as a readout operation period. Note that Vref is higher than GND and lower than Vw but may be higher than Vw, for example.

Since the above readout is destructive readout, the data "1" held in the semiconductor device 10 is lost. Thus, from Time T04 to Time T05, the potential of the wiring BL is set to Vw and the potential of the wiring PL is set to GND. Thus, data "1" is rewritten in the semiconductor device 10. Consequently, the period from Time T04 to Time T05 can be referred to as a rewrite operation period.

From Time T05 to Time T11, the potential of the wiring BL and the potential of the wiring PL are set to GND. After that, the potential of the wiring WL is set to a low potential. Through the above steps, the rewrite operation is completed, and the data "1" is held in the semiconductor device 10.

From Time T11 to Time T12, the potential of the wiring WL is set to a high potential and the potential of the wiring PL is set to Vw. Since the data "1" is held in the semiconductor device 10, the potential of the wiring BL becomes higher than Vref and the data "1" held in the semiconductor device 10 is read out. Accordingly, the period from Time T11 to Time T12 can be referred to as a readout operation period.

From Time T12 to Time T13, the potential of the wiring BL is set to GND. Since the transistor M is in an on state, the potential of one electrode of the capacitor Cfe becomes GND. The potential of the wiring PL is set to Vw. In the above manner, the voltage applied to the ferroelectric layer of the capacitor Cfe becomes to be "GND-Vw". As a result, data "0" can be written in the semiconductor device 10.

Consequently, the period from Time T12 to Time T13 can be referred to as a write operation period.

From Time T13 to Time T14, the potential of the wiring BL and the potential of the wiring PL are set to GND. Accordingly, the voltage applied to the ferroelectric layer of the capacitor Cfe becomes 0 V. The voltage "GND-Vw" applied to the ferroelectric layer of the capacitor Cfe from Time T12 to Time T13 can be set to be −VSP or lower; thus, the polarization quantity of the ferroelectric layer of the capacitor Cfe is changed along the curve 51 in FIG. 10B from Time T13 to Time T14. From the above, from Time T13 to Time T14, polarization inversion does not occur in the ferroelectric layer of the capacitor Cfe.

After the potential of the wiring BL and the potential of the wiring PL are set to GND, the potential of the wiring WL is set to a low potential. Thus, the transistor M is turned off. Through the above steps, the write operation is completed and data "0" is held in the semiconductor device 10. Note that the potentials of the wiring BL and the wiring PL can be any potentials as long as polarization inversion does not occur in the ferroelectric layer of the capacitor Cfe, i.e., the voltage applied to the ferroelectric layer of the capacitor Cfe is lower than or equal to Vc as the first coercive voltage.

From Time T14 to Time T15, the potential of the wiring WL is set to a high potential. Thus, the transistor M is turned on. The potential of the wiring PL is set to Vw. By setting the potential of the wiring PL to Vw, the voltage applied to the ferroelectric layer of the capacitor Cfe becomes "GND-Vw". As described above, the voltage applied to the capacitor layer of the capacitor Cfe from Time T12 to Time T13 is "GND-Vw". Thus, polarization inversion does not occur in the ferroelectric layer of the capacitor Cfe. Consequently, the amount of current flowing through the wiring BL is smaller than that in the case where the polarization inversion occurs in the ferroelectric layer of the capacitor Cfe. Accordingly, the increase amount in the potential of the wiring BL is smaller than that in the case where the polarization inversion occurs in the ferroelectric layer of the capacitor Cfe; specifically, the potential of the wiring BL becomes lower than or equal to Vref. Thus, the bit line driver circuit can read out the data "0" held in the semiconductor device 10. Accordingly, the period from Time T14 to Time T15 can be referred to as a readout operation period.

From Time T15 to Time T16, the potential of the wiring BL is set to GND and the potential of the wiring PL is set to Vw. Thus, data "0" is rewritten in the semiconductor device 10. Accordingly, the period from Time T15 to Time T16 can be referred to as a rewrite operation period.

From Time T16 to Time T17, the potential of the wiring BL and the potential of the wiring PL are set to GND. After that, the potential of the wiring WL is set to a low potential. Through the above steps, the rewrite operation is completed, and the data "0" is held in the semiconductor device 10.

From Time T17 to Time T18, the potential of the wiring WL is set to a high potential and the potential of the wiring PL is set to Vw. Since the data "0" is held in the semiconductor device 10, the potential of the wiring BL becomes lower than Vref and the data "0" held in the semiconductor device 10 is read out. Accordingly, the period from Time T17 to Time T18 can be referred to as a readout operation period.

The potential of the wiring BL is set to Vw from Time T18 to Time T19. Since the transistor M is in an on state, the potential of one electrode of the capacitor Cfe becomes Vw. The potential of the wiring PL is set to GND. Accordingly, the voltage applied to the ferroelectric layer of the capacitor Cfe becomes "Vw-GND". As a result, data "1" can be written in the semiconductor device 10. Consequently, the period from Time T18 to Time T19 can be referred to as a write operation period.

After Time T19, the potential of the wiring BL and the potential of the wiring PL are set to GND. After that, the potential of the wiring WL is set to a low potential. Through the above steps, the write operation is completed and the data "1" is held in the semiconductor device 10.

The semiconductor device 10 including the ferroelectric layer in the capacitor Cfe functions as a nonvolatile memory element that can hold information written therein even when power supply is stopped.

A DRAM (Dynamic Random Access Memory) requires regular refresh operation and thus increases power consumption. The semiconductor device 10 that includes the capacitor Cfe including a ferroelectric layer does not require refresh operation and thus can have low power consumption.

In this specification and the like, a memory element including a ferroelectric layer or a memory circuit including a ferroelectric layer is referred to as a "ferroelectric memory" or an "FE memory" in some cases. Thus, the semiconductor device 10 is a ferroelectric memory and is also an FE memory. The FE memory can be expected to achieve the number of rewrite cycles of $1\times10^{10}$ or more, preferably $1\times10^{12}$ or more, further preferably $1\times10^{15}$ or more. The FE memory can be expected to achieve an operation frequency of greater than or equal to 10 MHz, preferably greater than or equal to 1 GHz.

In the FE memory, the remanent polarization 2Pr and data holding capability have a correlation, and as the remanent polarization 2Pr becomes smaller, the data holding capability declines. In this specification and the like, a period over which the remanent polarization 2Pr is reduced by 5% (the data holding capability declines by 5%) is referred to as a "memory holding period". The FE memory can be expected to have a memory holding period of ten days or longer, preferably one year or longer, further preferably ten years or longer at an environmental temperature of 150° C. or 200° C.

The FE memory can also be applied to a cache memory and a register in a CPU (Central Processing Unit), a GPU (Graphics Processing Unit), and the like. An Noff-CPU (Nomaly off CPU) can be obtained by a combination of the FE memory with a cache memory and a register in a CPU. An Noff-GPU (Nomaly off GPU) can be obtained by a combination of the FE memory with a cache memory and a register in a GPU.

This embodiment can be combined as appropriate with any of the other embodiments and the like described in this specification.

Embodiment 2

In this embodiment, a structure example of a storage device 300 using the semiconductor device 10 as a memory cell will be described.

Figure 11A:
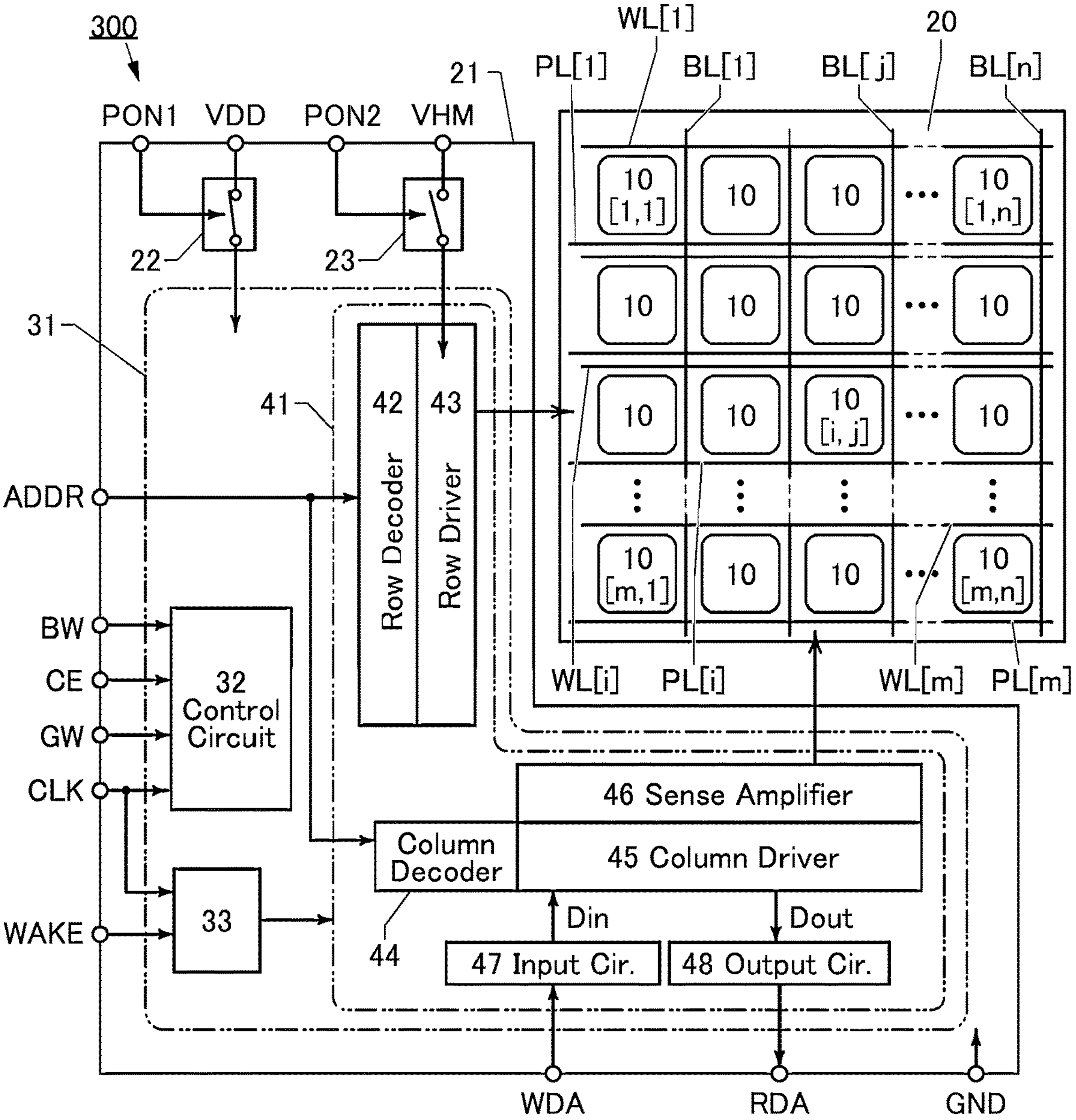
FIG. 11A to FIG. 11C are diagrams illustrating structure examples of a storage device.

FIG. 11A is a block diagram illustrating a structure example of the storage device 300 of one embodiment of the present invention. The storage device 300 illustrated in FIG. 11A includes a driver circuit 21 and a memory array 20. The memory array 20 includes a plurality of semiconductor devices 10. FIG. 11A illustrates an example in which the memory array 20 includes the plurality of semiconductor devices 10 arranged in a matrix of m rows and n columns (each of m and n is an integer greater than or equal to 2).

Note that the rows and the columns extend in directions orthogonal to each other. In this embodiment, the X direction (direction along the X-axis) is referred to as a "row" and the Y direction (direction along the Y-axis) is referred to as a "column", but the X direction may be referred to as a "column" and the Y direction may be referred to as a "row".

In FIG. 11A, the semiconductor device 10 in the first row and the first column is denoted as a semiconductor device 10[1, 1] and a semiconductor device 10 in the m-th row and the n-th column is denoted as a semiconductor device 10[m, n]. In this embodiment and the like, a given row is denoted as an i-th row in some cases. A given column is denoted as a j-th column in some cases. Thus, i is an integer greater than or equal to 1 and less than or equal to m, and j is an integer greater than or equal to 1 and less than or equal to n. In this embodiment and the like, the semiconductor device 10 in the i-th row and the j-th column is denoted as a semiconductor device 10[i, j]. Note that in this embodiment and the like, "i+a" (a is a positive or negative integer) is not below 1 and does not exceed m. Similarly, "j+a" is not below 1 and does not exceed n.

The memory array 20 includes m wirings WL extending in the row direction, m wirings PL extending in the row direction, and n wirings BL extending in the column direction. In this embodiment and the like, a first (first row) wiring WL is referred to as a wiring WL[1] and an m-th (m-th row) wiring WL is referred to as a wiring WL[m]. Similarly, a first (first row) wiring PL is referred to as a wiring PL[1] and an m-th (m-th row) wiring PL is referred to as a wiring PL[m]. Similarly, a first (first column) wiring BL is referred to as a wiring BL[1] and an n-th (n-th column) wiring BL is referred to as a wiring BL[n].

The plurality of semiconductor devices 10 provided in the i-th row are electrically connected to the wiring WL in the i-th row (wiring WL[i]) and the wiring PL in the i-th row (wiring PL[i]). The plurality of semiconductor devices 10 provided in the j-th column are electrically connected to the wiring BL in the j-th column (wiring BL[j]).

The driver circuit 21 includes a PSW 22 (power switch), a PSW 23, and a peripheral circuit 31. The peripheral circuit 31 includes a peripheral circuit 41, a control circuit 32, and a voltage generation circuit 33.

In the storage device 300, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the entire operation of the storage device 300. For example, the control circuit performs a logical operation on the signal CE, the signal GW, and the signal BW to determine an operation mode (e.g., a writing operation or a reading operation) of the storage device 300. Alternatively, the control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from the semiconductor devices 10. The peripheral circuit 41 includes a row decoder 42, a column decoder 44, a row driver 43, a column driver 45, an input circuit 47 (Input Cir.), an output circuit 48 (Output Cir.), and a sense amplifier 46.

The row decoder 42 and the column decoder 44 have a function of decoding the signal ADDR. The row decoder 42 is a circuit for specifying a row to be accessed, and the column decoder 44 is a circuit for specifying a column to be accessed. The row driver 43 has a function of selecting the wiring WL specified by the row decoder 42. The column driver 45 has a function of writing data to the semiconductor devices 10, a function of reading data from the semiconductor devices 10, a function of retaining the read data, and the like.

The input circuit 47 has a function of retaining the signal WDA. Data retained by the input circuit 47 is output to the column driver 45. Data output from the input circuit 47 is data (Din) to be written to the semiconductor devices 10. Data (Dout) read from the semiconductor devices 10 by the column driver 45 is output to the output circuit 48. The output circuit 48 has a function of retaining Dout. In addition, the output circuit 48 has a function of outputting Dout to the outside of the storage device 300. Data output from the output circuit 48 is the signal RDA.

The PSW 22 has a function of controlling supply of VDD to the peripheral circuit 31. The PSW 23 has a function of controlling supply of VHM to the row driver 43. Here, in the storage device 300, a high power supply voltage is VDD and a low power supply voltage is GND (a ground potential). In addition, VHM is a high power supply voltage used to set a word line at a high level and is higher than VDD. The on/off of the PSW 22 is controlled by the signal PON1, and the on/off of the PSW 23 is controlled by the signal PON2. The number of power domains to which VDD is supplied is one in the peripheral circuit 31 in FIG. 11A but can be more than one. In this case, a power switch is provided for each power domain.

Figure 11B:
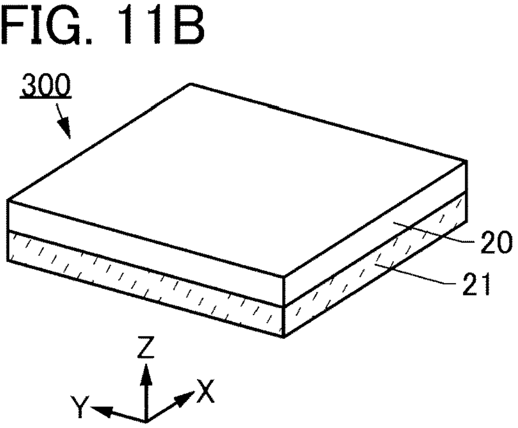

The driver circuit 21 and the memory array 20 may be provided on the same plane. As illustrated in FIG. 11B, a layer including the memory array 20 may be provided directly over a layer including the driver circuit 21. When the driver circuit 21 and the memory array 20 are provided to overlap with each other, the signal transmission distance between the driver circuit 21 and the memory array 20 can be shortened. Accordingly, resistance and parasitic capacitance between the driver circuit 21 and the memory array 20 are reduced, so that power consumption and signal delays can be reduced. In addition, the storage device 300 can be downsized.

Figure 11C:
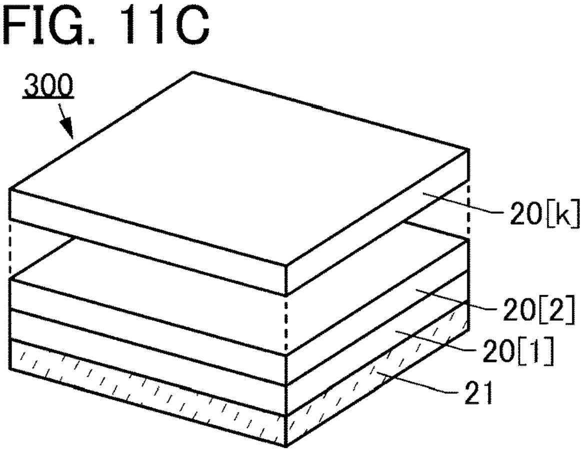

In FIG. 11B, the memory array 20 is provided as one layer over the driver circuit 21 to overlap with the driver circuit 21; however, two or more layers of the memory arrays 20 may be provided over the driver circuit 21 to overlap with the driver circuit 21. FIG. 11C illustrates an example in which k layers (k is an integer greater than or equal to 2) of the memory arrays 20 are provided over the driver circuit 21 to overlap with the driver circuit 21. In FIG. 11C and the like, the memory array 20 in the first layer is denoted as a memory array 20[1], the memory array 20 in the second layer is denoted as a memory array 20[2], and the memory array 20 in the k-th layer is denoted as a memory array 20[k].

Figure 12A:
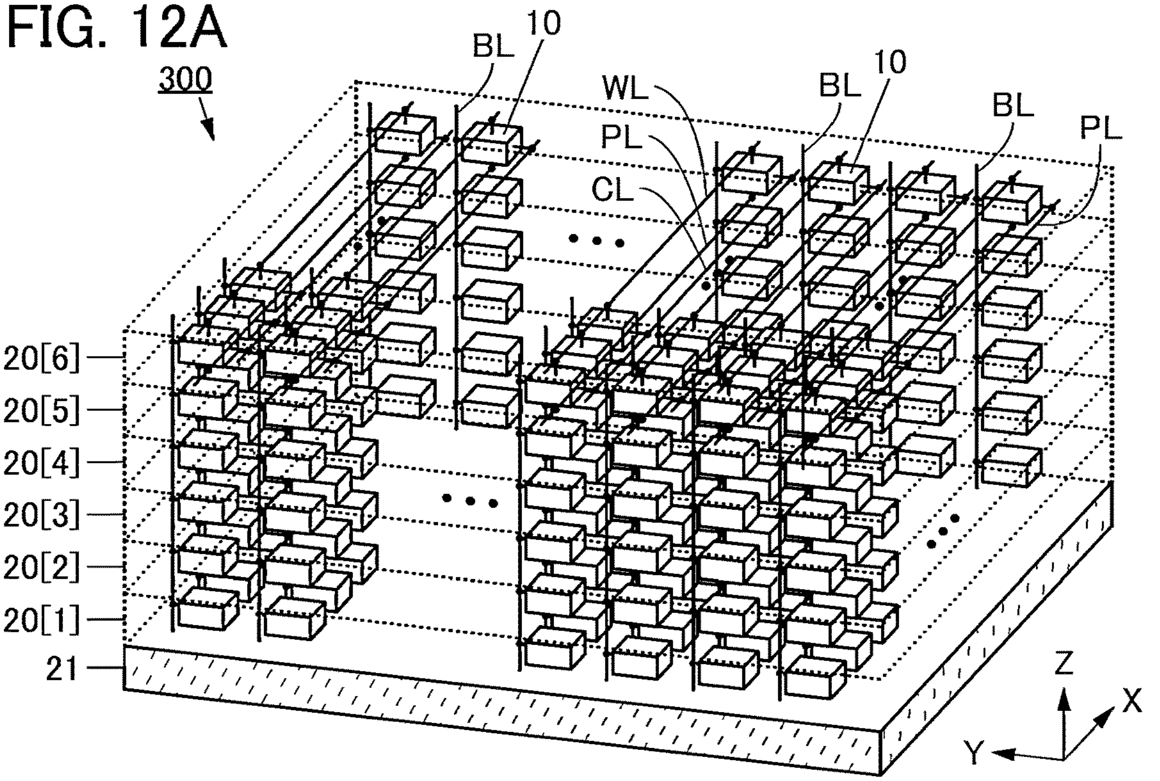
FIG. 12A is a diagram illustrating a structure example of a storage device.

FIG. 12A is a schematic diagram illustrating a structure example of the storage device 300. The storage device 300 illustrated in FIG. 12A includes six layers of the memory arrays 20 provided over the driver circuit 21. As described above, in FIG. 12A and the like, the memory array 20 provided in the third layer is denoted as a memory array 20[3], the memory array 20 provided in the fourth layer is denoted as a memory array 20[4], the memory array 20 provided in the fifth layer is denoted as a memory array 20[5], and the memory array 20 provided in the sixth layer is denoted as a memory array 20[6].

Each layer of the memory arrays 20 includes a plurality of semiconductor devices 10 arranged in a matrix, and the wiring WL, the wiring CL, and the wiring PL extending in the X direction. For easy viewing of the drawing, the wirings WL, the wirings CL, and the wirings PL included in the memory arrays 20 in the first to fifth layers are not illustrated.

The storage device 300 illustrated in FIG. 12A includes a plurality of wirings BL extending in the Z direction. The wiring BL is formed through the six layers of the memory arrays 20 and is electrically connected to the driver circuit 21. When seen from the Z direction, the plurality of wirings BL are arranged in a matrix.

In each layer of the memory arrays 20, one of the plurality of semiconductor devices 10 included in the memory array 20 is electrically connected to one of the plurality of wirings BL. Thus, in the storage device 300 illustrated in FIG. 12A, one semiconductor device 10 of one memory array 20, i.e., six semiconductor devices 10 in total, are electrically connected to one wiring BL.

A configuration in which a plurality of memory cells (semiconductor devices 10) are electrically connected to one wiring BL is also referred to as "memory string". Thus, it can be said that the storage device 300 illustrated in FIG. 12A includes a plurality of memory strings.

Figure 12B:
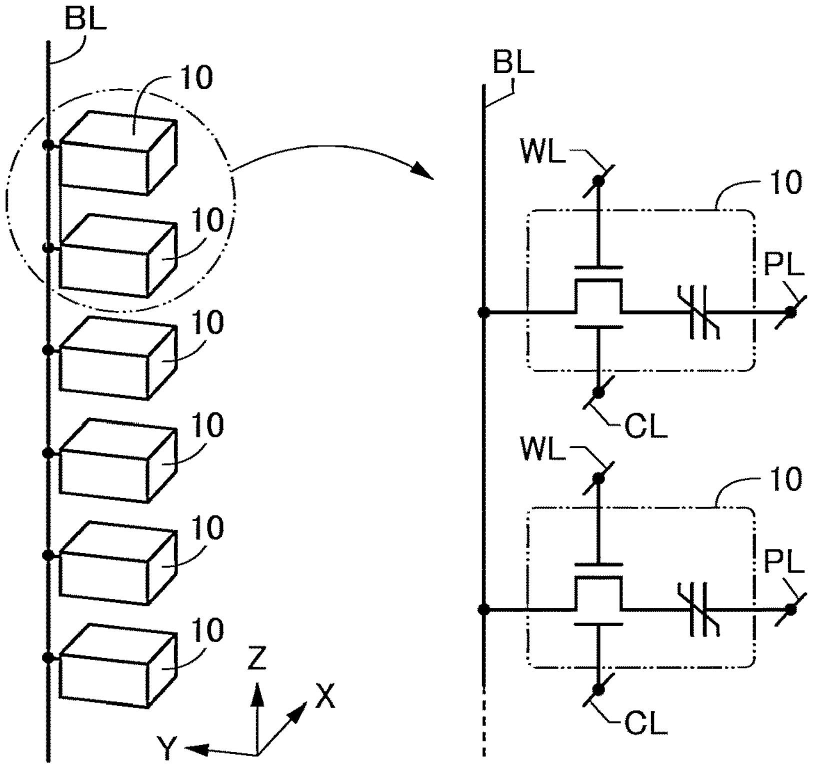
FIG. 12B is a schematic diagram illustrating a memory string included in the storage device.

FIG. 12B is a schematic diagram of a memory string included in the storage device 300 illustrated in FIG. 12A. For easy viewing of the drawing, the wirings WL, the wirings CL, and the wirings PL electrically connected to the semiconductor devices 10 are not illustrated in the schematic diagram of a memory string in FIG. 12B. In addition, part of an equivalent circuit of the memory string is illustrated in FIG. 12B.

Figure 13A:
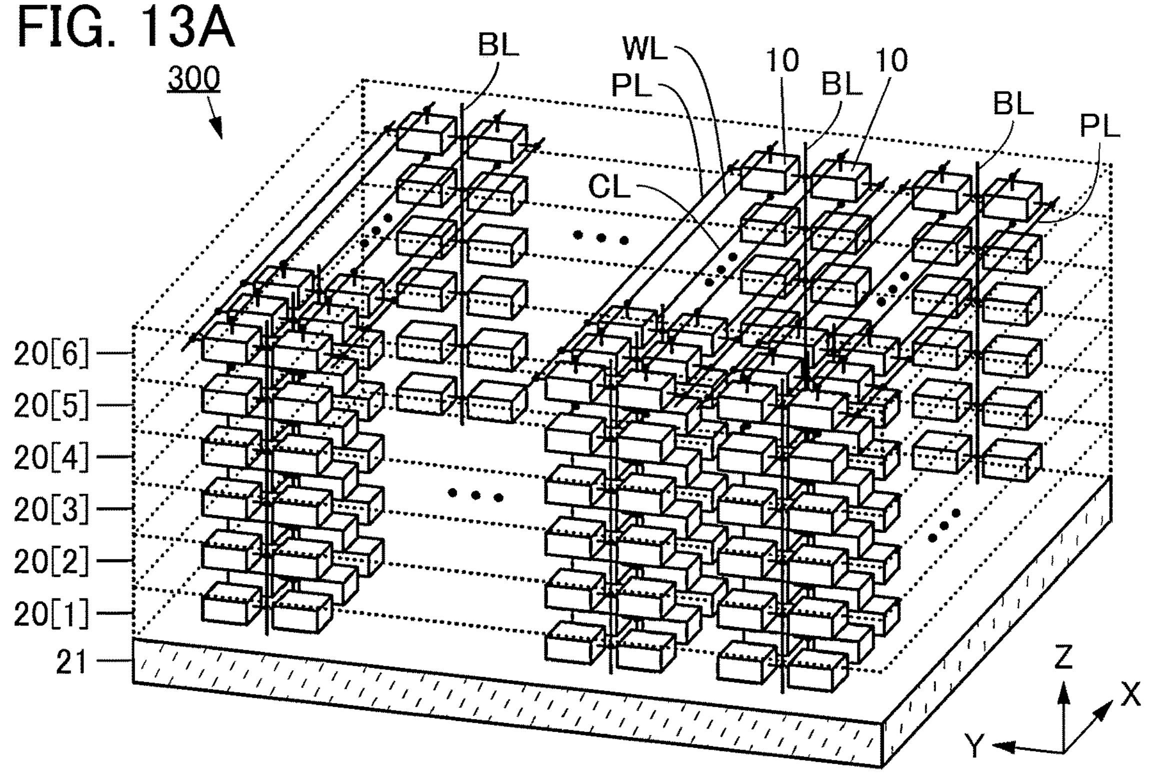
FIG. 13A is a diagram illustrating a structure example of a storage device.

FIG. 13A is a schematic diagram illustrating a structure example of the storage device 300. The storage device 300 illustrated in FIG. 13A is a modification example of the storage device 300 illustrated in FIG. 12A. Therefore, differences from the storage device 300 illustrated in FIG. 12A are mainly described in order to reduce repeated description.

The storage device 300 illustrated in FIG. 13A is different from the storage device 300 illustrated in FIG. 12A in that two of the plurality of semiconductor devices 10 included in each layer of the memory arrays 20 are electrically connected to one of the plurality of wirings BL. That is, 12 semiconductor devices 10 in total are electrically connected to one wiring BL.

Figure 13B:
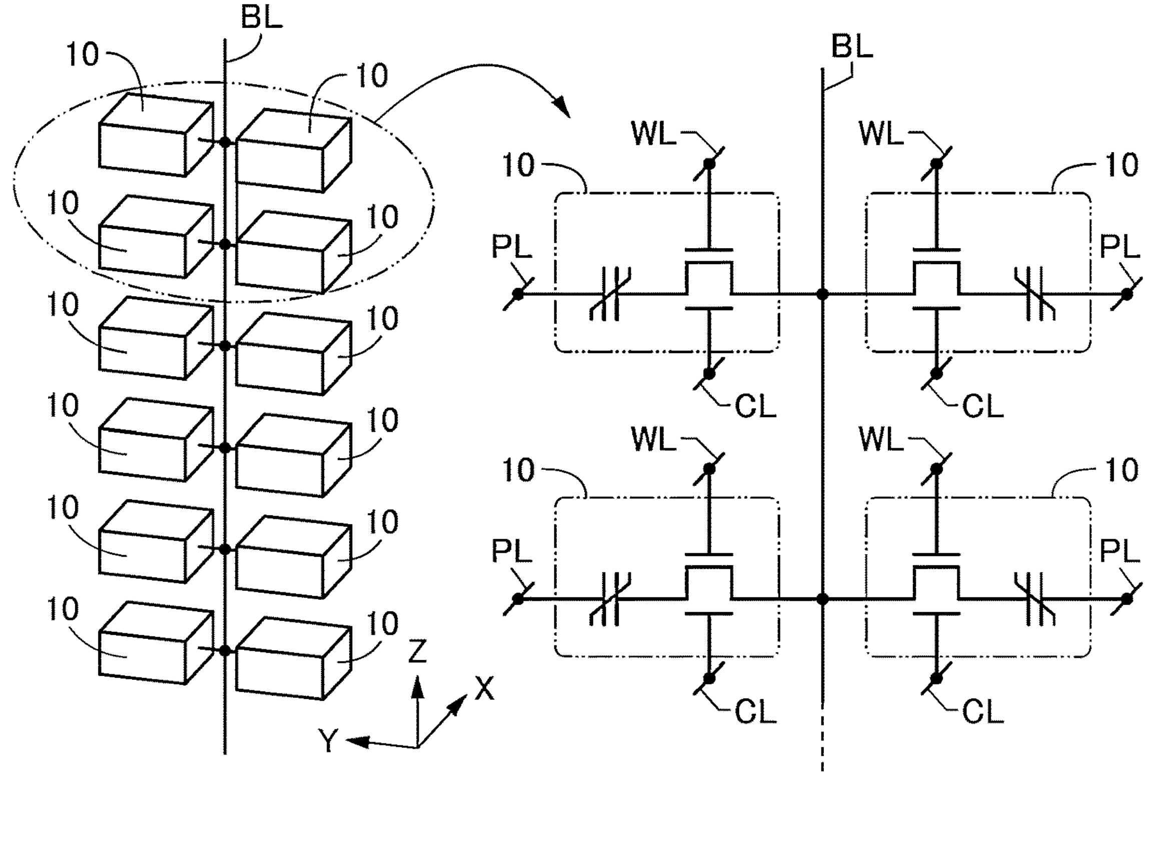
FIG. 13B is a schematic diagram illustrating a memory string included in the storage device.

FIG. 13B is a schematic diagram of a memory string included in the storage device 300 illustrated in FIG. 13A. In addition, part of an equivalent circuit of the memory string is illustrated in FIG. 13B.

In the storage device 300 illustrated in FIG. 13A, the number of wirings BL can be smaller than that in the storage device 300 illustrated in FIG. 12A. Thus, the area occupied by the storage device 300 is reduced.

The semiconductor device 10 of one embodiment of the present invention is an FE memory, and can retain written data for a long time even when power supply is stopped. Since refresh operation required by a DRAM is unnecessary, the storage device 300 with low power consumption can be achieved.

[Structure Example of Semiconductor Device]

Figure 14:
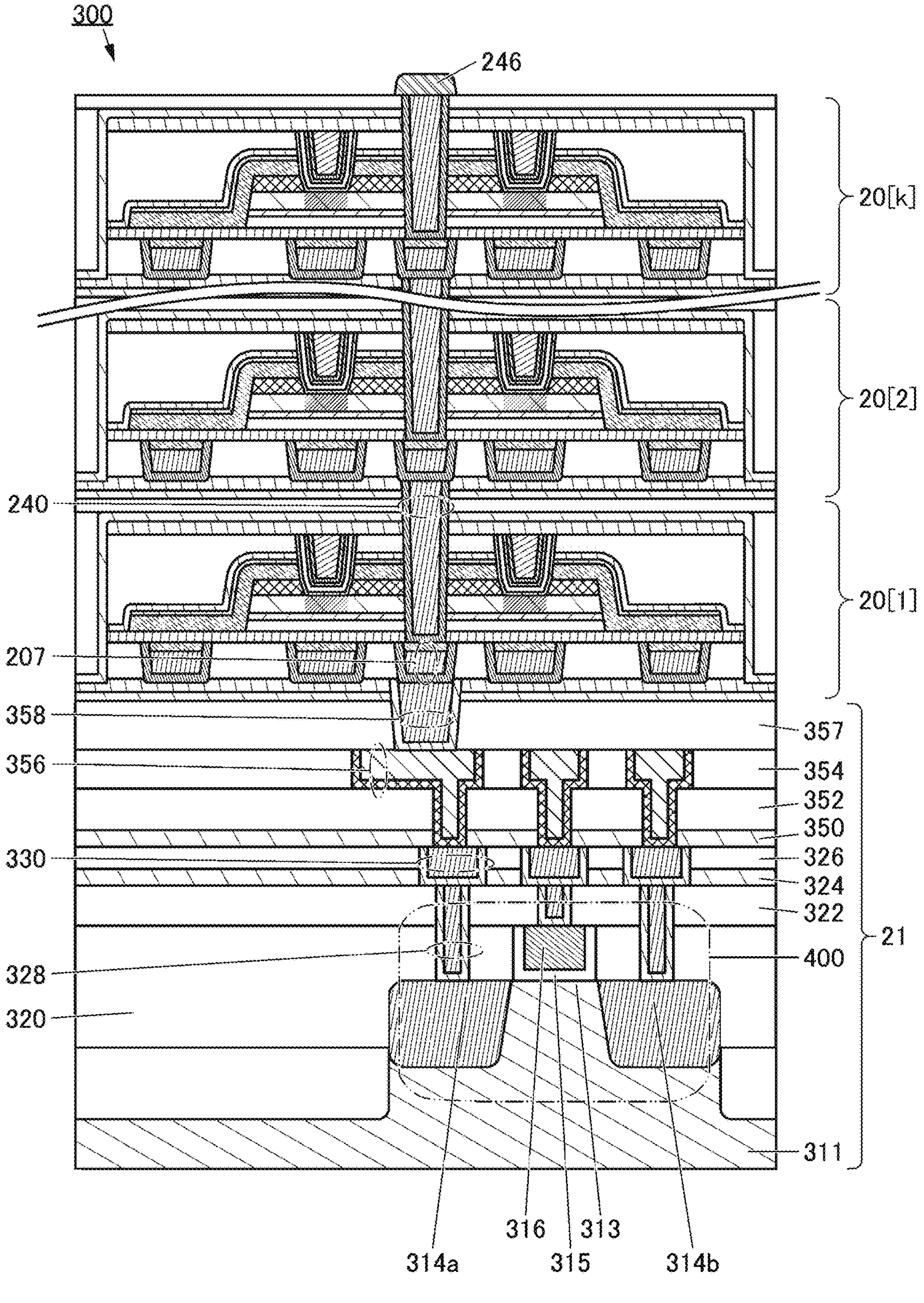
FIG. 14 is a diagram illustrating a cross-sectional structure example of a storage device.

FIG. 14 illustrates a cross-sectional structure example of the storage device 300 of one embodiment of the present invention. The storage device 300 illustrated in FIG. 14 includes k layers of the memory arrays 20 above the driver circuit 21. FIG. 14 illustrates the structure illustrated in FIG. 8 and FIG. 13 as the k layers of the memory arrays 20. The description of the k layers of the memory arrays 20 is omitted here in order to reduce repeated description.

FIG. 14 illustrates a transistor 400 included in the driver circuit 21 as an example. The transistor 400 is provided on a substrate 311 and includes a conductor 316 functioning as a gate, an insulator 315 functioning as a gate insulator, a semiconductor region 313 formed of part of the substrate 311, and a low-resistance region 314*a* and a low-resistance region 314*b* functioning as a source region and a drain region. The transistor 400 may be a p-channel transistor or an n-channel transistor. As the substrate 311, a single crystal silicon substrate can be used, for example.

Here, in the transistor 400 illustrated in FIG. 14, the semiconductor region 313 (part of the substrate 311) where a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 400 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI (Silicon on Insulator) substrate.

Note that the transistor 400 illustrated in FIG. 14 is an example and the structure is not limited thereto; an appropriate transistor can be used in accordance with a circuit structure or a driving method.

Wiring layers provided with an interlayer film, a wiring, a plug, and the like may be provided between the components. A plurality of wiring layers can be provided in accordance with design. Furthermore, in this specification and the like, a wiring and a plug electrically connected to the wiring may be a single component. That is, there are cases where part of a conductor functions as a wiring and part of a conductor functions as a plug.

For example, an insulator 320, an insulator 322, an insulator 324, and an insulator 326 are sequentially stacked over the transistor 400 as interlayer films. A conductor 328, a conductor 330, and the like that are electrically connected to the conductor 207 are embedded in the insulator 320, the insulator 322, the insulator 324, and the insulator 326. Note that the conductor 328 and the conductor 330 function as a contact plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve the planarity.

A wiring layer may be provided over the insulator 326 and the conductor 330. For example, in FIG. 14, an insulator 350, an insulator 352, and an insulator 354 are stacked sequentially over the insulator 326 and the conductor 330. A conductor 356 is formed in the insulator 350, the insulator 352, and the insulator 354. The conductor 356 functions as a contact plug or a wiring.

An insulator 357 is provided over the insulator 354 and the conductor 356. A conductor 358 is embedded in the insulator 357. The conductor 358 functions as a contact plug or a wiring. The conductor 207 and the conductor 356 are electrically connected to each other through the conductor 358.

This embodiment can be combined as appropriate with any of the other embodiments and the like described in this specification.

Embodiment 3

In this embodiment, a metal oxide that can be used for a semiconductor where a channel of a transistor is formed will be described.

The metal oxide preferably contains at least indium or zinc. In particular, indium and zinc are preferably contained. In addition to them, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 15A. FIG. 15A is a diagram showing classification of crystal structures of an oxide semiconductor, typically IGZO (a metal oxide containing In, Ga, and Zn).

As shown in FIG. 15A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 15A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 15B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 15B and obtained by GIXD measurement is hereinafter simply referred to as an XRD spectrum in some cases. The CAAC-IGZO film in FIG. 15B has a composition in the vicinity of In:Ga:Zn=4:2:3 [atomic ratio]. The CAAC-IGZO film in FIG. 15B has a thickness of 500 nm.

As shown in FIG. 15B, a clear peak indicating crystallinity is detected in the XRD spectrum of the CAAC-IGZO film. Specifically, a peak indicating c-axis alignment is detected at $2\theta$ of around 310 in the XRD spectrum of the CAAC-IGZO film. As shown in FIG. 15B, the peak at $2\theta$ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 15C shows a diffraction pattern of a CAAC-IGZO film. FIG. 15C shows a diffraction pattern obtained with the NBED method in which an electron beam is incident in the direction parallel to the substrate. The CAAC-IGZO film in FIG. 15C has a composition in the vicinity of In:Ga:Zn=4:2:3 [atomic ratio]. In the nanobeam electron diffraction method, electron diffraction is performed with a probe diameter of 1 nm.

As shown in FIG. 15C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 15A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects, and the like (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^{-3}$, preferably lower than or equal to $2\times10^{17}$ atoms/$cm^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/$cm^{-3}$, preferably lower than or equal to $2\times10^{16}$ atoms/$cm^{-3}$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/$cm^{-3}$, preferably lower than or equal to $5\times10^{18}$ atoms/$cm^{-3}$, further preferably lower than or equal to $1\times10^{18}$ atoms/$cm^{-3}$, still further preferably lower than or equal to $5\times10^{17}$ atoms/$cm^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/$cm^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

This embodiment can be combined as appropriate with any of the other embodiments and the like described in this specification.

Embodiment 4

In this embodiment, an example of a chip 1200 on which the semiconductor device of the present invention is mounted is described with reference to FIG. 16A and FIG. 16B. A plurality of circuits (systems) are mounted on the chip 1200. A technique for integrating a plurality of circuits (systems) into one chip is referred to as system on chip (SoC) in some cases.

Figure 16A:
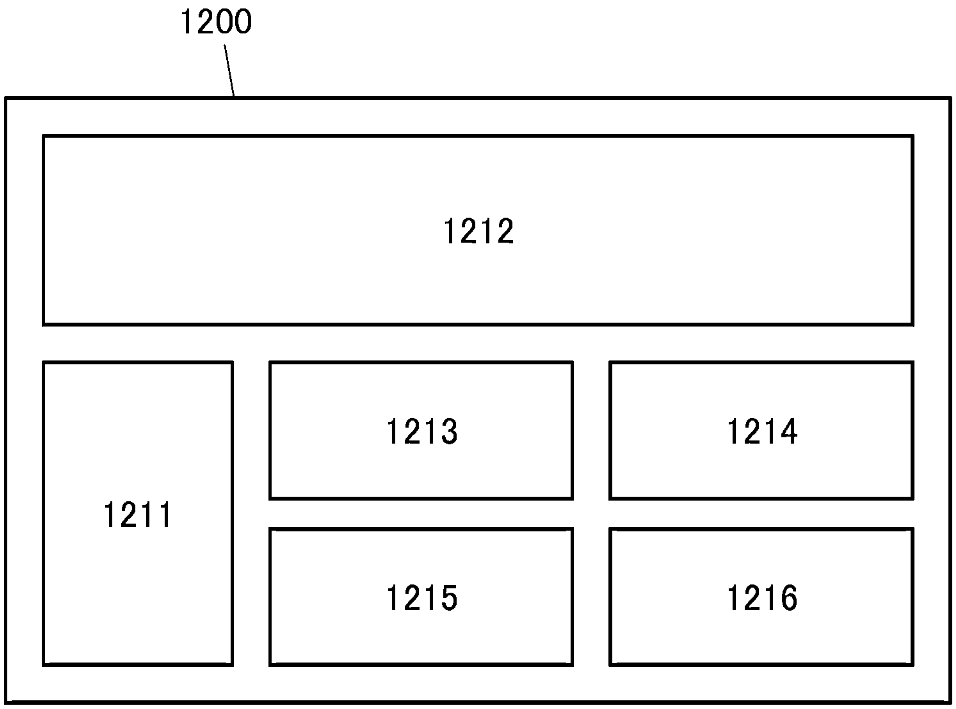
FIG. 16A and FIG. 16B are schematic diagrams of a semiconductor device of one embodiment of the present invention.

As illustrated in FIG. 16A, the chip 1200 includes a CPU 1211, a GPU 1212, one or more analog arithmetic units 1213, one or more memory controllers 1214, one or more interfaces 1215, one or more network circuits 1216, and the like.

Figure 16B:
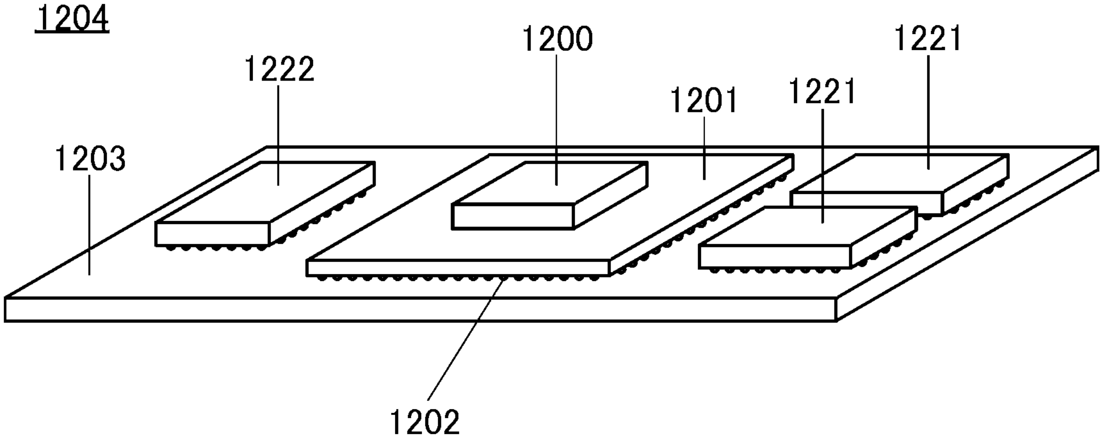

A bump (not illustrated) is provided on the chip 1200, and as illustrated in FIG. 16B, the chip 1200 is connected to a first surface of a package board 1201. In addition, a plurality of bumps 1202 are provided on a rear side of the first surface of the package board 1201, and the package board 1201 is connected to a motherboard 1203.

Storage devices such as a storage device 1221 and a flash memory 1222 may be provided over the motherboard 1203. For example, the semiconductor device 10 can be used as the storage device 1221. Alternatively, the semiconductor device 10 may be used instead of the flash memory 1222, for example.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The semiconductor device 10 can be used as the memory. Moreover, the GPU 1212 is suitable for parallel computation of a number of data and thus can be used for image processing or product-sum operation. When an image processing circuit or a product-sum operation circuit including an oxide semiconductor is provided in the GPU 1212, image processing or product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the storage device 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the package board 1201 on which the chip 1200 including the GPU 1212 is mounted, the storage devices 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

This embodiment can be combined as appropriate with any of the other embodiments and the like described in this specification.

Embodiment 5

In this embodiment, examples of electronic components in which the semiconductor device or the like described in the above embodiment is incorporated will be described.

<Electronic Component>

Figure 17A:
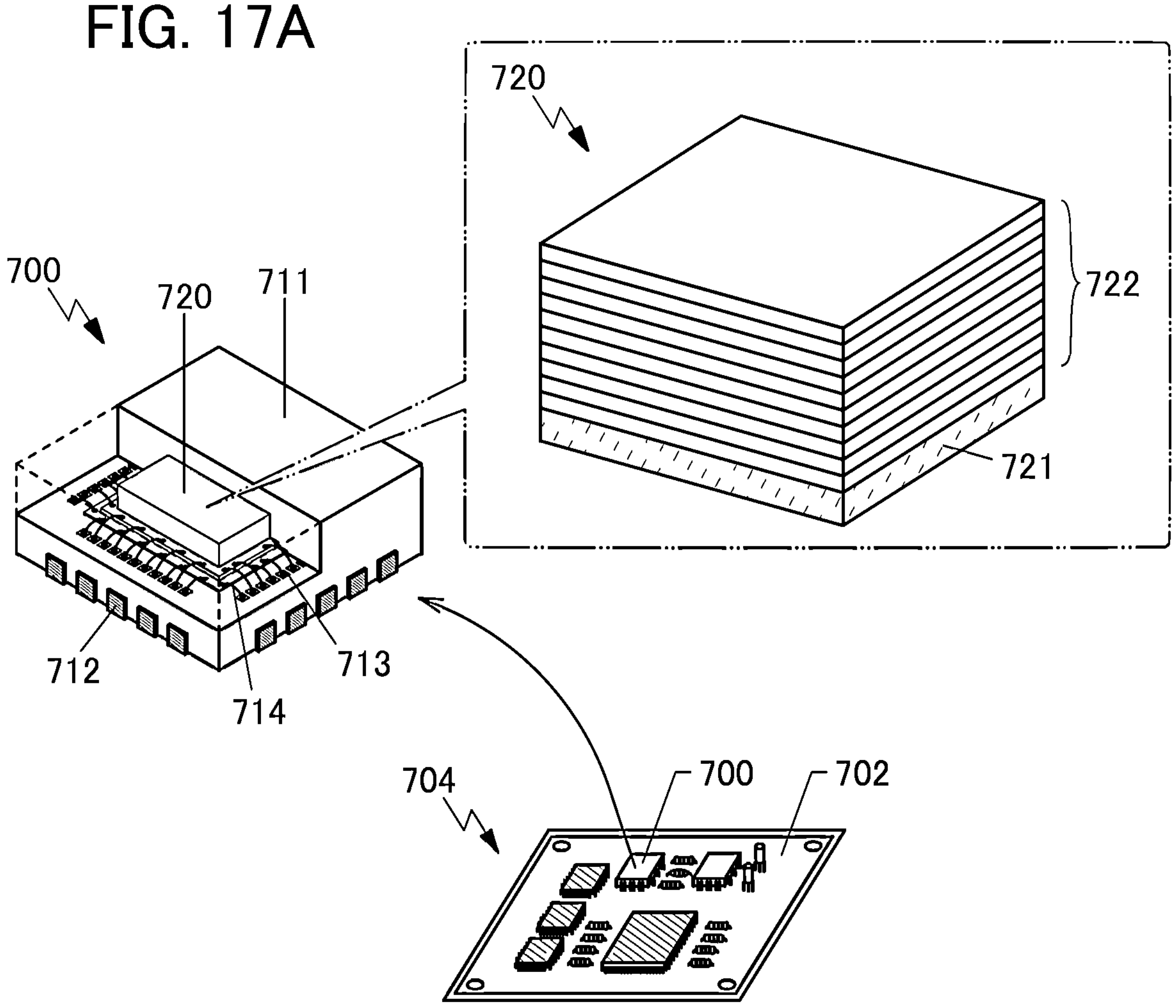
FIG. 17A and FIG. 17B are perspective views illustrating examples of electronic components.

FIG. 17A is a perspective view of an electronic component 700 and a substrate (circuit board 704) on which the electronic component 700 is mounted. The electronic component 700 illustrated in FIG. 17A includes the storage device 720 in a mold 711. FIG. 17A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a storage circuit layer 722. The storage device 300 of one embodiment of the present invention can be used as the storage device 720. Thus, the driver circuit layer 721 can be referred to as a layer including the driver circuit 21. In addition, a single layer or a plurality of layers of the memory array 20 can be used as the memory circuit layer 722. Thus, the driver circuit layer 721 can be referred to as a layer including the memory array 20.

Figure 17B:
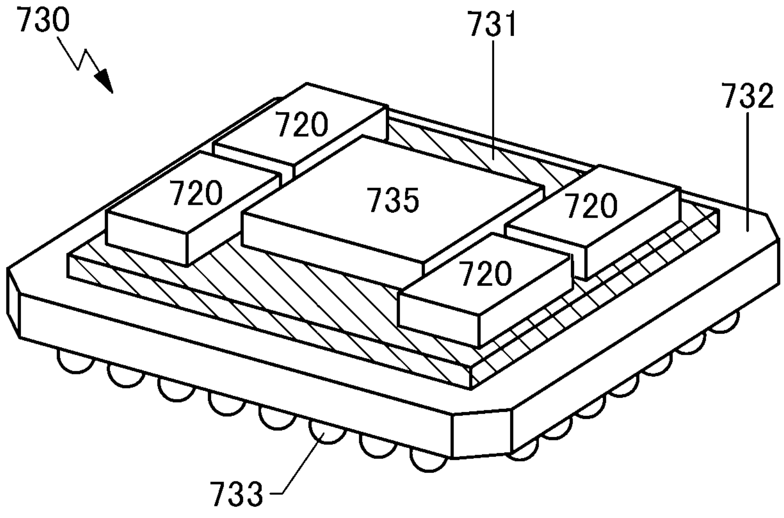

FIG. 17B is a perspective view of an electronic component 730. The electronic component 730 is an example of a SiP (System in package) or an MCM (Multi Chip Module). In the electronic component 730, an interposer 731 is provided over a package board 732 (printed circuit board) and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package board 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package board 732. Accordingly, the interposer is sometimes referred to as a "redistribution substrate" or an "intermediate substrate". A through electrode may be provided in the interposer 731 to be used for electrically connecting the integrated circuit and the package board 732. In the case of using a silicon interposer, a through-silicon via (TSV) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably the same. In the electronic component 730 of this embodiment, the heights of the storage device 720 and the semiconductor device 735 are preferably the same, for example.

An electrode 733 may be provided on the bottom portion of the package board 732 to mount the electronic component 730 on another substrate. FIG. 17B illustrates an example where the electrode 733 is formed of a solder ball. Solder balls are provided in a matrix on the bottom portion of the package board 732, whereby a BGA (Ball Grid Array) can be achieved. Alternatively, the electrode 733 may be formed of a conductive pin. When conductive pins are provided in a matrix on the bottom portion of the package board 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined as appropriate with any of the other embodiments and the like described in this specification.

Embodiment 6

In this embodiment, application examples of the semiconductor device of one embodiment of the present invention are described.

The semiconductor device of one embodiment of the present invention can be applied to, for example, storage devices of a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare-related devices, and the like. Note that here, the computers refer not only to tablet computers, laptop computers, and desktop computers, but also to large computers such as server systems.

An example of an electronic device including a semiconductor device of one embodiment of the present invention is described. Note that FIG. 18A to FIG. 18J and FIG. 19A to FIG. 19E each illustrate a state where the electronic component 700 or the electronic component 730, each of which includes the semiconductor device, is included in an electronic device.

[Cellular Phone]

Figure 18A:
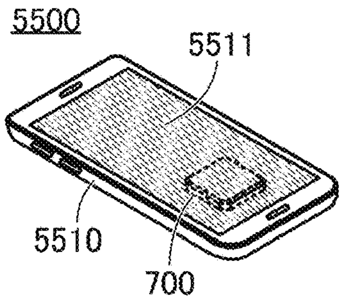
FIG. 18A to FIG. 18J are diagrams illustrating examples of electronic devices.

An information terminal 5500 illustrated in FIG. 18A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By applying the semiconductor device of one embodiment of the present invention to the information terminal 5500, the information terminal 5500 can retain a temporary file generated at the time of executing an application (e.g., a web browser's cache or the like).

[Wearable Terminal]

Figure 18B:
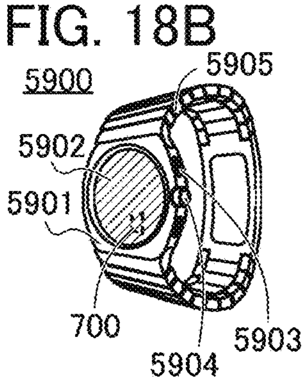

In addition, FIG. 18B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by applying the semiconductor device of one embodiment of the present invention to the wearable terminal.

[Information Terminal]

Figure 18C:
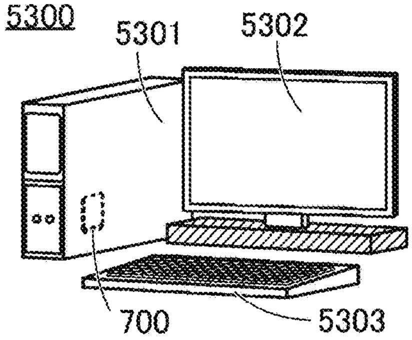

In addition, FIG. 18C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application applying the semiconductor device of one embodiment of the present invention to the desktop information terminal 5300.

Note that although the smartphone, the wearable terminal, and the desktop information terminal are respectively illustrated in FIG. 18A to FIG. 18C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 18D:
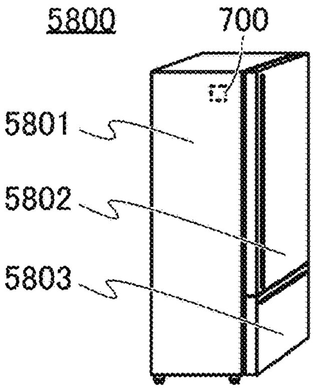

In addition, FIG. 18D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the semiconductor device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 18E:
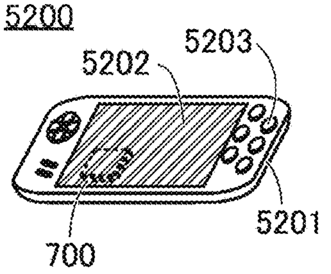

In addition, FIG. 18E illustrates a portable game machine 5200 as an example of a game machine. The portable game machine 5200 includes a housing 5201, a display portion 5202, a button 5203, and the like.

Figure 18F:
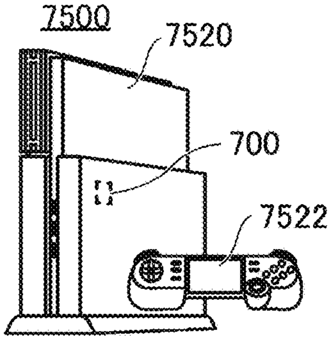

In addition, FIG. 18F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 18F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 18F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture or a voice instead of a controller.

In addition, videos displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the semiconductor device described in the above embodiment is employed for the portable game machine 5200 or the stationary game machine 7500, so that it is possible to retain a temporary file necessary for arithmetic operation that occurs during game play.

As an example of a game machine, FIG. 18E illustrates a portable game machine. In addition, FIG. 18F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be used for a motor vehicle, which is a moving vehicle, and around the driver's seat in a motor vehicle.

Figure 18G:
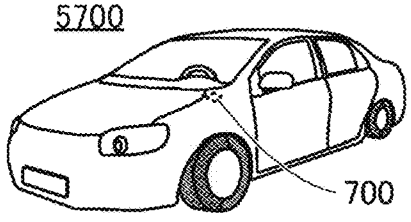

FIG. 18G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the motor vehicle 5700, which can increase safety. That is, display of an image from an imaging device provided on the outside of the motor vehicle 5700 can fill in blind areas and increase safety.

The semiconductor device described in the above embodiment can temporarily hold data; thus, the semiconductor device can be used to hold temporary data necessary in a system conducting automatic driving, navigation, and risk prediction for the motor vehicle 5700, for example. The display device may be configured to display temporary information regarding navigation, risk prediction, or the like. Moreover, the semiconductor device may be configured to hold a video of a driving recorder provided in the motor vehicle 5700.

Note that although a motor vehicle is described above as an example of a moving vehicle, the moving vehicle is not limited to a motor vehicle. Examples of moving vehicles include a train, a monorail train, a ship, a flying object (a helicopter, an unmanned aircraft (a drone), an airplane, and a rocket), and the like.

[Camera]

The semiconductor device described in the above embodiment can be employed for a camera.

Figure 18H:
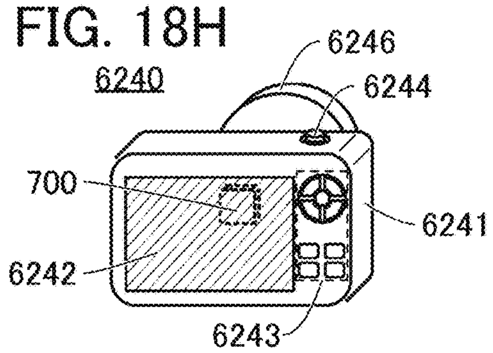

FIG. 18H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The semiconductor device described in the above embodiment can be employed for a video camera.

Figure 18I:
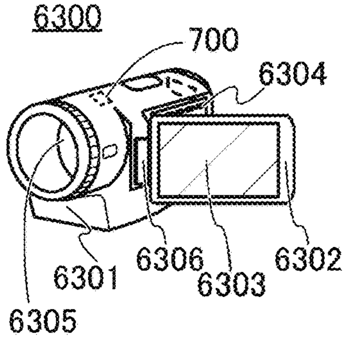

FIG. 18I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be employed for an implantable cardioverter-defibrillator (ICD).

Figure 18J:
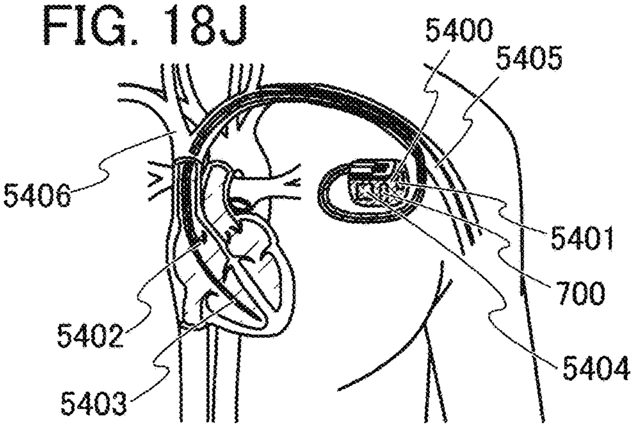

FIG. 18J is a schematic cross-sectional view showing an example of an ICD. An ICD main unit 5400 includes at least a battery 5401, the electronic component 700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 700.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The semiconductor device described in the above embodiment can be employed for a calculator such as a PC (Personal Computer) and an expansion device for an information terminal.

Figure 19A:
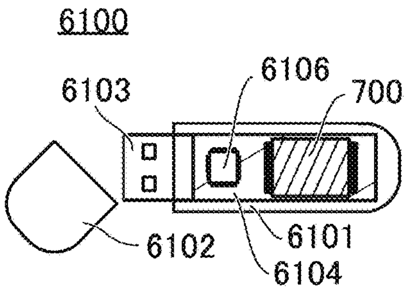
FIG. 19A to FIG. 19E are diagrams illustrating examples of electronic devices.

FIG. 19A illustrates, as an example of the expansion device, a portable expansion device 6100 that includes a chip capable of holding information and is externally provided on a PC. The expansion device 6100 can store information using the chip when connected to a PC with a USB (Universal Serial Bus) or the like, for example. Note that FIG. 19A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 700 and a controller chip 6106. The USB connector 6103 functions as an interface for connection to an external device.

[SD Card]

The semiconductor device described in the above embodiment can be employed for an SD card that can be attached to an electronic device such as an information terminal or a digital camera.

Figure 19B:
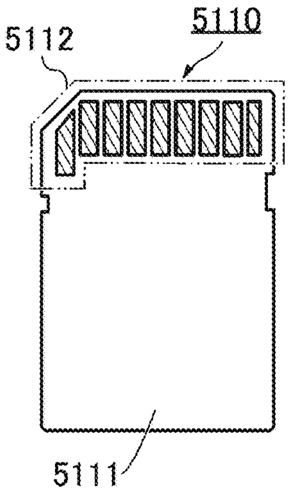
Figure 19C:
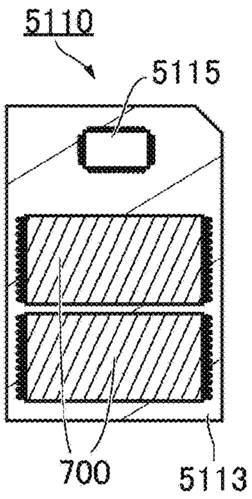

FIG. 19B is a schematic external view of an SD card, and FIG. 19C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a semiconductor device and a circuit for driving the semiconductor device. For example, electronic components 700 and a controller chip 5115 are attached to the substrate 5113. Note that the circuit structures of the electronic components 700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 700.

When the electronic components 700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 700.

[SSD]

The semiconductor device described in the above embodiment can be employed for an SSD (Solid State Drive) that can be attached to an electronic device such as an information terminal.

Figure 19D:
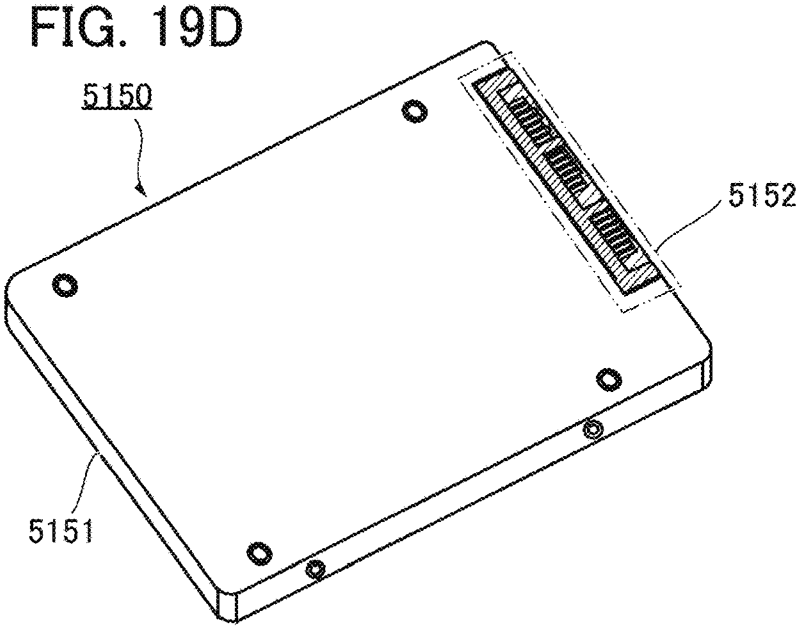
Figure 19E:
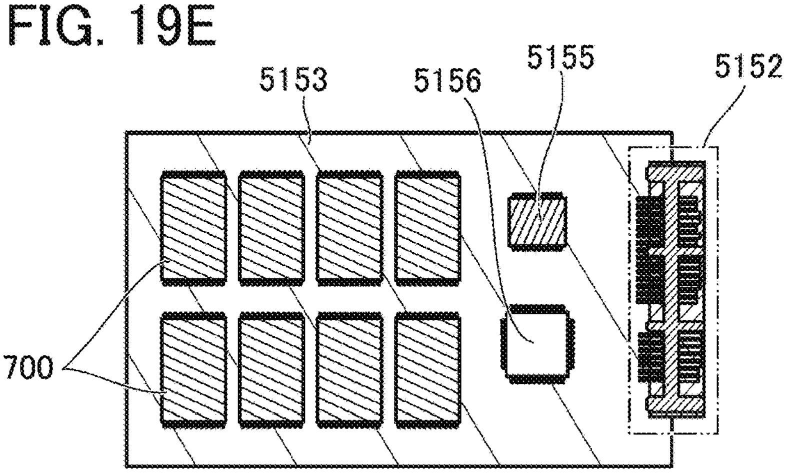

FIG. 19D is a schematic external view of an SSD, and FIG. 19E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a storage device and a circuit for driving the storage device. For example, the electronic components 700, a memory chip 5155, and a controller chip 5156 are attached to the substrate 5153. When the electronic components 700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 700, the memory chip 5155, and the controller chip 5115 are not limited to those described above, and the circuit structures can be changed as appropriate according to circumstances. For example, a memory functioning as a work memory may also be provided in the controller chip 5156.

[Computer]

Figure 20A:
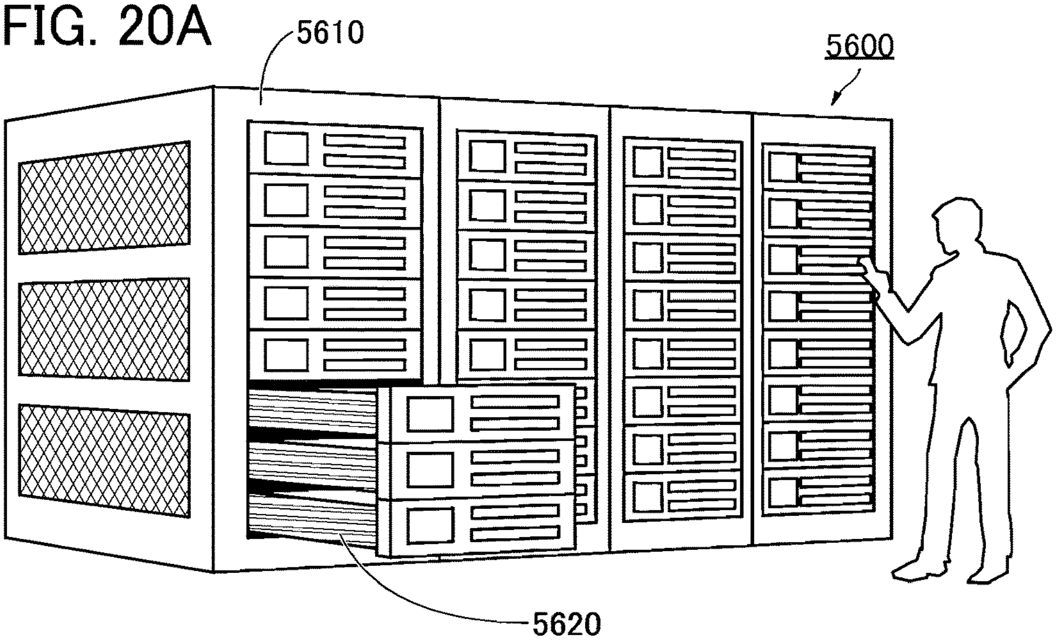
FIG. 20A to FIG. 20C are diagrams illustrating examples of electronic devices.

A computer 5600 illustrated in FIG. 20A is an example of a large computer. In the computer 5600, a plurality of rack mount computers 5620 are stored in a rack 5610.

Figure 20B:
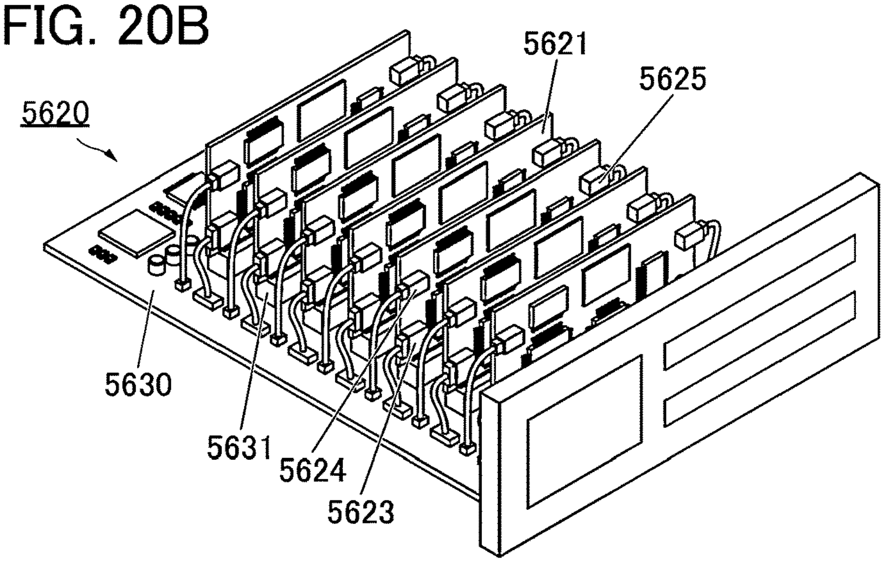

The computer 5620 can have a structure in a perspective view illustrated in FIG. 20B, for example. In FIG. 20B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 20C:
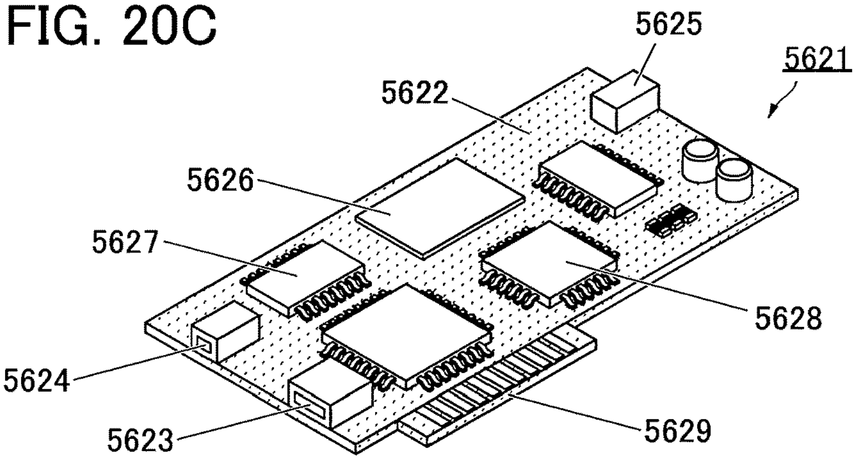

The PC card 5621 illustrated in FIG. 20C is an example of a processing board provided with a CPU, a GPU, a storage device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 20C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a storage device or the like. As the semiconductor device 5628, the electronic component 700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices or the like described above, so that a reduction in size and a reduction in power consumption of the electronic device can be achieved. In addition, since the semiconductor device of one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device of one embodiment of the present invention can achieve an electronic device that operates stably even in a high temperature environment. Thus, the reliability of the electronic devices can be increased.

This embodiment can be combined as appropriate with any of the other embodiments and the like described in this specification.

REFERENCE NUMERALS

10: semiconductor device, 20: memory array, 21: driver circuit, 22: PSW, 23: PSW, 31: peripheral circuit, 32: control circuit, 33: voltage generation circuit, 41: peripheral circuit, 42: row decoder, 43: row driver, 44: column decoder, 45: column driver, 46: sense amplifier, 47: input circuit, 48: output circuit, 51: curve, 52: curve, 100: transistor, 110: capacitor

The invention claimed is:

1. A semiconductor device comprising:

a first electrode;

a first insulator;

a second insulator;

a transistor comprising a gate, a back gate, and a semiconductor; and a capacitor comprising a pair of electrodes, wherein the back gate comprises a region overlapping with the semiconductor with the first insulator and the second insulator therebetween, wherein one of a source and a drain of the transistor is electrically connected to the first electrode, wherein the other of the source and the drain of the transistor is electrically connected to one of the pair of electrodes, wherein the pair of electrodes are each in contact with the first insulator and comprise a region where the pair of electrodes overlap with each other with the first insulator therebetween, and wherein the first insulator is a ferroelectric.

2. The semiconductor device according to claim 1, wherein the other of the pair of electrodes and the back gate are provided over the same insulator.

3. The semiconductor device according to claim 1, wherein the first insulator comprises hafnium, zirconium, and oxygen.

4. The semiconductor device according to claim 1, wherein the first insulator comprises aluminum, scandium, and nitrogen.

5. The semiconductor device according to claim 1, wherein the second insulator comprises silicon and oxygen.

6. The semiconductor device according to claim 1, wherein each of the pair of electrodes comprises titanium and nitrogen.

7. The semiconductor device according to claim 1, wherein the semiconductor is an oxide semiconductor.

8. The semiconductor device according to claim 1, wherein the semiconductor comprises oxygen and at least one of indium and zinc.

9. A semiconductor device comprising:

a plurality of layers stacked; and a first electrode penetrating the plurality of layers, wherein each of the plurality of layers comprises a first insulator, a second insulator, a transistor comprising a gate, a back gate, and a semiconductor, and a capacitor comprising a pair of electrodes, wherein the back gate comprises a region overlapping with the semiconductor with the first insulator and the second insulator therebetween, wherein one of a source and a drain of the transistor is electrically connected to the first electrode, wherein the other of the source and the drain of the transistor is electrically connected to one of the pair of electrodes, wherein the pair of electrodes are each in contact with the first insulator and comprise a region where the pair of electrodes overlap with each other with the first insulator therebetween, and wherein the first insulator is a ferroelectric.

10. The semiconductor device according to claim 9, wherein the other of the pair of electrodes and the back gate are provided over the same insulator.

11. The semiconductor device according to claim 9, wherein the first insulator comprises hafnium, zirconium, and oxygen.

12. The semiconductor device according to claim 9, wherein the first insulator comprises aluminum, scandium, and nitrogen.

13. The semiconductor device according to claim 9, wherein the second insulator comprises silicon and oxygen.

14. The semiconductor device according to claim 9, wherein each of the pair of electrodes comprises titanium and nitrogen.

15. The semiconductor device according to claim 9, wherein the semiconductor is an oxide semiconductor.

16. The semiconductor device according to claim 9, wherein the semiconductor comprises oxygen and at least one of indium and zinc.

* * * * *